(12) United States Patent
Fukazawa et al.

(10) Patent No.: US 11,309,909 B2
(45) Date of Patent: Apr. 19, 2022

(54) COMPRESSION DEVICE, DECOMPRESSION DEVICE, AND METHOD

(71) Applicant: Kioxia Corporation, Tokyo (JP)

(72) Inventors: Youhei Fukazawa, Kawasaki (JP); Keiri Nakanishi, Kawasaki (JP); Sho Kodama, Kawasaki (JP); Masato Sumiyoshi, Yokohama (JP); Kohei Oikawa, Kawasaki (JP); Daisuke Yashima, Tachikawa (JP); Takashi Miura, Yokohama (JP); Zheye Wang, Kawasaki (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/010,013

(22) Filed: Sep. 2, 2020

(65) Prior Publication Data

US 2021/0288662 A1    Sep. 16, 2021

(30) Foreign Application Priority Data

Mar. 13, 2020  (JP) .............................. JP2020-043918

(51) Int. Cl.
*H03M 7/00* (2006.01)
*H03M 7/40* (2006.01)
*G06F 40/126* (2020.01)
*H03M 7/30* (2006.01)

(52) U.S. Cl.
CPC ............ *H03M 7/40* (2013.01); *G06F 40/126* (2020.01); *H03M 7/6005* (2013.01); *H03M 7/6011* (2013.01)

(58) Field of Classification Search
CPC .... H03M 7/40; H03M 7/6005; H03M 7/6011; H03M 7/00; G06F 40/126

USPC ...................................................... 341/50, 51
See application file for complete search history.

(56) References Cited

U.S. PATENT DOCUMENTS

| | | | |
|---|---|---|---|
| 6,906,645 B2 | 6/2005 | Jones et al. | |
| 9,054,729 B2 | 6/2015 | Carlson | |
| 9,160,362 B1 | 10/2015 | Ansari et al. | |
| 9,590,655 B2 | 3/2017 | Kim et al. | |
| 9,973,205 B1 * | 5/2018 | Weber | H03M 7/3086 |
| 10,230,393 B2 | 3/2019 | Wu et al. | |

(Continued)

OTHER PUBLICATIONS

Deutsch, L. Peter. "DEFLATE Compressed Data Format Specification version 1.3," Network Working Group—Request for Comments: 1951, Aladdin Enterprises, Category: Informational, May 1996, 23 pages.

*Primary Examiner* — Jean B Jeanglaude
(74) *Attorney, Agent, or Firm* — Oblon, McClelland, Maier & Neustadt, L.L.P.

(57) ABSTRACT

A compression device includes a dictionary based encoder, a second buffer, a comparator, and a compression data generator. The dictionary based encoder searches for second data at least partially matching first data from a first buffer, and acquires a first match position indicating a position of the second data in the first buffer and a match length indicating a matched length of the first and second data. The second buffer stores the previously acquired second match position with an index. The compression data generator generates first compressed data that includes the index assigned to the second match position in the second buffer and the match length when the first match position matches the second match position in the second buffer.

36 Claims, 40 Drawing Sheets

(56) References Cited

U.S. PATENT DOCUMENTS

| | | | | |
|---|---|---|---|---|
| 10,491,240 B1* | 11/2019 | Dupont | ............... | H03M 7/3046 |
| 2010/0079311 A1* | 4/2010 | Sluiter | ................ | H03M 7/3086 |
| | | | | 341/51 |
| 2011/0154169 A1* | 6/2011 | Gopal | ..................... | H03M 7/40 |
| | | | | 714/807 |
| 2017/0017619 A1* | 1/2017 | Kataoka | ................ | G06F 40/123 |
| 2017/0070238 A1* | 3/2017 | Liang | ...................... | H03M 7/30 |
| 2017/0192709 A1* | 7/2017 | Abali | ................... | H03M 7/6011 |
| 2019/0268017 A1 | 8/2019 | Gopal | | |

* cited by examiner

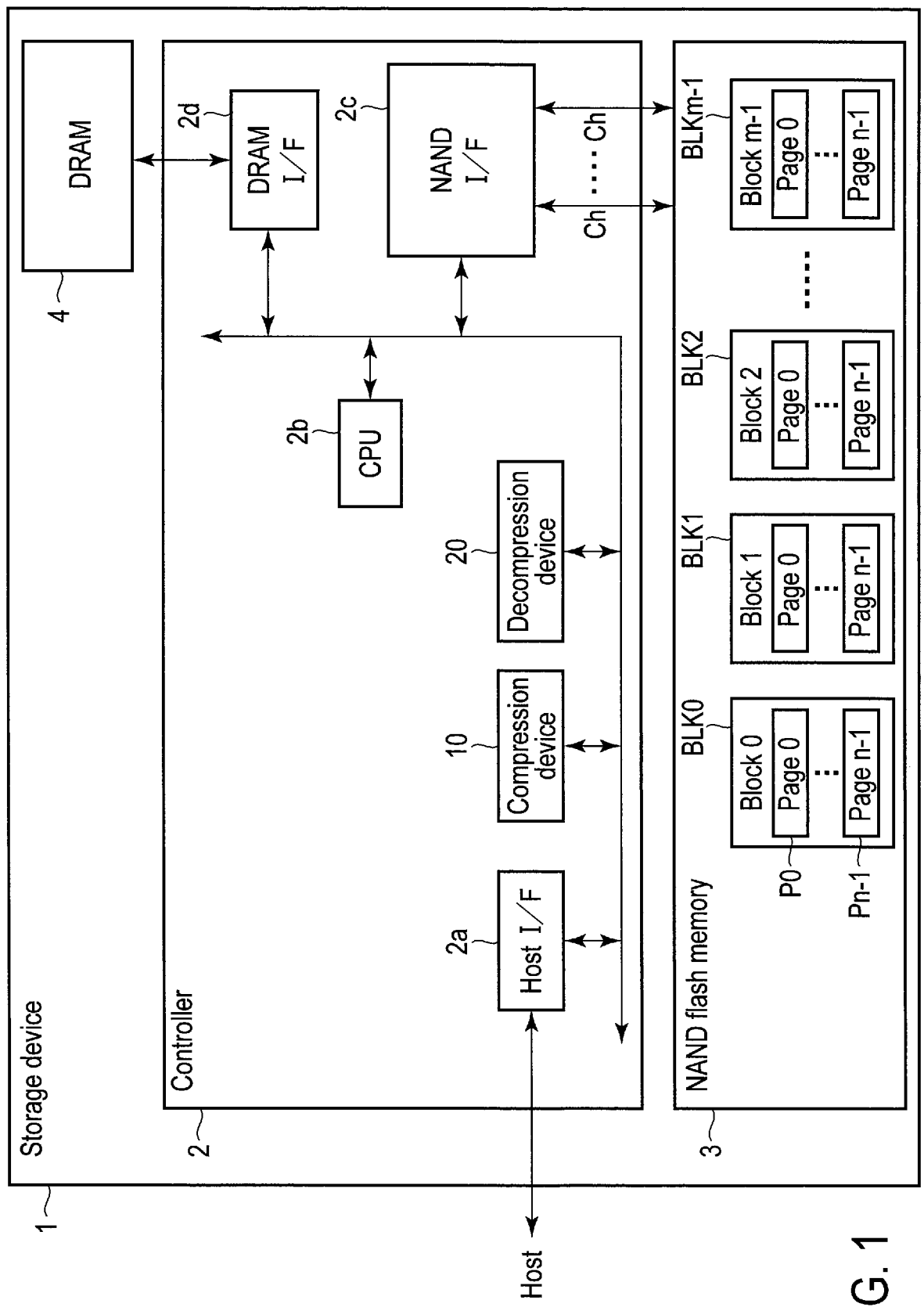
F I G. 1

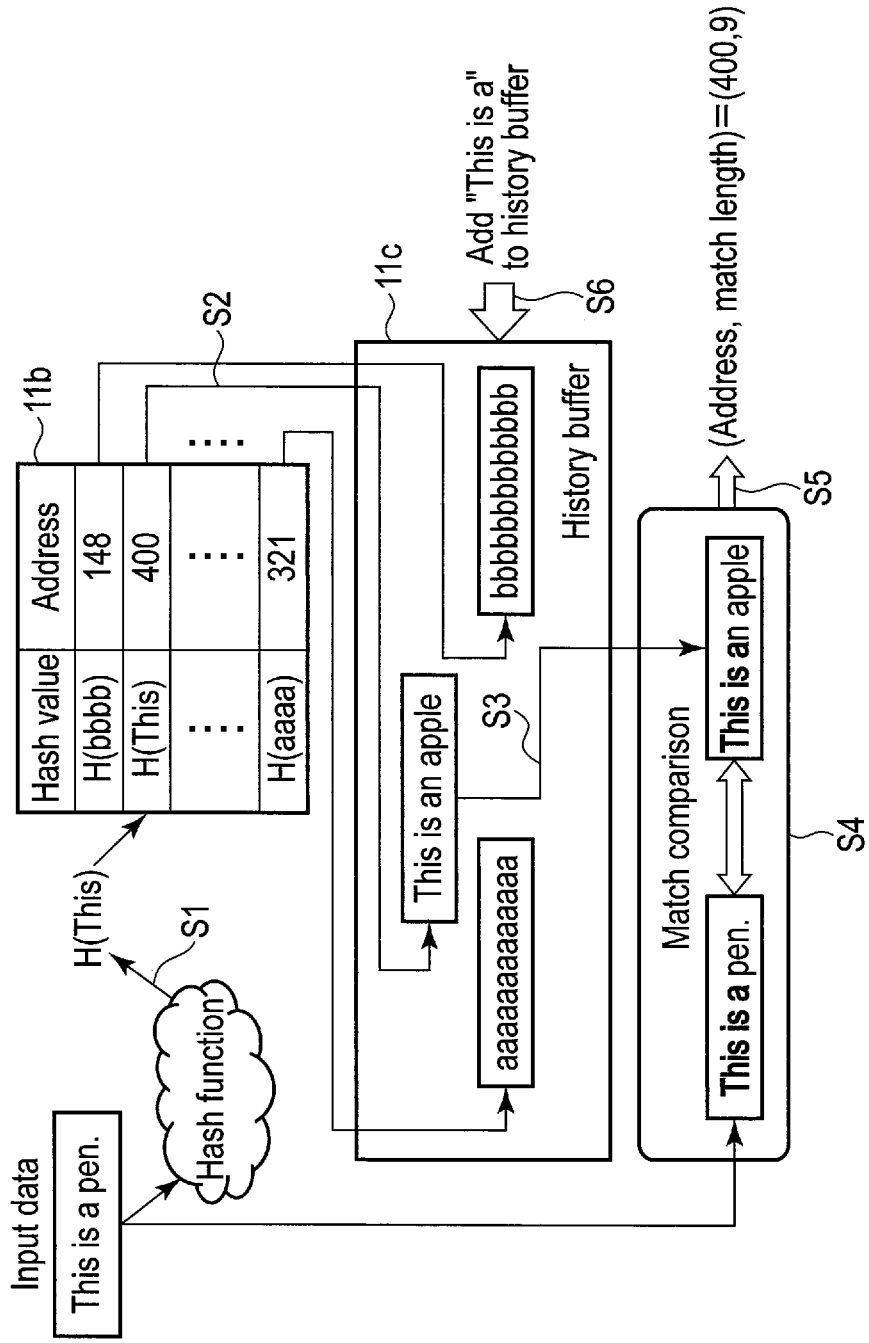
F I G. 4

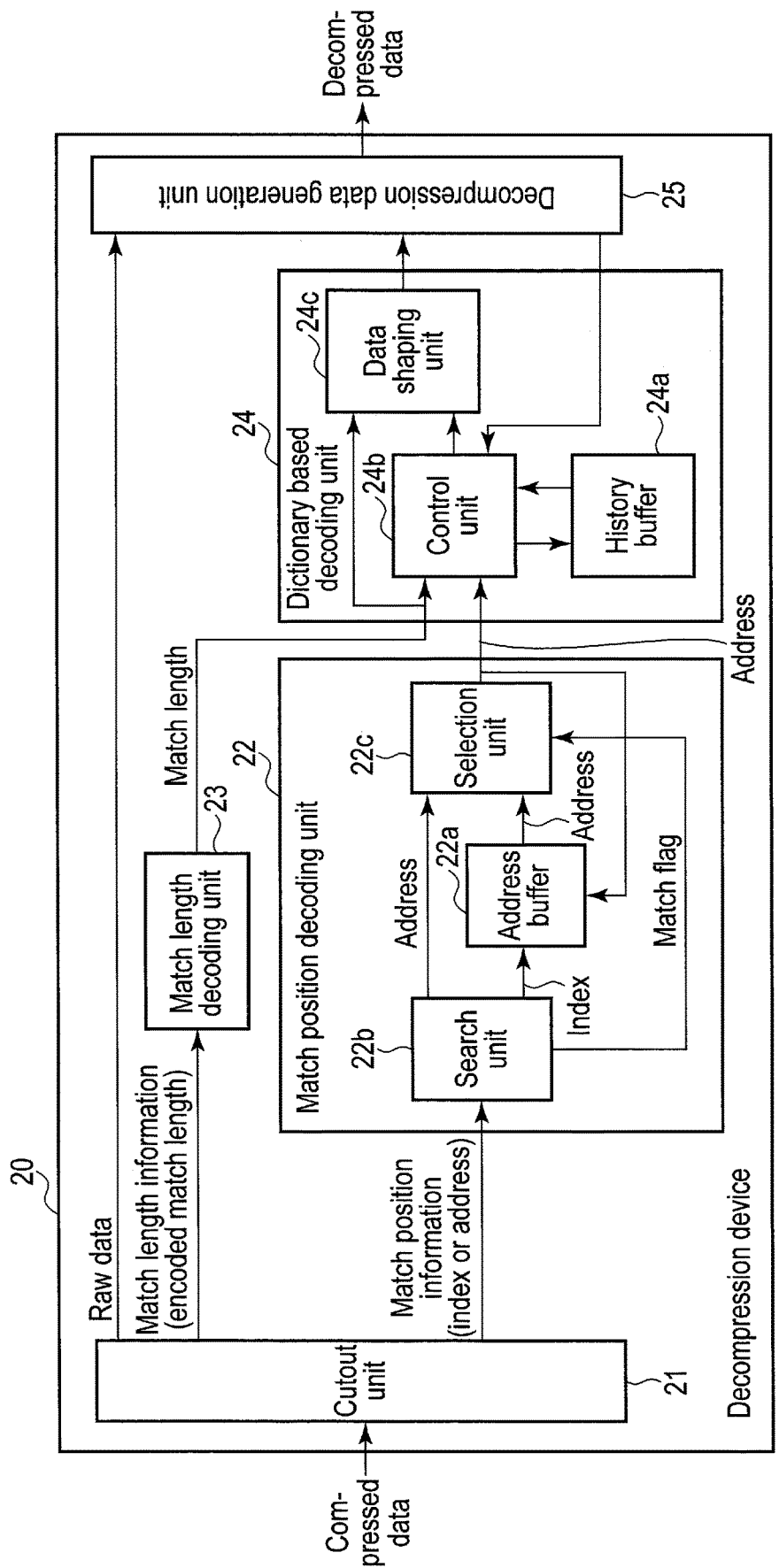
F I G. 7

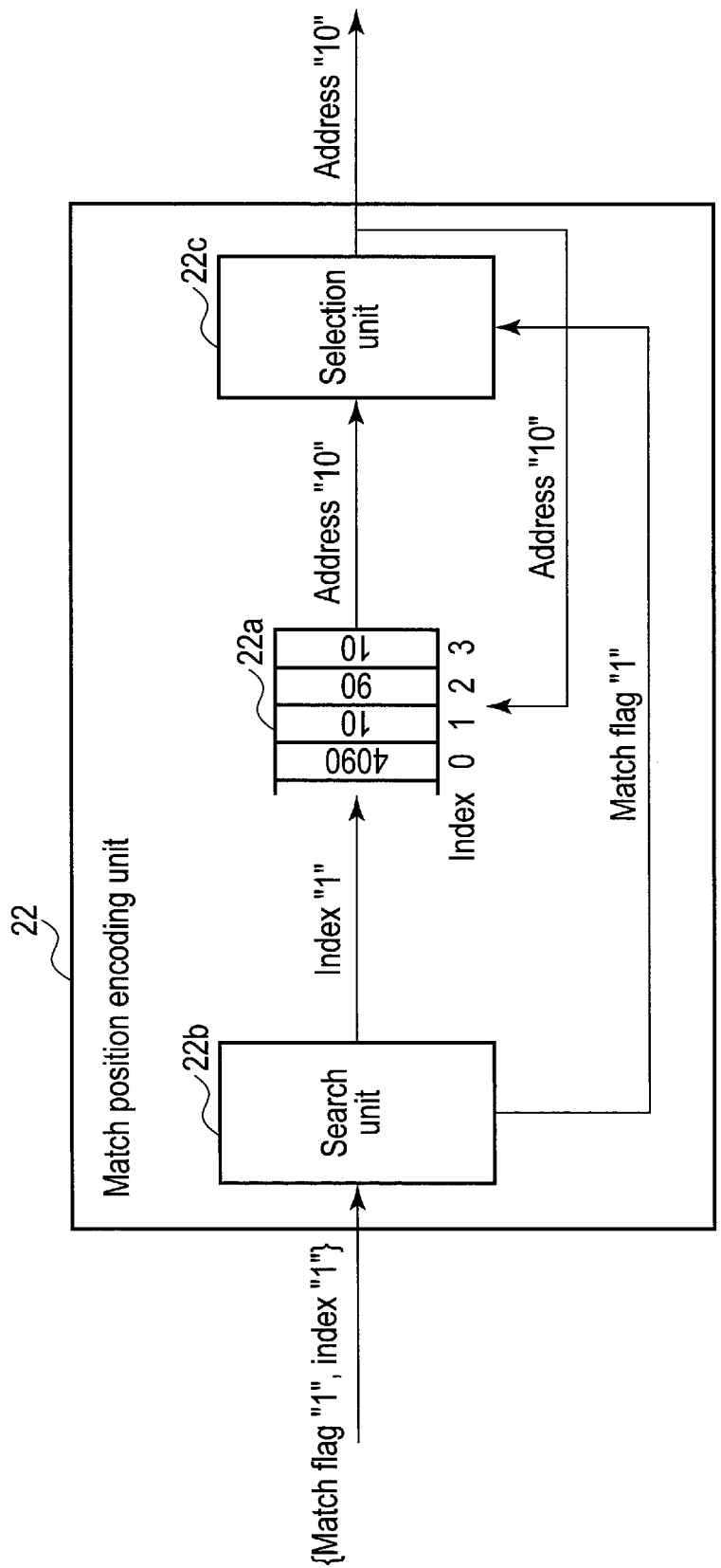
F I G. 8

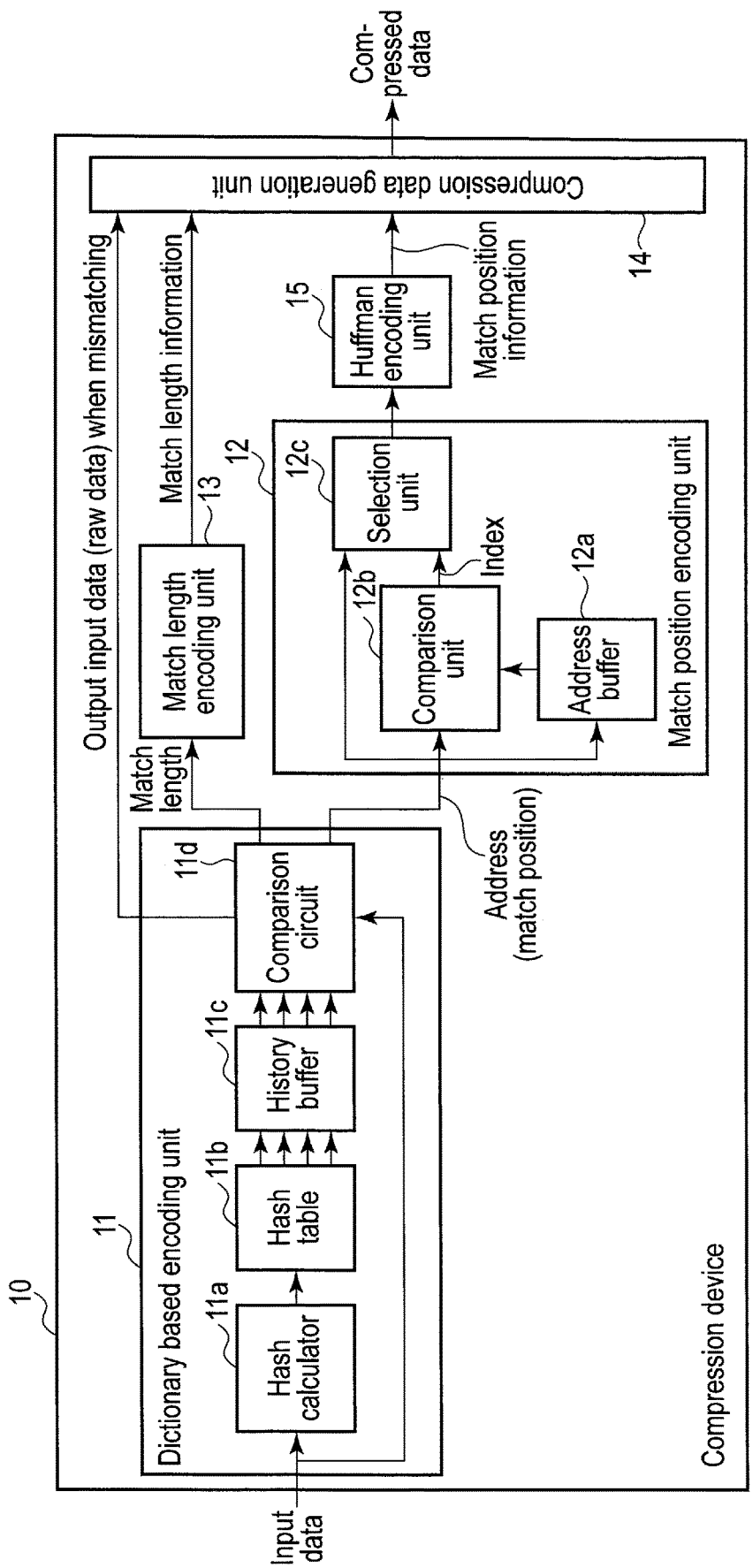
F I G. 10

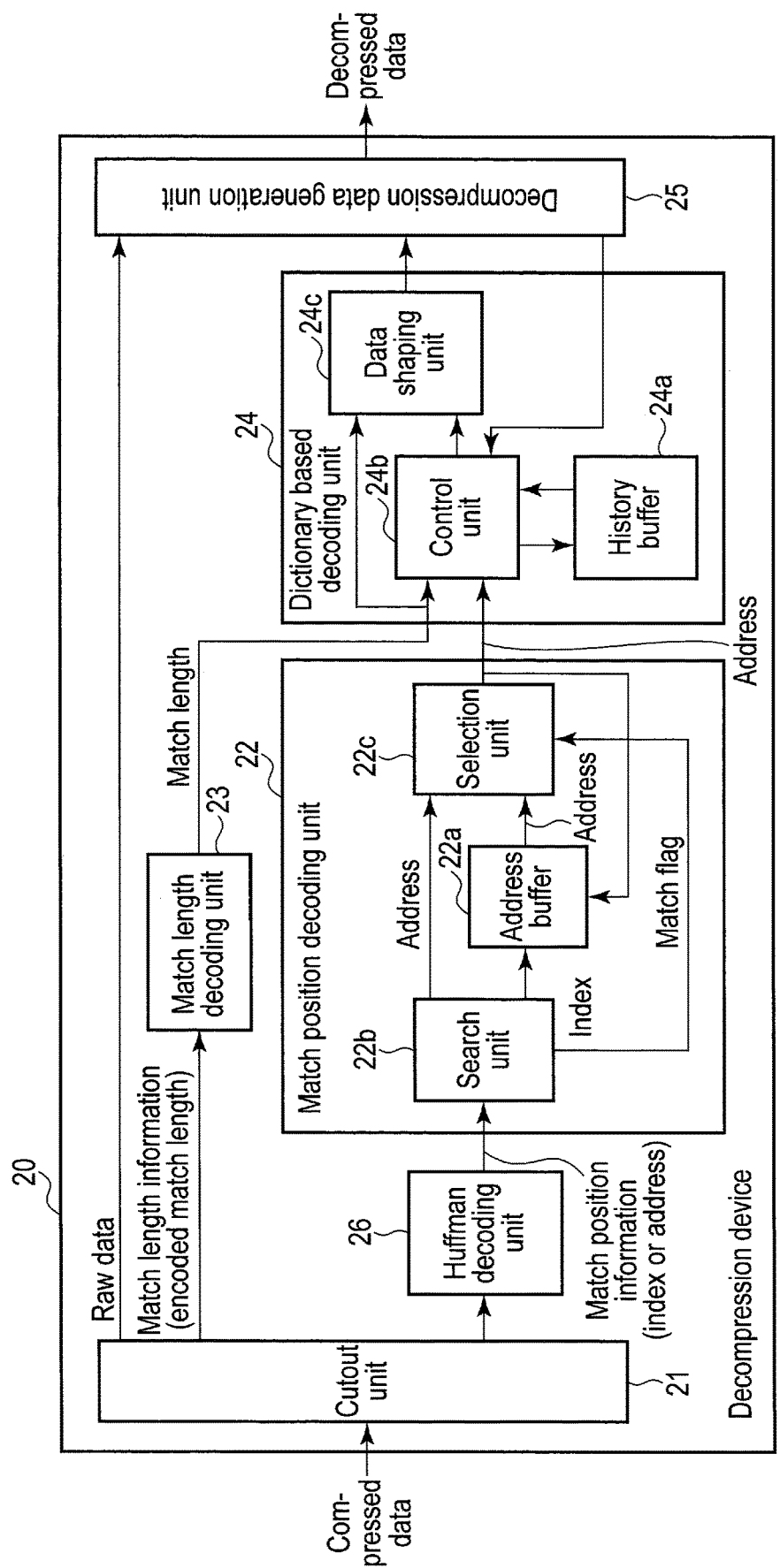
F I G. 13

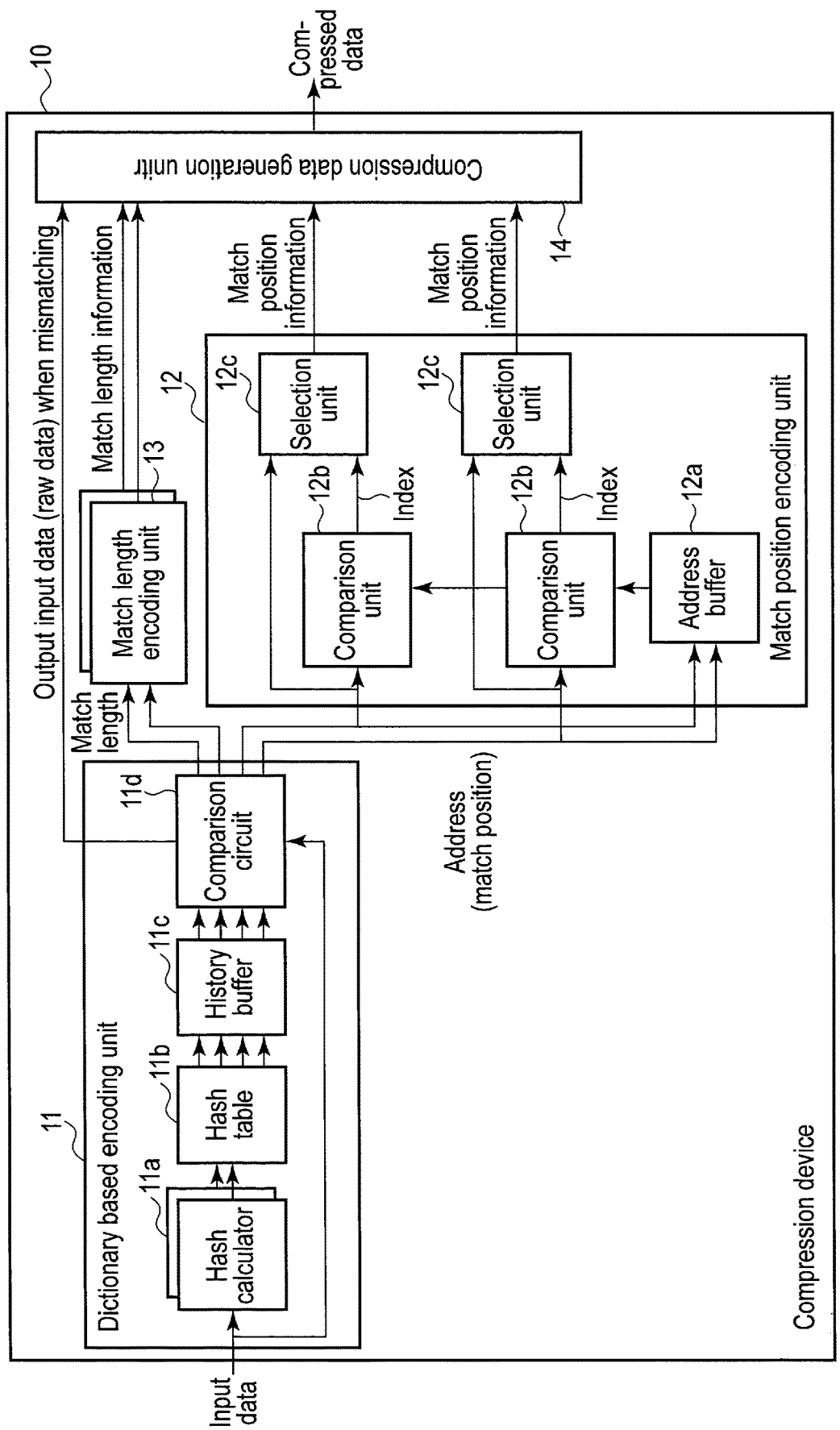
F I G. 15

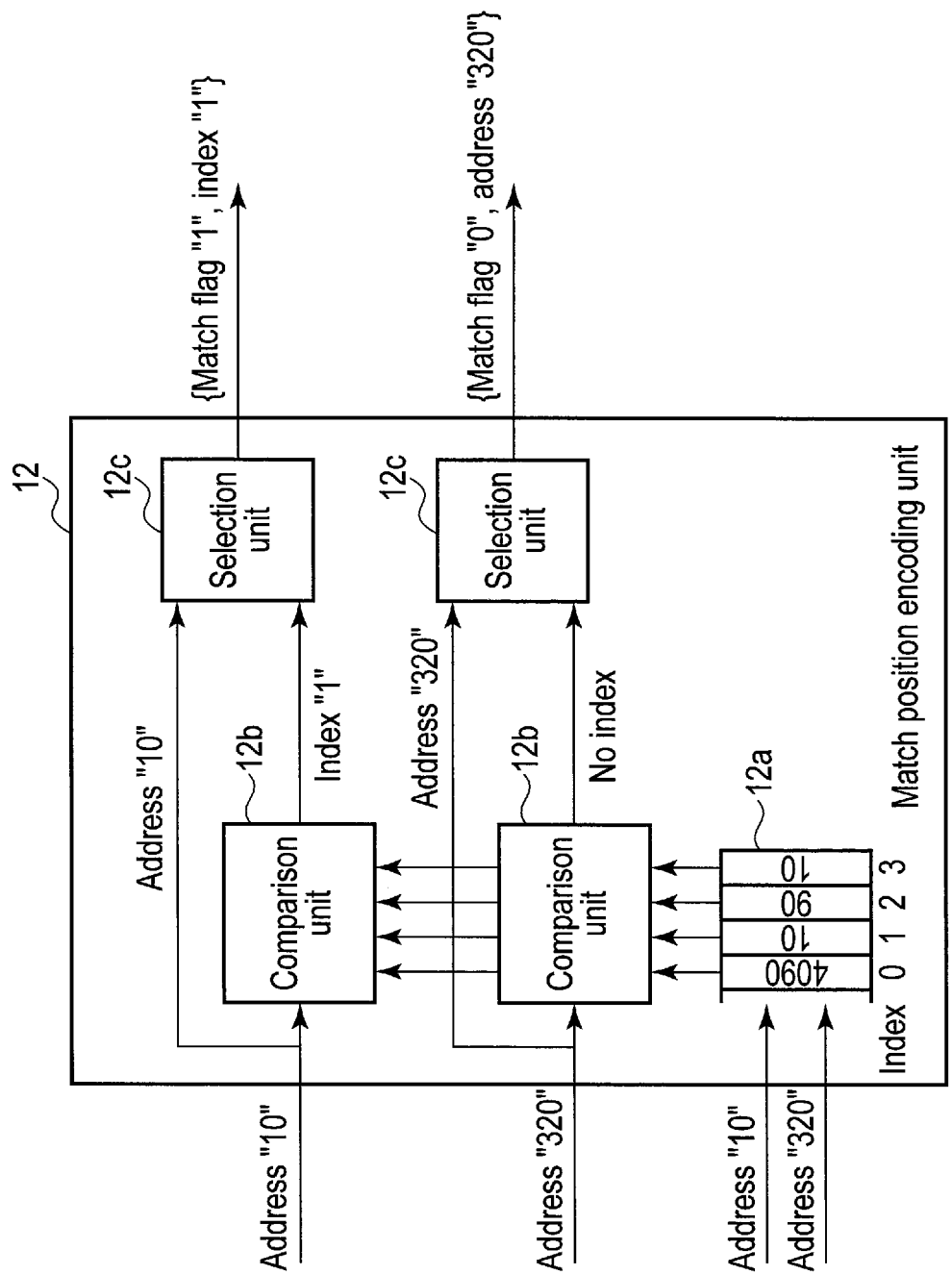
F I G. 16

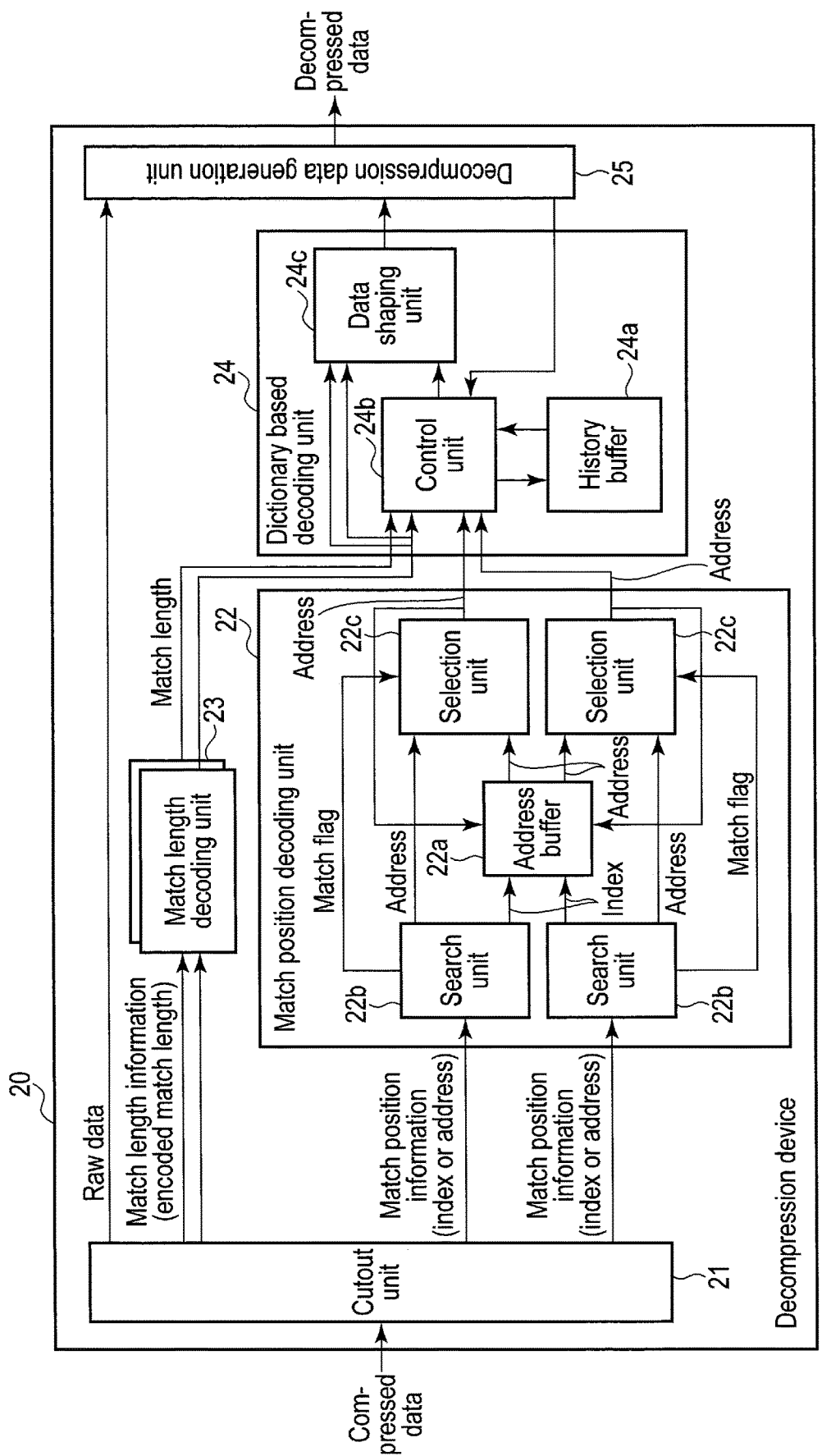
F I G. 17

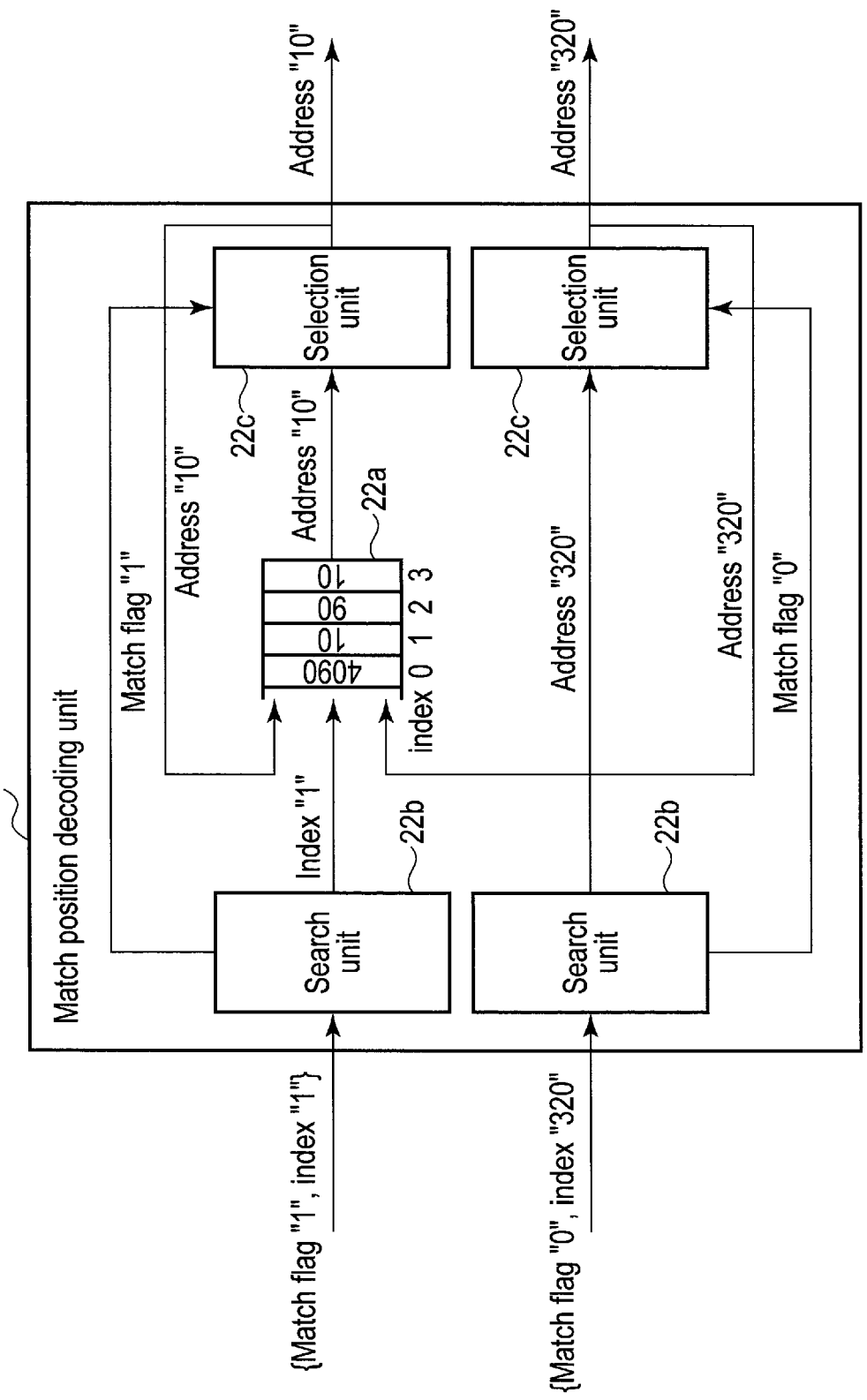
F I G. 18

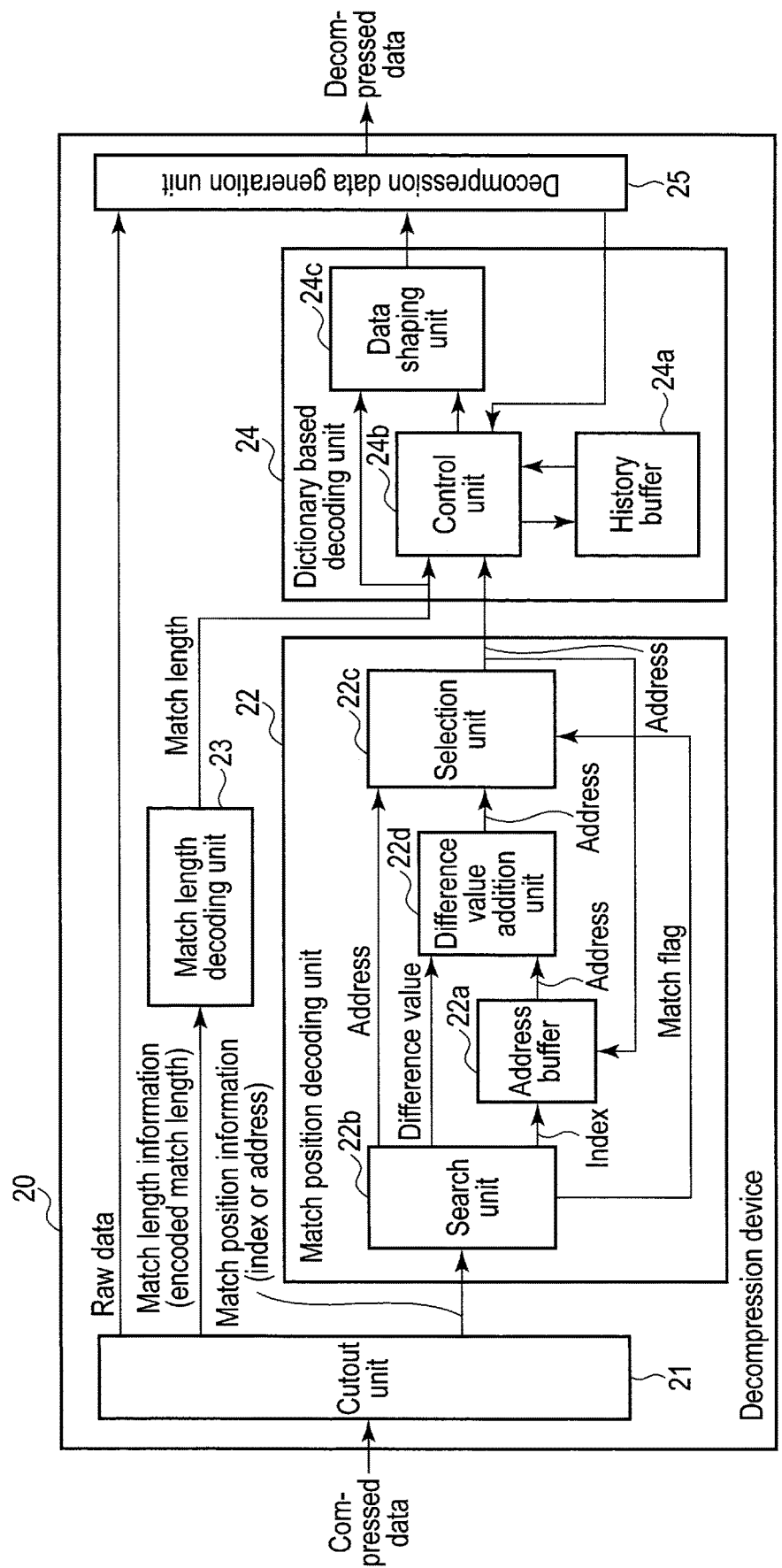
F I G. 22

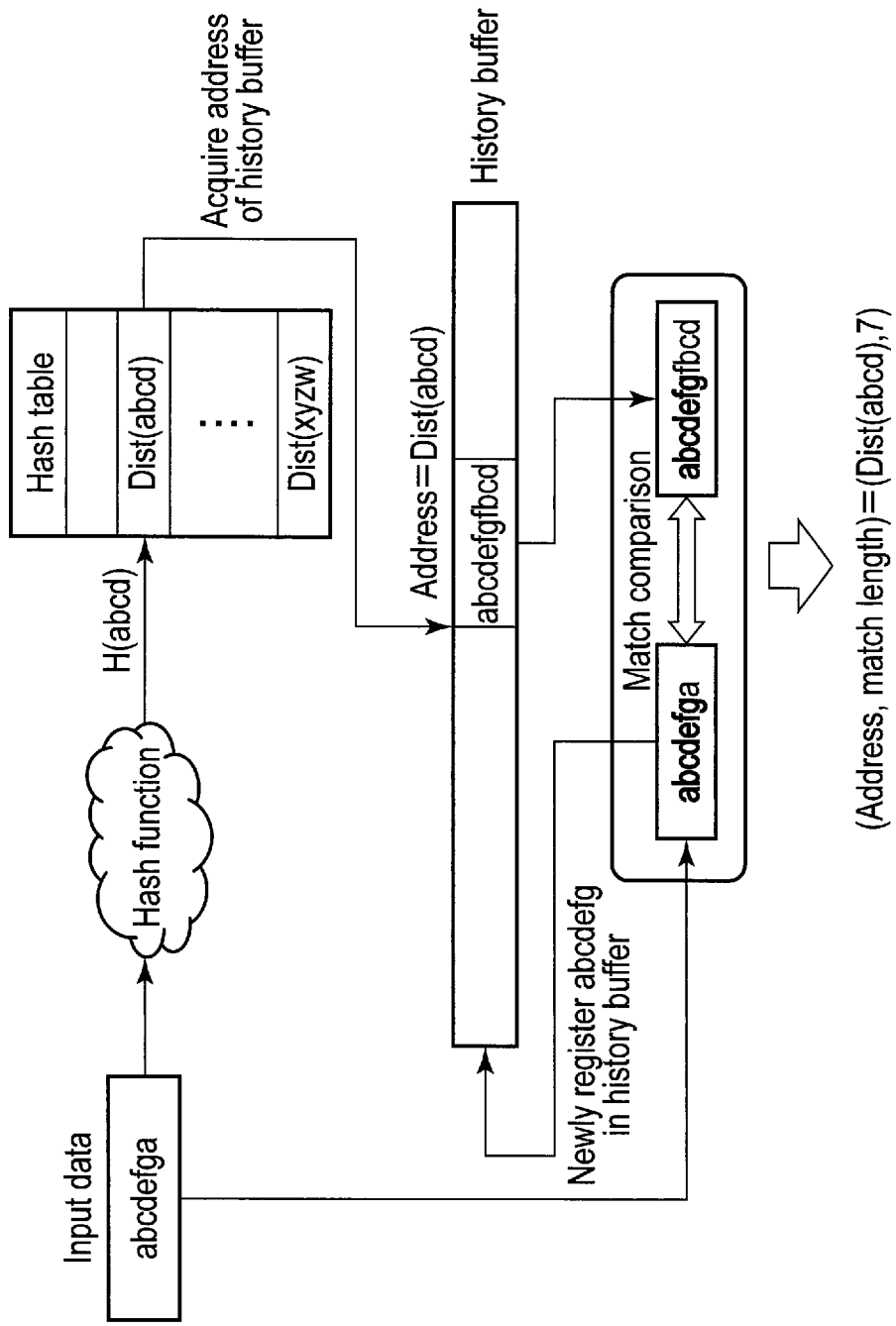
F I G. 25

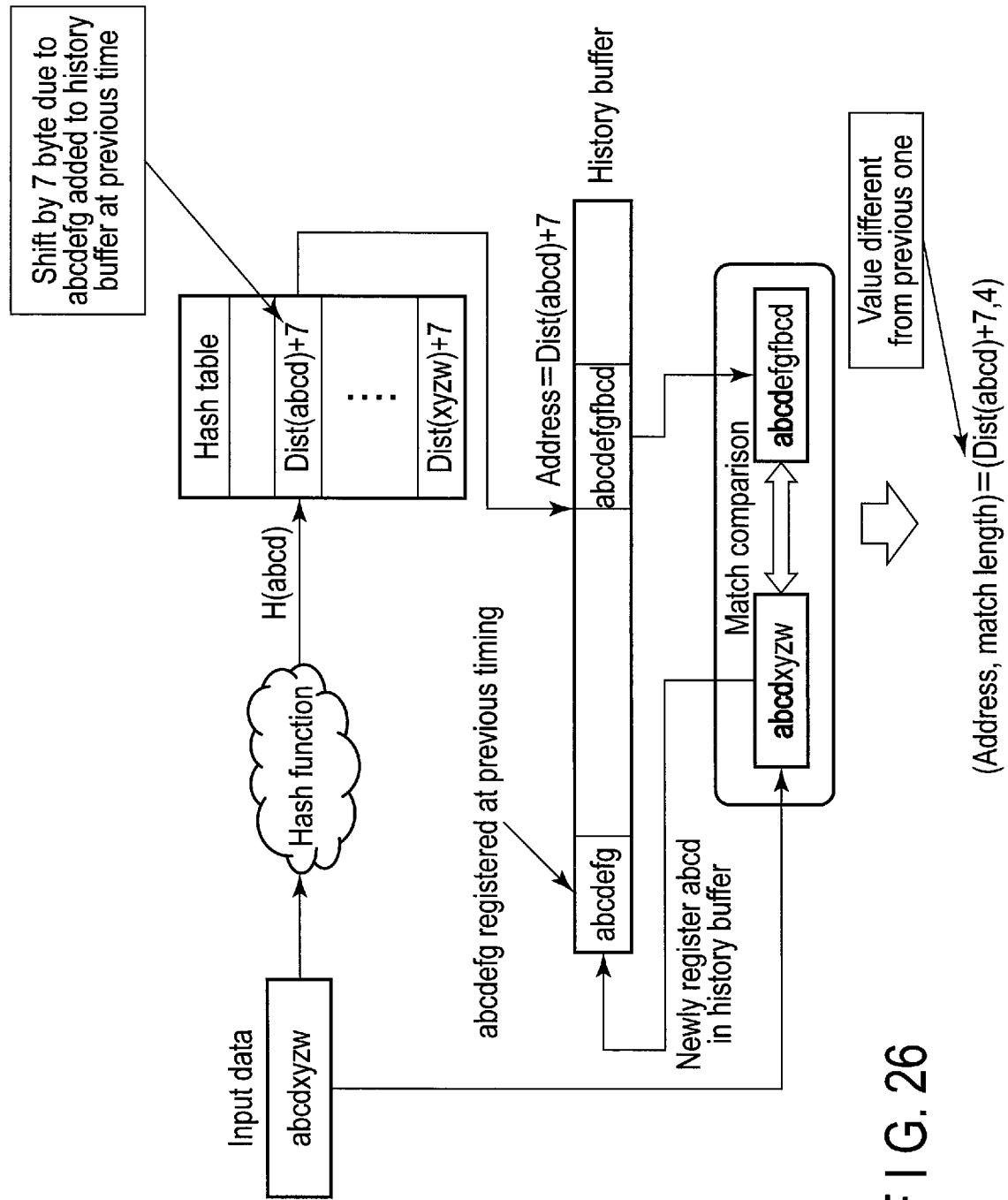
F I G. 26

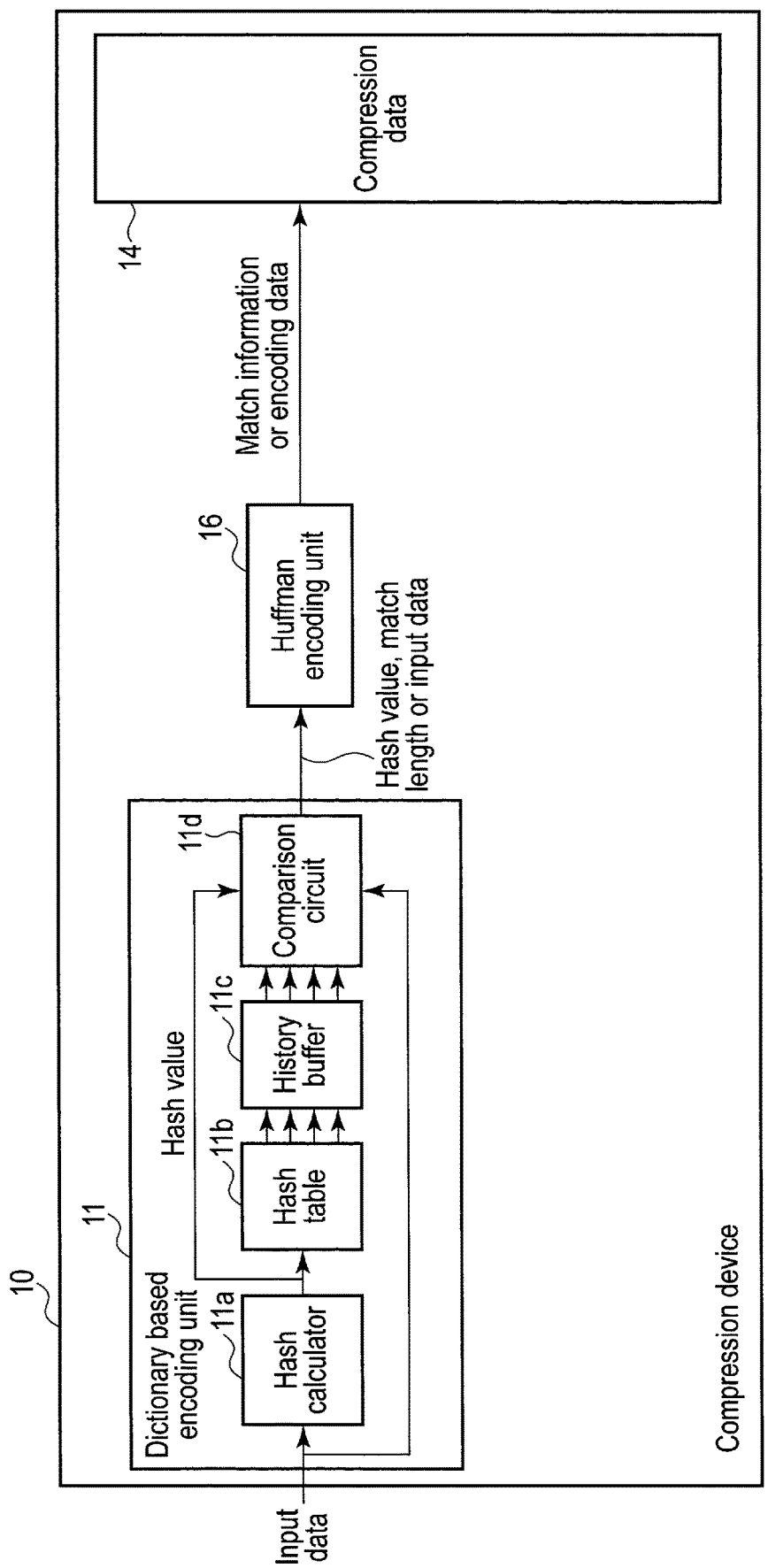
F I G. 27

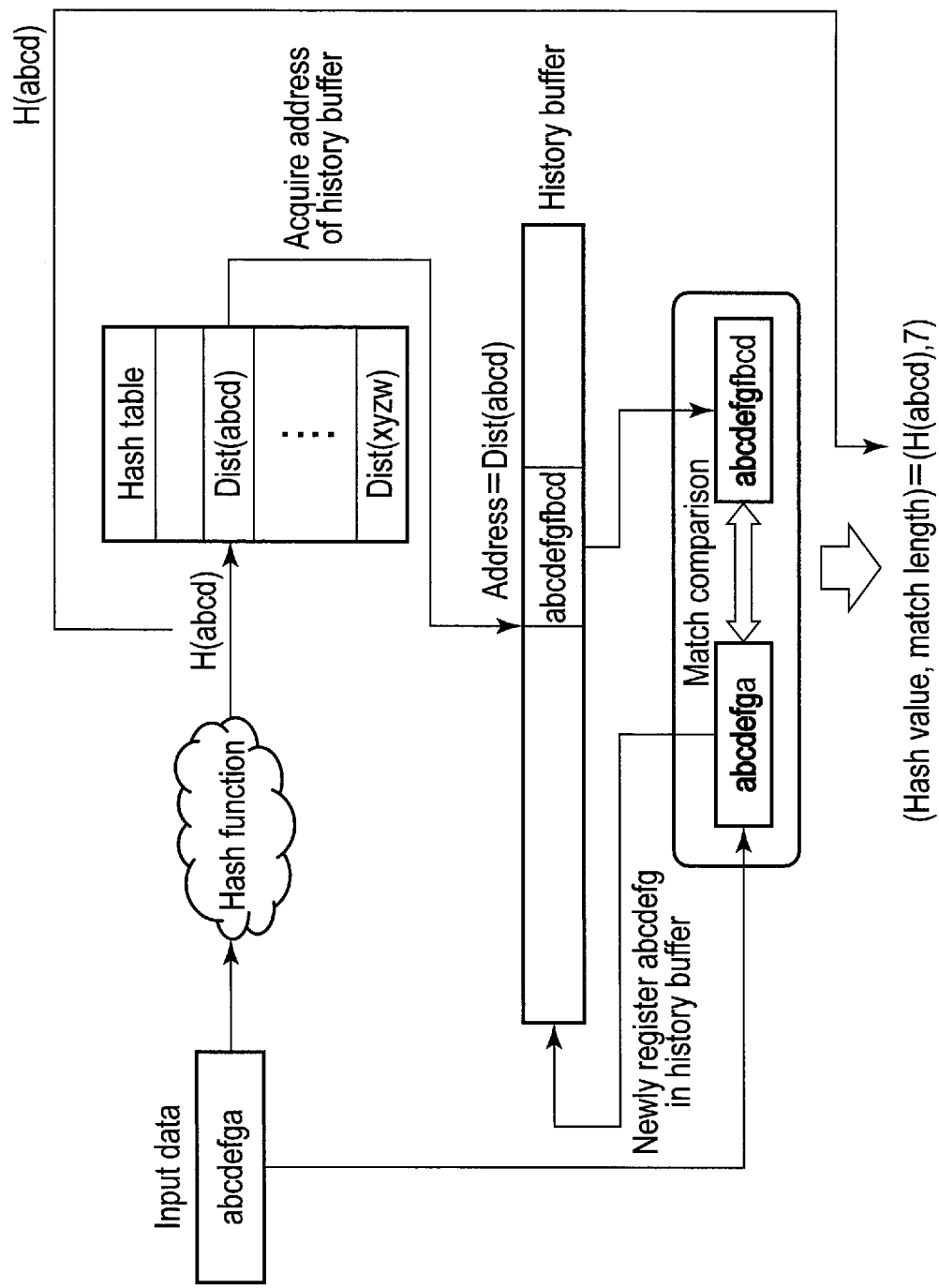
F I G. 28

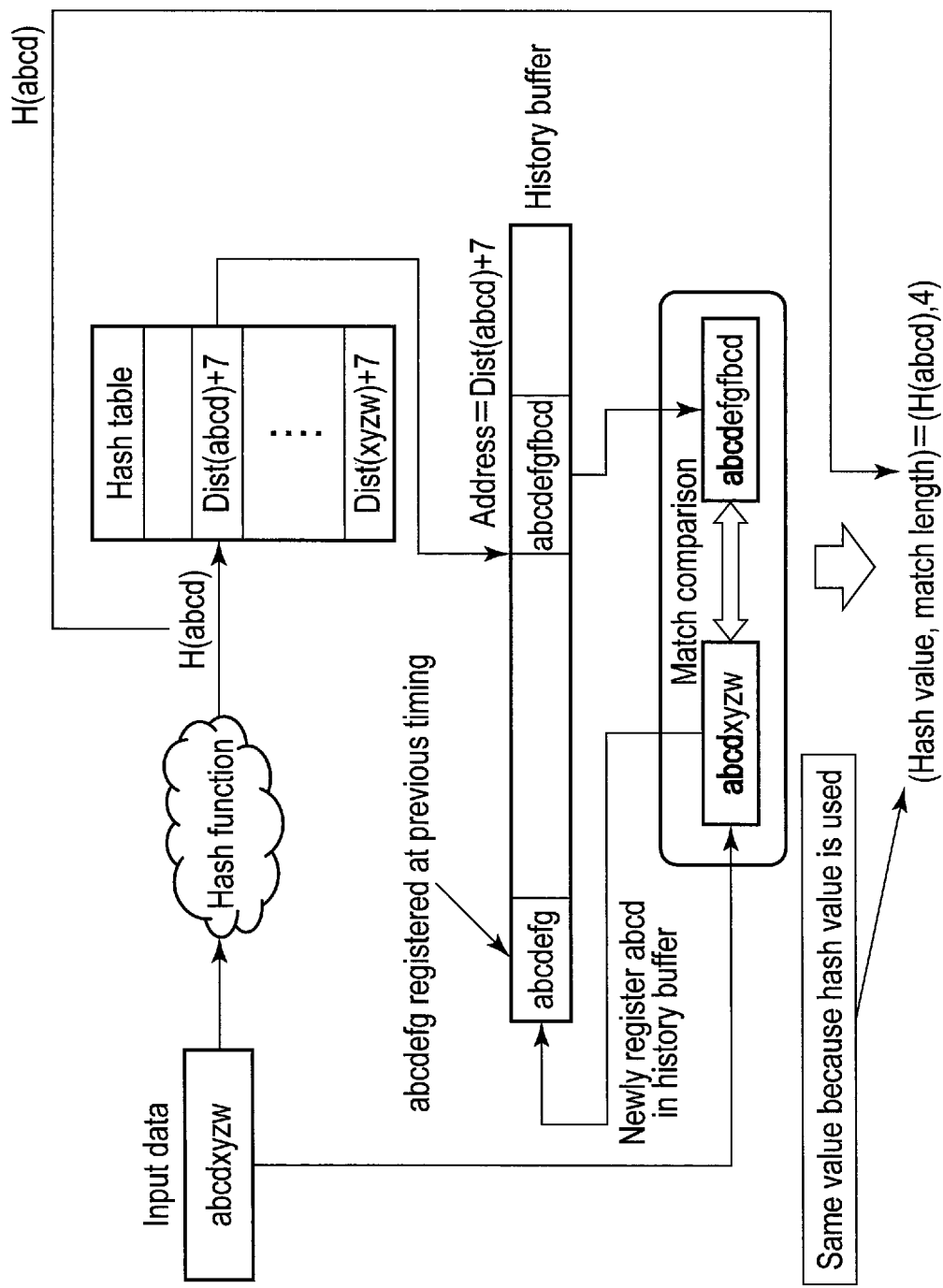
F I G. 29

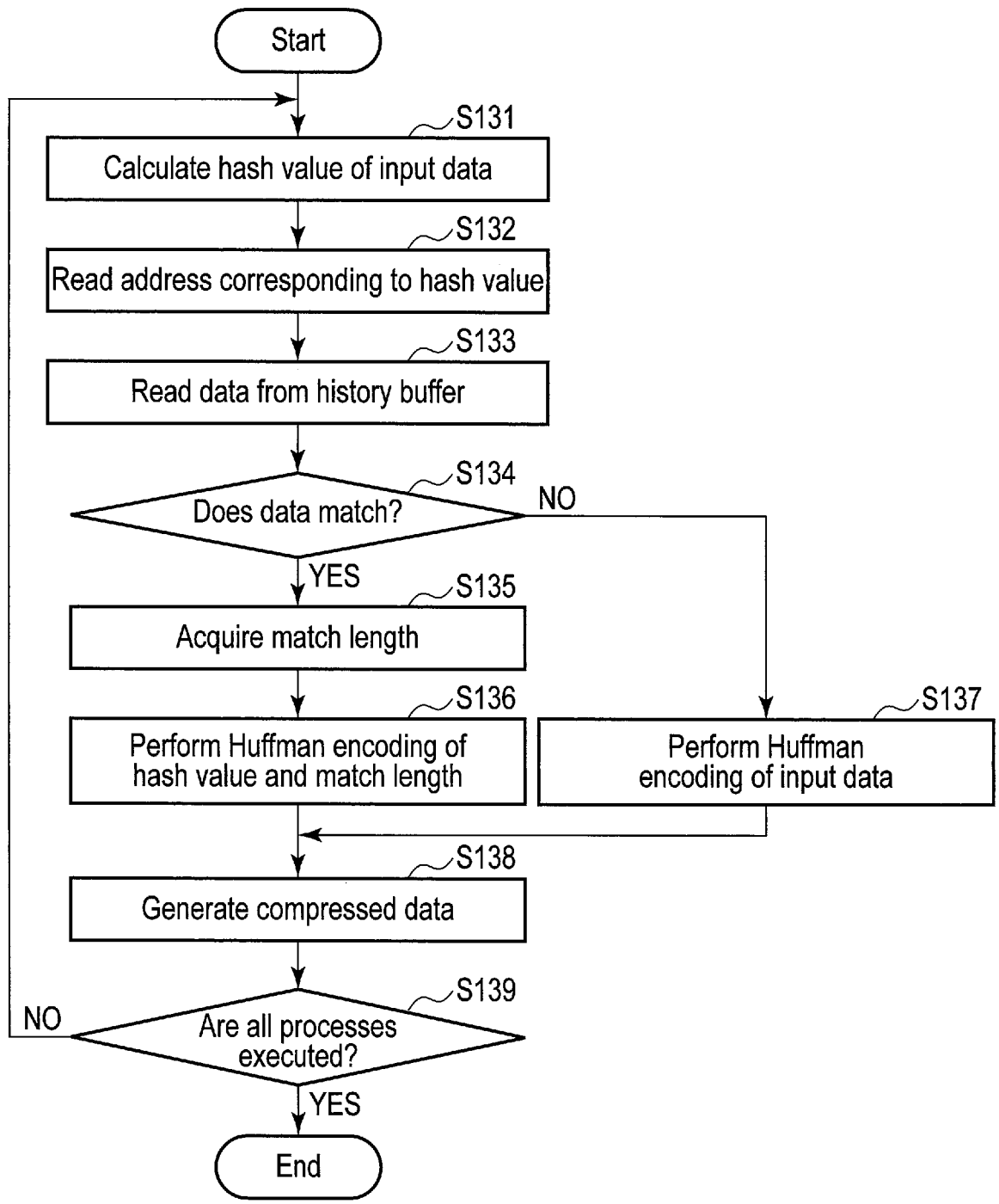
F I G. 30

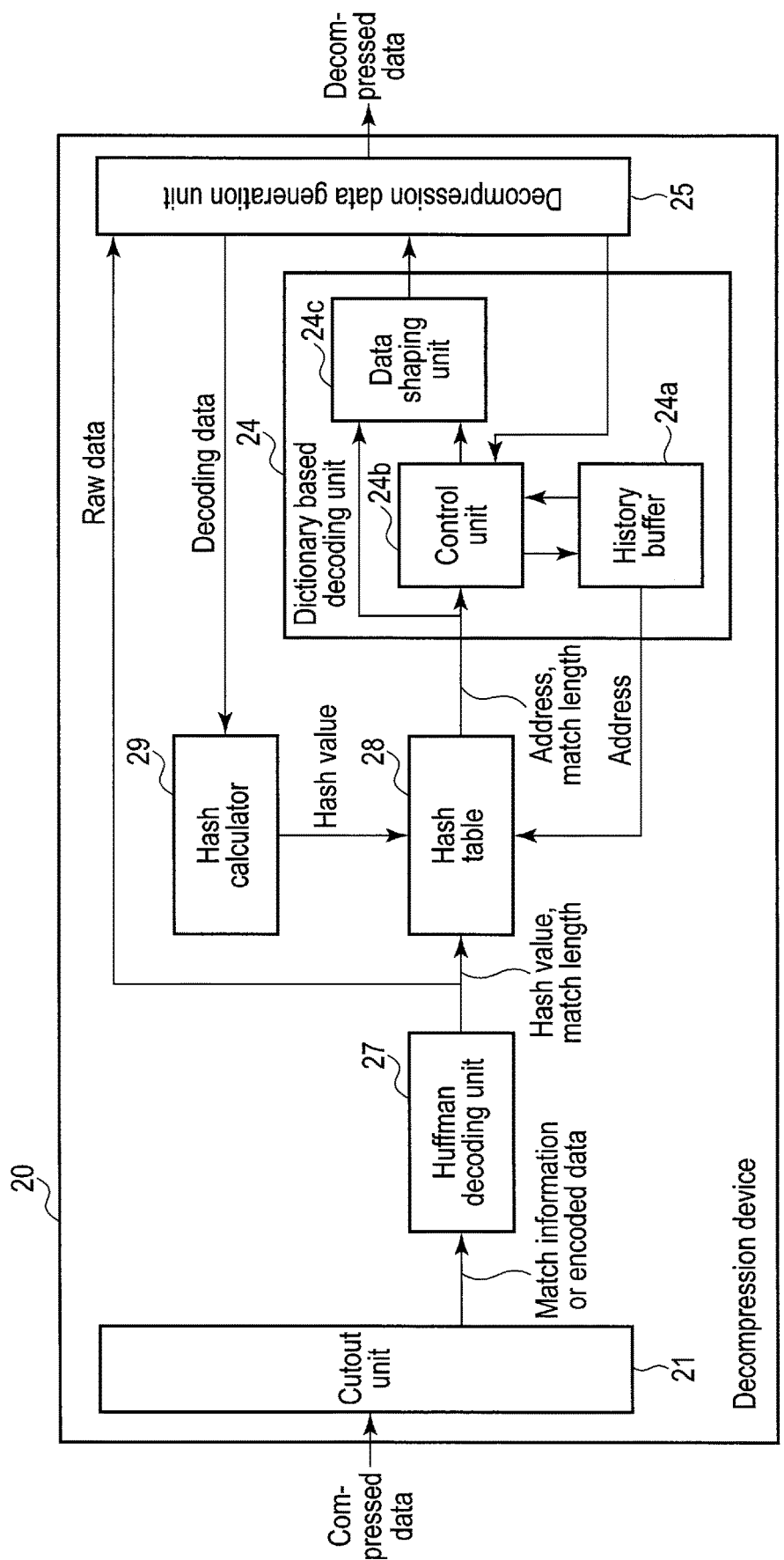
F I G. 31

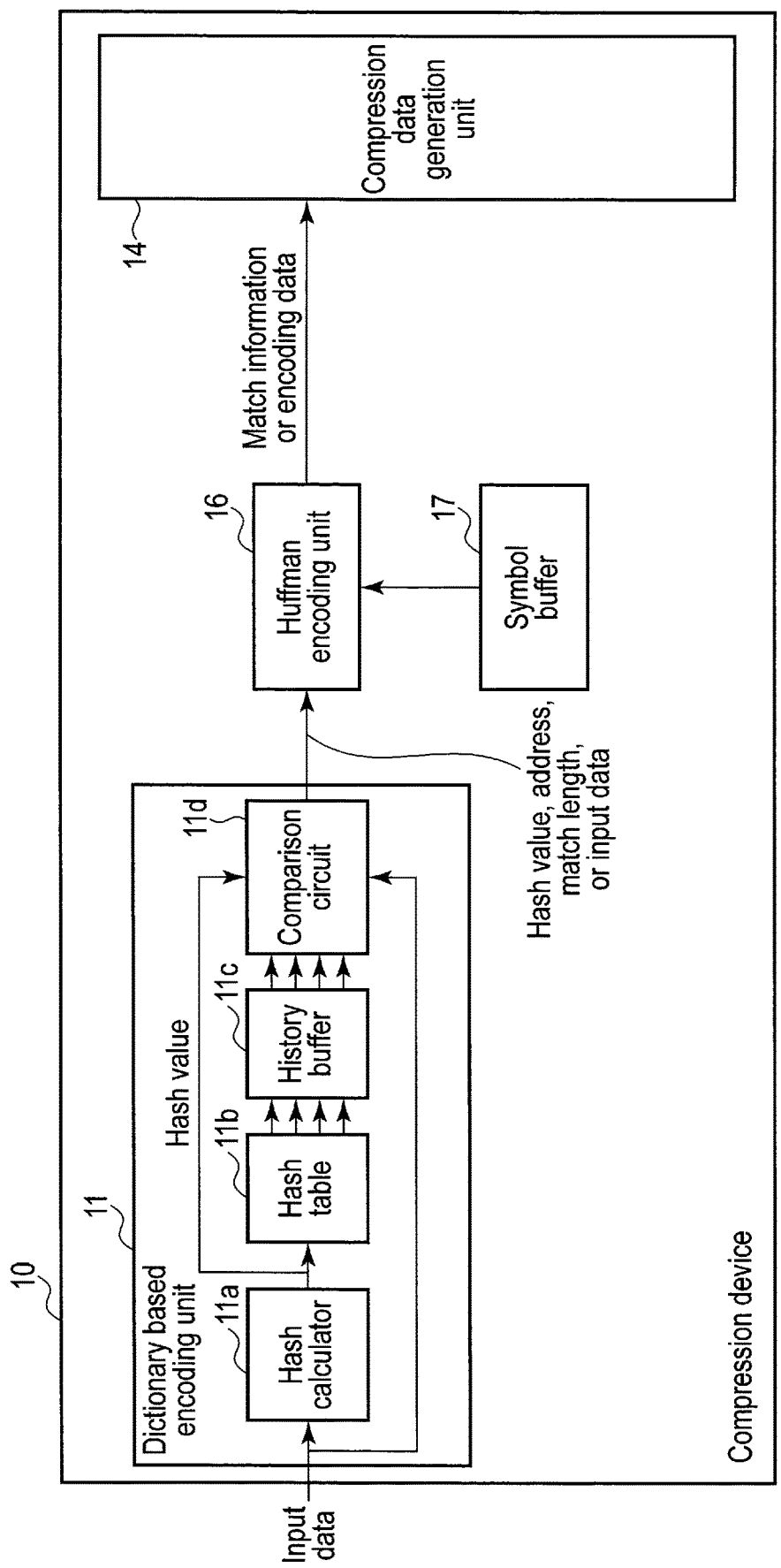
F I G. 33

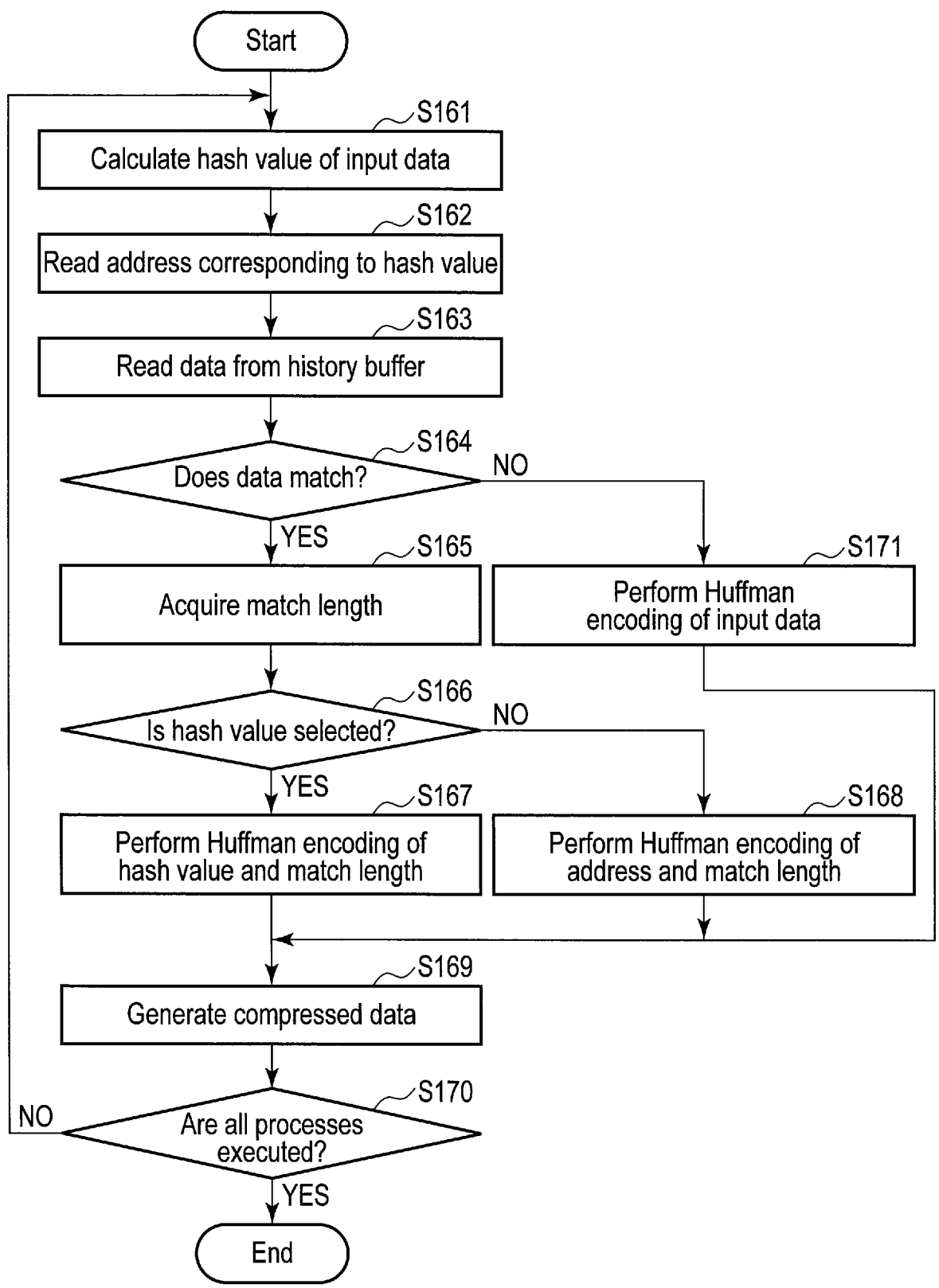
F I G. 34

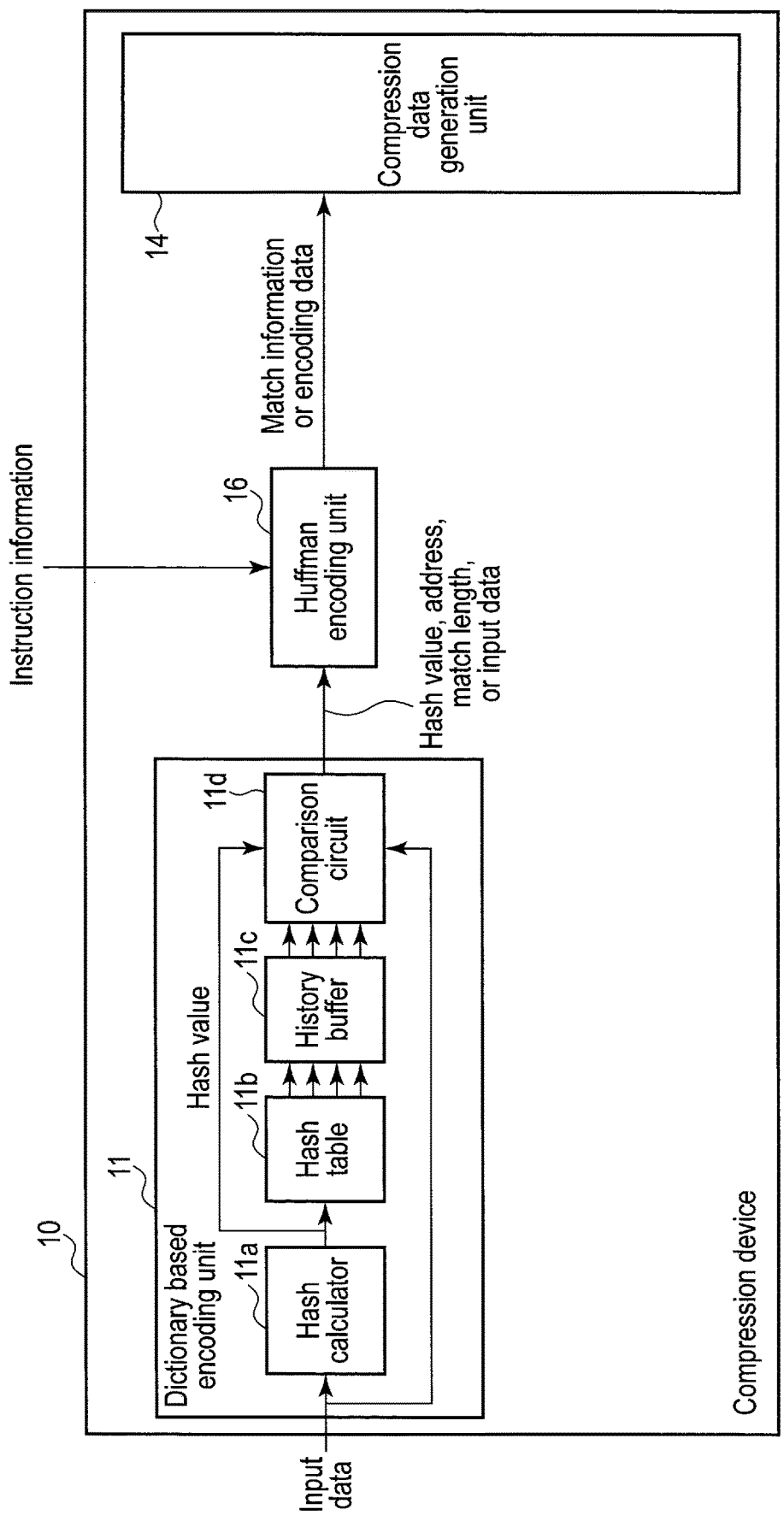
F I G. 37

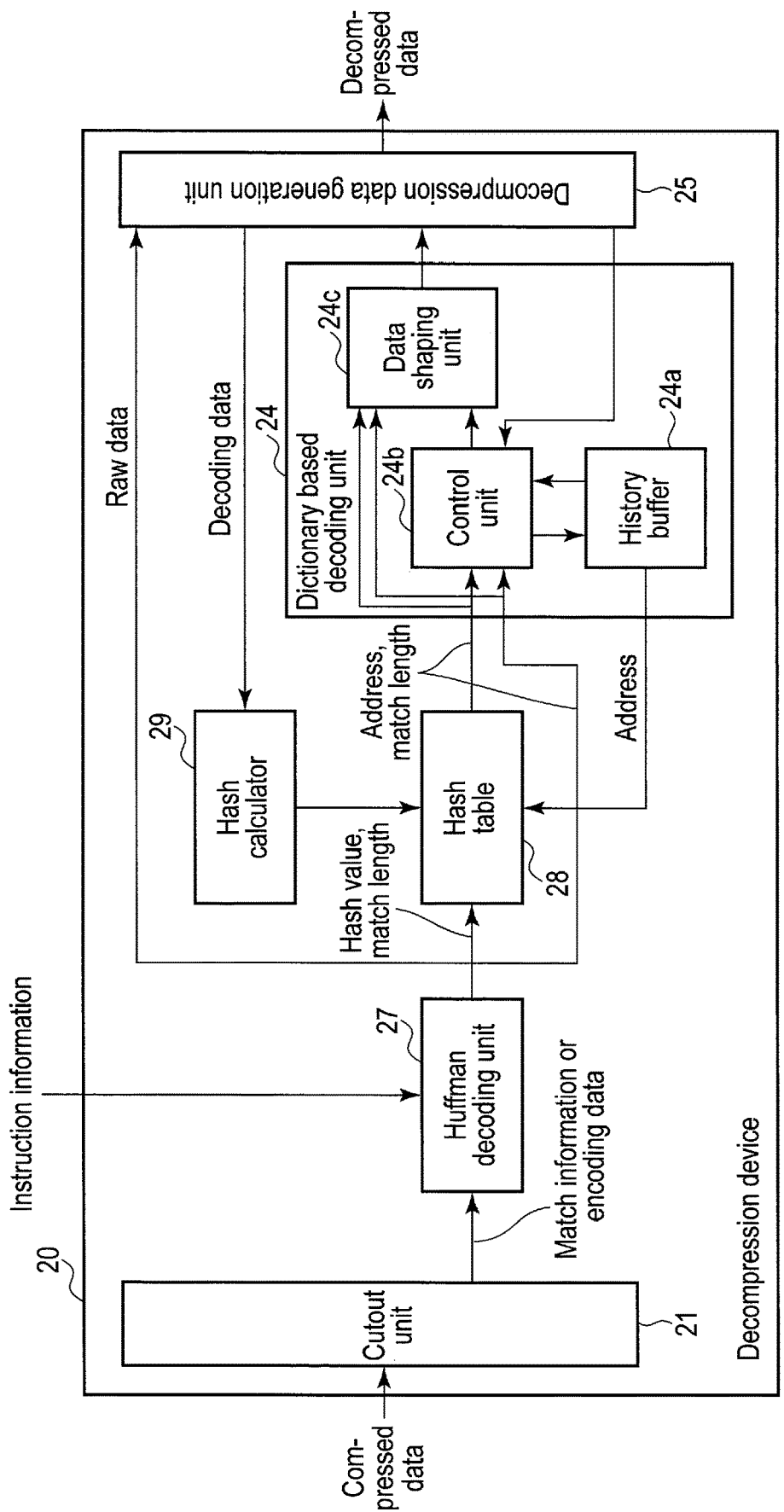
F I G. 39

COMPRESSION DEVICE, DECOMPRESSION DEVICE, AND METHOD

CROSS-REFERENCE TO RELATED APPLICATIONS

This application is based upon and claims the benefit of priority from Japanese Patent Application No. 2020-043918, filed Mar. 13, 2020, the entire contents of which are incorporated herein by reference.

FIELD

Embodiments described herein relate generally to a compression device, a decompression device, and a method.

BACKGROUND

Generally, dictionary based encoding is known as an encoding method used for data compression. In the dictionary based encoding, a buffer called a dictionary in which past data is stored for a certain period is used to search for the past data that at least partially matches input data from the buffer. When the past data that at least partially matches the input data exists in the buffer, a position (hereinafter, referred to as a match position) of the past data in the buffer and a matched length (hereinafter, referred to as a match length) of the input data and the past data are obtained. The dictionary based encoding is an encoding method that converts the input data into the match position and the match length obtained in this way.

Here, in general data compression, the above-described dictionary based encoding is often combined with other encoding methods. In this case, it is difficult to effectively compress (encode) the match position in the above-described dictionary based encoding.

BRIEF DESCRIPTION OF THE DRAWINGS

FIG. 1 is a block diagram schematically illustrating an example of a configuration of a storage device using a compression device and a decompression device according to a first embodiment.

FIG. 4 is a diagram for explaining an outline of an operation of a dictionary based encoding unit included in the compression device according to the present embodiment.

FIG. 7 is a diagram illustrating an example of a configuration of the decompression device according to the present embodiment.

FIG. 8 is a diagram for explaining an outline of an operation of a match position decoding unit included in the decompression device according to the present embodiment.

FIG. 10 is a diagram illustrating an example of a configuration of a compression device according to a second embodiment.

FIG. 13 is a diagram illustrating an example of a configuration of a decompression device according to the present embodiment.

FIG. 15 is a diagram illustrating an example of a configuration of a compression device according to a third embodiment.

FIG. 16 is a diagram for explaining an outline of an operation of a match position encoding unit included in the compression device according to the present embodiment.

FIG. 17 is a diagram illustrating an example of a configuration of a decompression device according to the present embodiment.

FIG. 18 is a diagram for explaining an outline of an operation of a match position decoding unit included in the decompression device according to the present embodiment.

FIG. 22 is a diagram illustrating an example of a configuration of a decompression device according to the present embodiment.

FIG. 25 is a diagram for explaining an example of an operation of a dictionary based encoding unit.

FIG. 26 is a diagram for explaining an example of an operation of a dictionary based encoding unit.

FIG. 27 is a diagram illustrating an example of a configuration of a compression device according to a fifth embodiment.

FIG. 28 is a diagram for explaining an outline of an operation of a dictionary based encoding unit included in the compression device according to the present embodiment.

FIG. 29 is a diagram for explaining an outline of an operation of the dictionary based encoding unit included in the compression device according to the present embodiment.

FIG. 30 is a flowchart illustrating an example of a process procedure of the compression device according to the present embodiment.

FIG. 31 is a diagram illustrating an example of a configuration of a decompression device according to the present embodiment.

FIG. 33 is a diagram illustrating an example of a configuration of a compression device according to a sixth embodiment.

FIG. 34 is a flowchart illustrating an example of a process procedure of the compression device according to the present embodiment.

FIG. 37 is a diagram illustrating an example of a configuration of a compression device according to a seventh embodiment.

FIG. 39 is a diagram illustrating an example of a configuration of a decompression device according to the present embodiment.

DETAILED DESCRIPTION

Figure 2:
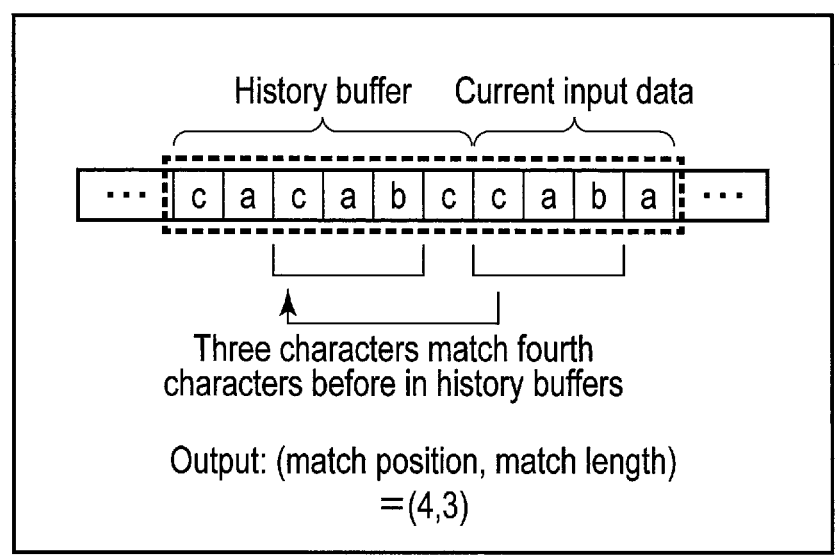
FIG. 2 is a diagram for explaining an outline of dictionary based encoding.

Various embodiments will be described hereinafter with reference to the accompanying drawings.

In general, according to one embodiment, a compression device used to compress input first data is provided. The compression device includes a dictionary based encoder, a second buffer, a comparator, and a compression data generator. The dictionary based encoder searches for second data at least partially matching first data from a first buffer in which the previously input second data is stored, and acquires a first match position indicating a position of the second data in the first buffer and a match length indicating a matched length of the first data and the second data. The second match position previously acquired by the dictionary based encoder is stored in the second buffer together with an index assigned to the second match position. The comparator compares the first match position with the second match position stored in the second buffer. The compression data generator generates first compressed data that includes the index assigned to the second match position stored in the second buffer and the match length when the first match position matches the second match position, and generates second compressed data that includes the first match position and the match length when the first match position does not match the second match position.

Hereinafter, each embodiment will be described with reference to the drawings.

First Embodiment

FIG. 1 is a block diagram schematically illustrating an example of a configuration of a storage device using a compression device and a decompression device according to a first embodiment. As illustrated in FIG. 1, a storage device 1 includes a controller 2, a NAND flash memory 3, and a dynamic random access memory (DRAM) 4.

The controller 2 has a function of controlling an operation of the storage device 1. The controller 2 includes a host interface (I/F) 2a, a CPU 2b, a NAND interface (I/F) 2c, a DRAM interface (I/F) 2d, and the like. Note that the host interface 2a, the CPU 2b, the NAND interface 2c, and the DRAM interface 2d are connected to each other via, for example, a bus.

The host interface 2a is a host interface circuit configured to execute communication with a host arranged outside the storage device 1. The host interface 2a may be, for example, a PCI Express controller or the like. The host interface 2a receives various requests (commands) from the host.

The CPU 2b is a processor configured to control, the host interface 2a, the NAND interface 2c, and the DRAM interface 2d. The CPU 2b loads a control program (firmware) from a NAND flash memory 3 or a read only memory (ROM) (not illustrated) into a DRAM 4 in response to power-on of the storage device 1, and executes the control program to perform various processes. This CPU 2b can execute a process on various requests from the host. The operation of the CPU 2b is controlled by the control program executed by the CPU 2b. Note that some or all of the processes on the request from the host may be executed by dedicated hardware in the controller 2.

The NAND interface 2c is a memory control circuit configured to control the NAND flash memory 3 under the control of the CPU 2b.

The DRAM interface 2d is a DRAM control circuit configured to control the DRAM 4 under the control of the CPU 2b.

Further, the controller 2 includes a compression device 10 and a decompression device 20. The compression device 10 is used to compress data input to the compression device 10 (hereinafter, referred to as input data). The input data (compressed data) compressed by the compression device 10 is written in the NAND flash memory 3, for example.

The decompression device 20 is used to decompress the compressed data read from the NAND flash memory 3.

Note that details of the configuration and operation of the compression device 10 and the decompression device 20 according to this embodiment will be described later.

The NAND flash memory 3 is a non-volatile memory and includes a memory cell array including a plurality of memory cells arranged in a matrix. The NAND flash memory 3 may be a NAND flash memory of a two-dimensional structure or a NAND flash memory of a three-dimensional structure.

A memory cell array of the NAND flash memory 3 includes a plurality of blocks BLK0 to BLKm−1. Each of the blocks BLK0 to BLKm−1 is organized by a plurality of pages (here, pages P0 to Pn−1). The blocks BLK0 to BLKm−1 function as erase units. Each of the pages P0 to Pn−1 includes a plurality of memory cells connected to the same word line. The pages P0 to Pn−1 are units of data write operation and data read operation.

Here, it has been described that the storage device 1 includes the NAND flash memory 3, but the storage device 1 may include, for example, a phase change memory (PCM) or a magnetoresistive random access memory (MRAM) as a non-volatile memory.

The DRAM 4 is a volatile memory, and functions as, for example, a temporary buffer for software executed in the controller 2 (CPU 2b) or a temporary buffer for the NAND flash memory 3.

Here, the storage device 1 is described as including the DRAM 4, but the storage device 1 may include, for example, a static random access memory (SRAM) or the like as the volatile memory.

In FIG. 1, the compression device 10 and the decompression device 20 are described as being incorporated in the controller 2 provided in the storage device 1, but one or both of the compression device 10 and the decompression device 20 may also be provided outside (for example, host) the storage device 1.

The compression device 10 and the decompression device 20 according to the present embodiment will be described below. In the present embodiment, dictionary based encoding is used to compress the input data. First, an outline of the dictionary based encoding will be described with reference to FIG. 2. In the present embodiment, the input data will be described as text (character string) data, for example.

The dictionary based encoding is an encoding method that converts input data into relative references of data previously input (that is, data that is input before the input data).

In this dictionary based encoding, the data previously input is stored in a buffer (hereinafter, referred to as a history buffer) called a dictionary, and it is searched whether data that matches all or some of the input data (forward data) exists in the history buffer. When data that matches all or some of the input data exists in the history buffer, a match position (matching relative distance indicating a relative distance from the input data) indicating the position of the data and a match length indicating a matched length of the input data and data searched from the history buffer are output.

Here, FIG. 2 illustrates that the current input data is "caba" and " . . . cacabc" is stored in the history buffer. According to the example illustrated in FIG. 2, the input data "caba" (a part thereof) matches two characters "ca" and three characters "cab" in the history buffer. When the longer part of the input data can be replaced with the relative reference, encoding efficiency is high, and therefore, the "cab" in the history buffer is selected as data that at least partially match the input data (hereinafter, referred to as buffer data).

Since the position of the buffer data ("cab") thus selected is four characters before the input data, the above-described match position (matching relative distance from the input data to a matching location) is four. In addition, since the "cab" of the input data matches the "cab" of the buffer data, the above-described match length is three (characters).

That is, in the example illustrated in FIG. 2, a set (4, 3) of the match position and the match length is output to a subsequent stage as a result of the dictionary based encoding for the input data "caba".

Note that in the dictionary based encoding, a process is executed so that continuously input data is sequentially encoded. In this case, the last "a" of the input data "caba" that does not match the buffer data is treated as the next input data together with the subsequent data, and the process is repeated.

Here, when the match position and the match length output as a result of the above-described dictionary based encoding can be further encoded, the encoding efficiency (compression efficiency) can be further improved. Specifically, in the case where the same data appears continuously, the data can be more efficiently encoded by run length encoding (RLE) which has less throughput than general entropy encoding. That is, it is considered to apply the RLE when the match position (or match length) of the same value is continuously output as the result of the above-described dictionary based encoding.

However, when the input data continues like, for example, "123 Kawasaki City, Kanagawa Prefecture", "345 Kawasaki City, Kanagawa Prefecture", and "256 Kawasaki City, Kanagawa Prefecture", the previously input data (buffer data) matches parts of "Kawasaki City, Kanagawa Prefecture", respectively, and therefore, the same match position (here, 38) is output. On the other hand, other match positions are output for "123", "345", and "256". Thereby, the same value (match position) is not continued and is separated.

Such a case can occur when the input data is text data or log data, and in this case, the efficient encoding cannot be realized by the above-described RLE.

Therefore, the compression device according to the present embodiment has a configuration for improving the encoding efficiency (compression efficiency) of the match position output as the result of the above-described dictionary based encoding.

Figure 3:
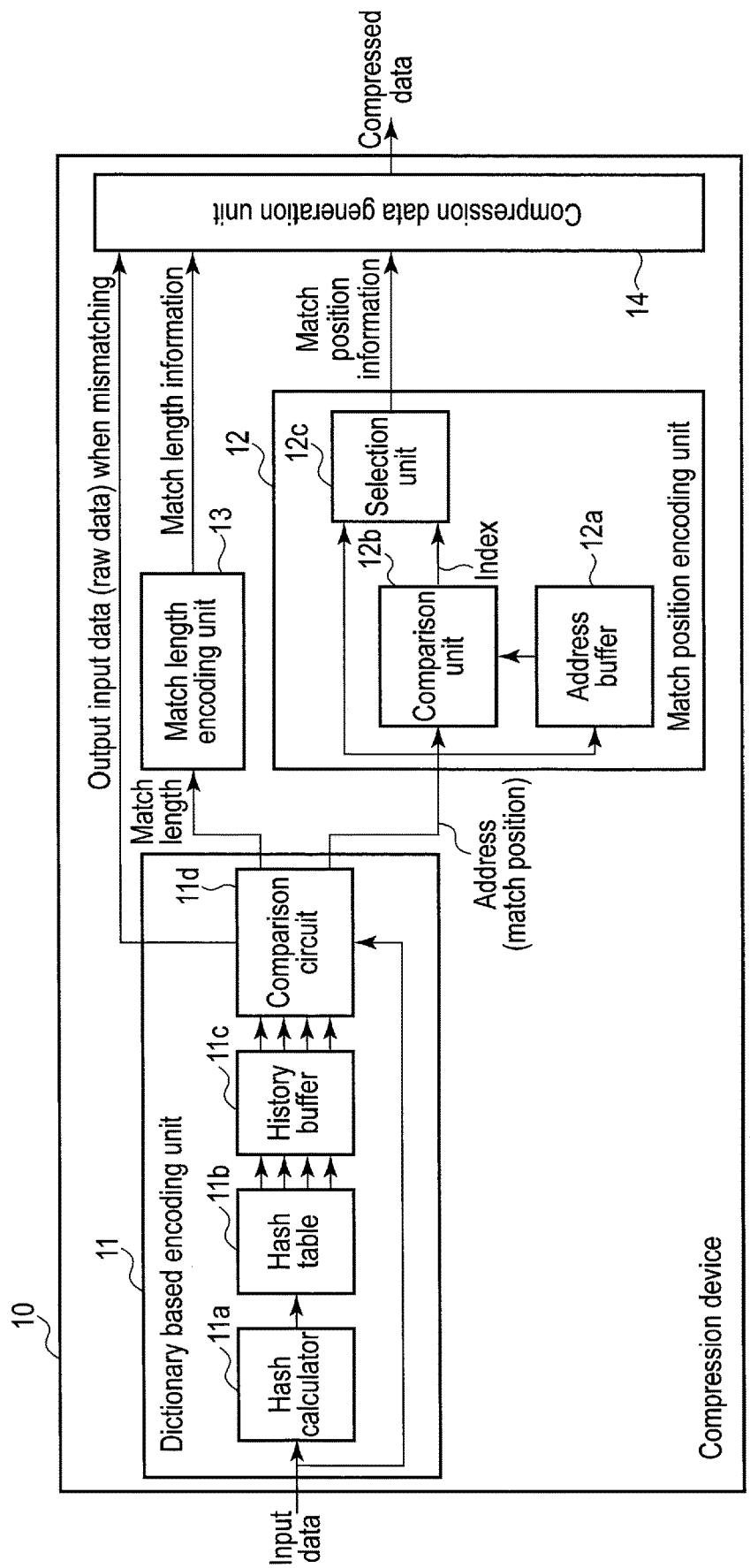
FIG. 3 is a diagram illustrating an example of a configuration of the compression device according to the present embodiment.

FIG. 3 is a diagram illustrating an example of a configuration of the compression device according to the present embodiment. As illustrated in FIG. 3, the compression device 10 includes a dictionary based encoding unit (dictionary based encoder) 11, a match position encoding unit (match position encoder) 12, a match length encoding unit (match length encoder) 13 and a compression data generation unit (compression data generator) 14.

The dictionary based encoding unit 11 encodes the input data using the above-described dictionary based encoding, and outputs the match position and the match length according to the input data. The dictionary based encoding unit 11 includes a hash calculator 11a, a hash table 11b, a history buffer 11c, and a comparison circuit 11d.

The hash calculator 11a uses a prepared hash function to calculate a hash value of the input data from at least a part of the input data.

The hash table 11b corresponds to the hash value calculated from at least a part of the data previously input to the compression device 10 and an address indicating the position of the data in the history buffer 11c (hereinafter, simply referred to as a data address).

The history buffer 11c stores the previously input data (buffer data) in the compression device 10.

According to the hash table 11b and the history buffer 11c, the address stored in the hash table 11b is acquired in association with the hash value (hash value matching therewith) of the input data calculated by the hash calculator 11a, and the buffer data stored in the address can be searched from the history buffer 11c.

Note that the buffer data searched from the history buffer 11c in this way are data that at least partially matches the input data because the hash values are common. When a plurality of addresses are stored in the hash table 11b in association with the same hash value, the plurality of buffer data may be searched as the buffer data that at least partially matches the input data.

The comparison circuit 11d compares the input data with the buffer data searched from the history buffer 11c, and acquires a match length indicating the matched length of the input data and the buffer data.

The address stored in the hash table 11b in association with the above-described hash value of the input data is output from the dictionary based encoding unit 11 to the match position encoding unit 12. The address output from the dictionary based encoding unit 11 to the match position encoding unit 12 corresponds to the match position in the dictionary based encoding. On the other hand, the match length acquired by the comparison circuit 11d is output from the dictionary based encoding unit 11 to the match length encoding unit 13.

When the plurality of buffer data are searched as described above, the match length with the input data is acquired for each of the buffer data, and in this case, the buffer data having the longest match length may be selected from the plurality of buffer data and the address of the selected buffer data may be output.

In addition, here, the case where the hash value calculated by the hash calculator 11a is stored in the hash table 11b (that is, the buffer data at least partially matching the input data exists in the history buffer 11c) is described. However, when the hash value is not stored in the hash table 11b, the dictionary based encoding unit 11 (comparison circuit 11d included therein) outputs the input data to the compression data generation unit 14.

In addition, although not illustrated in FIG. 3, the input data is newly added (registered) to the history buffer 11c. In this way, when the input data is added to the history buffer 11c, the hash value calculated by the hash calculator 11a and the address of the input data added to the history buffer 11c is added (registered) to the hash table lib.

The match position encoding unit 12 encodes the address (match position) output from the dictionary based encoding unit 11. As illustrated in FIG. 3, the match position encoding unit 12 includes an address buffer 12a, a comparison unit (comparator) 12b, and a selection unit 12c.

The address previously acquired by the dictionary based encoding unit 11 (that is, previously output from the dictionary based encoding unit 11 to the match position encoding unit 12) is stored in the address buffer 12a together with an index assigned to the address.

The comparison unit 12b compares the address output from the dictionary based encoding unit 11 with the address stored in the address buffer 12a. When the address output from the dictionary based encoding unit 11 matches the address stored in the address buffer 12a, the comparison unit 12b acquires the index assigned to the address from the address buffer 12a and outputs the acquired index. When the address output from the dictionary based encoding unit 11 does not match the address stored in the address buffer 12a, the index is not output from the comparison unit 12b.

The selection unit 12c selects one of the address output from the dictionary based encoding unit 11 and the index output from the comparison unit 12b, and outputs the selected address or index as the match position information. The selection unit 12c selects one of the address and the index that has the smaller data amount, for example. When the index is not output from the comparison unit 12b as described above, the selection unit 12c selects the address output from the dictionary based encoding unit 11.

In addition, the address output from the dictionary based encoding unit 11 is added to the address buffer 12a after the match position information is output from the selection unit 12c described above. The address buffer 12a is managed as first in first out (FIFO), and when a new address is added (input) to the address buffer 12a, the oldest address (the oldest stored address) is discarded from the address buffer 12a. Here, it has been described that the address buffer 12a is being managed as the FIFO, but the address buffer 12a may be managed as, for example, least recently used (LRU) or the like.

The match length encoding unit 13 encodes the match length output from the dictionary based encoding unit 11. Note that entropy encoding (for example, Huffman encoding) can be applied as an encoding method for the match length. The match length encoding unit 13 outputs the encoded match length as match length information.

The above-described Huffman encoding is an encoding method in which a code according to an appearance frequency of the match length is assigned to the match length.

When the Huffman encoding is applied to the match length as the encoding method, the Huffman encoding may be static Huffman encoding that performs encoding using a pre-constructed code tree or may be dynamic Huffman encoding that changes the code tree according to the input data (match length).

The compression data generation unit 14 collectively packs match position information (address or index) output from the match position encoding unit 12 (selection unit 12c) and match length information (encoded match length) output from the match length encoding unit 13 in a compressed stream to generate compressed data. In addition, as described above, when the input data is output from the dictionary based encoding unit 11 to the compression data generation unit 14, the input data is packed in the compressed stream. The compressed data generated by the compression data generation unit 14 is output to the outside of the compression device 10.

In the present embodiment, it is assumed that some or all of the dictionary based encoding unit 11, the match position encoding unit 12, the match length encoding unit 13, and the compression data generation unit 14 illustrated in FIG. 3 are realized by dedicated hardware (circuit), for example. However, some or all of these units 11 to 14 may be realized by allowing the controller 2 (CPU 2b) provided in the storage device 1 described above or a computer (for example, a processor or a controller) provided in the compression device 10 to execute a predetermined program (that is, software).

Hereinafter, the outline of the operation of the compression device 10 according to the present embodiment will be described below. First, the outline of the operation of the dictionary based encoding unit 11 included in the compression device 10 will be described with reference to FIG. 4.

Here, the compression device 10 operates, for example, to continuously input and encode (compress) a plurality of data that configure one file, and the case in which input data (encoding target character string) is "This is a pen." is assumed. In this case, the hash calculator 11a calculates "H (This)" as a hash value of input data "This is a pen." (step S1). Note that a hash value "H (This)" indicates a hash value calculated by applying the hash function to the first 4 characters of the input data "This is a pen.".

Next, referring to the hash table 11b as illustrated in FIG. 4, the address (read address) "400" stored in the hash table 11b in association with the hash value "H (This)" calculated in step S1 is extracted from the hash table 11b (step S2).

In this way, the buffer data is read from the history buffer 11c based on the address "400" extracted from the hash table 11b (step S3). Here, it is assumed that buffer data "This is an apple" including the predetermined number of characters is read from the address "400". The buffer data "This is an apple" read from the history buffer 11c in step S3 is the buffer data stored in the address stored in the hash table 11b in association with the hash value "H (This)", and at least partially matches the input data (first 4 characters).

Next, the comparison circuit 11d compares the input data "This is a pen." with the buffer data "This is an apple" (step S4).

In this case, since the input data "This is a pen" and the buffer data "This is an apple" match up to "This is a", the dictionary based encoding unit 11 outputs "400" as an address of a history buffer used as the match position and "9" as a match length indicating a matched length of the input data and the buffer data (step S5). Note that in the example illustrated in FIG. 4, the match length also includes a space.

When a process in step S5 is executed, "This is a" that can be encoded is added to the history buffer 11c as the buffer data (step S6).

Note that in the history buffer 11c, data is managed so that the addresses of each buffer data stored in the history buffer 11c are updated (that is, shifted) by adding new data. For this reason, although not illustrated in FIG. 4, when new buffer data (here, "This is a") is stored in the history buffer 11c, the address stored in the hash table 11b is also updated according to the update of the address in the history buffer 11c.

Furthermore, when "This is a" is added to the history buffer 11c as described above, the hash value "H (This)" of the "This is a" and the address of the "This is a" are added to the hash table 1ib.

Although the dictionary based encoding for the input data can be performed by executing processes of steps S1 to S6 described above, as illustrated in FIG. 4, when "This is a" of the input data "This is a pen." is encoded, the processes of steps S1 to S6 are repeatedly executed on the input data including the remaining "pen." (and subsequent data).

When the hash value calculated in step S1 is not stored in the hash table 11b, the dictionary based encoding unit 11 will output the input data "This is a pen.". In this case, the input data "This is a pen." is added to the history buffer 11c, and the address of "This is a pen." in the history buffer 11c and the hash value H (This) are added to the hash table 11b. Also in this case, the address already stored in the hash table 11b needs to be updated.

Next, the outline of the operation of the match position encoding unit 12 included in the compression device 10 will be described with reference to FIG. 5.

Figure 5:
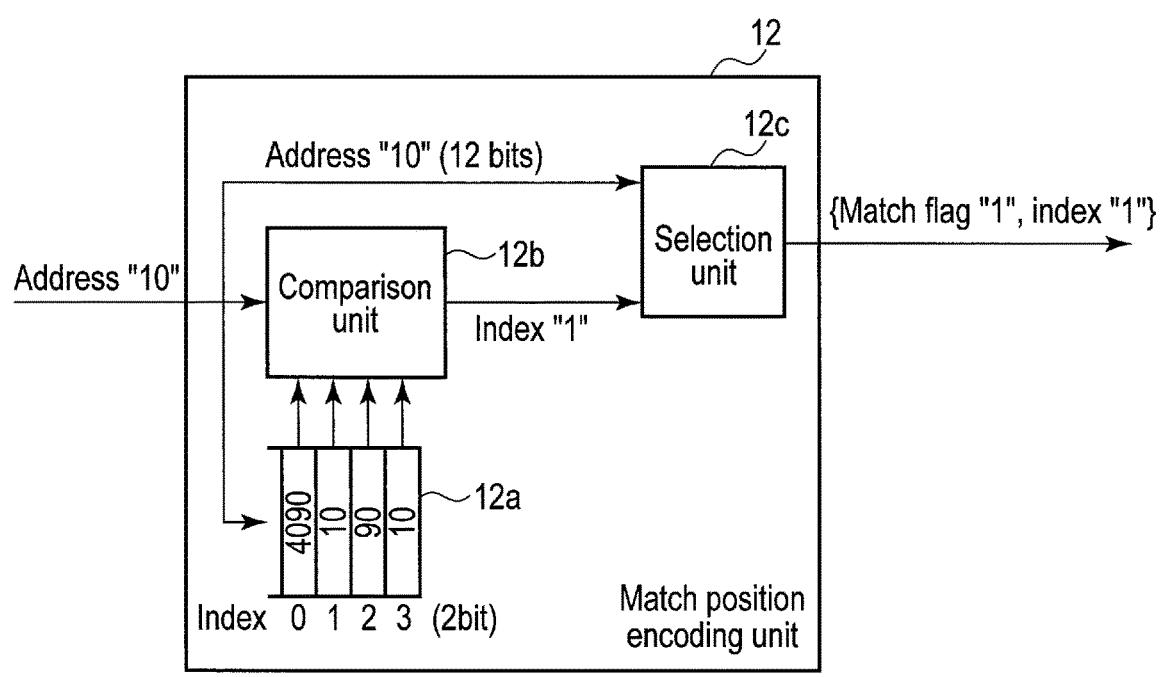
FIG. 5 is a diagram for explaining an outline of an operation of a match position encoding unit included in the compression device according to the present embodiment.

Here, as illustrated in FIG. 5, the address buffer 12a is constituted by four stages, and the address buffer 12a stores the addresses "4090", "10", "90", and "10" as addresses previously output from the dictionary based encoding unit 11.

Further, in the address buffer 12a, an index is assigned to each address stored in the address buffer 12a. In the example illustrated in FIG. 5, index "0" is assigned to the address "4090", index "1" is assigned to the address "10", index "2" is assigned to the address "90", and index "3" is assigned to the address "10". In this case, the index in the address buffer 12a is represented by 2 bits.

Here, it is assumed that the address "10" is output as the match position from the dictionary based encoding unit 11. In this case, since the address "10" is stored in the address buffer 12a, the comparison unit 12b acquires the index assigned to the address "10". The address buffer 12a stores two addresses "10". In this case, the comparison unit 12b acquires, for example, the index "1" having a smaller value out of the indexes assigned to two addresses "10". Such a rule (condition) for acquiring an index may be set in advance.

In this case, the comparison unit 12b outputs, to the selection unit 12c, the index "1" having a 1-bit match flag indicating that the address "10" output from the dictionary based encoding unit 11 is stored in the address buffer 12a (that is, the address output from the dictionary based encoding unit 11 matches the address stored in the address buffer 12a).

Next, the selection unit 12c selects and outputs one of the address output from the dictionary based encoding unit 11 and the index output from the comparison unit 12b.

Here, when the address output from dictionary based encoding unit 11 can be taken up to 4096 bytes, the address is represented by 12 bits. On the other hand, the index output from the comparison unit 12b is represented by 2 bits as described above. In this case, the index output from the comparison unit 12b has a smaller amount of data than the address output from the dictionary based encoding unit 11. For this reason, the selection unit 12c outputs, as the match position information, 3-bit information {match flag (1 bit), index (2 bits)} with the above-described 1-bit match flag attached to the index "1" output from the comparison unit 12b. The match flag attached to the index in the match position information is, for example, "1".

On the other hand, although not illustrated in FIG. 5, when the address output from the dictionary based encoding unit 11 is not stored in the address buffer 12a, the index is not output from the comparison unit 12b, so the address is selected by the selection unit 12c. In this case, the selection unit 12c outputs, as the match position information, 13-bit information {match flag (1 bit), and address (12 bits)} with a 1-bit match flag (a match flag indicating that the address output from the dictionary based encoding unit 11 does not match the address stored in the address buffer 12a) attached to the address represented by 12 bits. Note that the match flag attached to the address in the match position information is, for example, "0".

When the address output from the dictionary based encoding unit 11 is stored in the address buffer 12a as described above, the information output from the match position encoding unit 12 (selection unit 12c) is 3 bits as described above. On the other hand, when the address output from the dictionary based encoding unit 11 is not stored in the address buffer 12a as described above, the information output from the match position encoding unit 12 (selection unit 12c) is 13 bits as described above. Therefore, in the present embodiment, when the address output from the dictionary based encoding unit 11 is stored in the address buffer 12a, a compression rate of 3/13=23% can be realized compared to the case of outputting the address (raw match position).

Further, the address "10" output from the above-described dictionary based encoding unit 11 is added to the address buffer 12a. In this case, the oldest address "10" (the address "10" to which the index "3" was assigned) among the addresses stored in the address buffer 12a is discarded from the address buffer 12a. Thereby, the address buffer 12a is in the state in which "10", "4090", "10", and "90" are stored. The index "0" may be newly assigned to the address "10". The index "1" may be newly assigned to the address "4090". The index "2" may be newly assigned to the address "10". The index "3" may be newly assigned to the address "90".

Although the present embodiment describes that the selection unit 12c selects one having the smaller amount of data from the address output from the dictionary based encoding unit 11 and the index output from the comparison unit 12b, the index often has less data than the address, and therefore the selection unit 12c may be configured to select the index when the index is output from the comparison unit 12b and select the address when the index is not output from the comparison unit 12b.

Next, an example of the process procedure of the compression device 10 according to the present embodiment will be described with reference to the flowchart of FIG. 6.

First, the hash calculator 11a included in the dictionary based encoding unit 11 calculates the hash value of the input data (step S11).

Next, the address stored in the hash table 11b in association with the hash value calculated in step S11 is read from the hash table 11b (step S12).

Further, the buffer data is read from the history buffer 11c based on the address read from the hash table 11b in step S12 (step S13).

When the process in step S13 is executed, the comparison circuit 11d compares the input data with the buffer data read from the history buffer 11c in step S13, and determines whether the input data at least partially matches the buffer data (step S14).

When it is determined that the input data at least partially matches the buffer data (YES in step S14), the comparison circuit 11d acquires the match length indicating the matched length between the input data and the buffer data (step S15).

The address read from the hash table 11b in step S12 described above is output to the match position encoding unit 12, and the match length acquired in step S15 is output to the match length encoding unit 13.

The comparison unit 12b included in the match position encoding unit 12 determines whether the address output from the dictionary based encoding unit 11 (comparison circuit 11d) matches the address stored in the address buffer 12a (step S16).

When it is determined that the address output from the dictionary based encoding unit 11 matches the address stored in the address buffer 12a (YES in step S16), the selection unit 12c selects the index assigned to the address in the address buffer 12a and outputs the index to the compression data generation unit 14 as match position information (step S17).

On the other hand, when it is determined that the address output from the dictionary based encoding unit 11 does not match the address stored in the address buffer 12a (NO in step S16), the selection unit 12c selects the address output from the dictionary based encoding unit 11 (raw match position) and outputs the address to the compression data generation unit 14 as the match position information.

When the process in step S17 or S18 is executed, the match position encoding unit 12 updates the address buffer 12a included in the match position encoding unit 12 (step S19). Specifically, the match position encoding unit 12 adds the address output from the dictionary based encoding unit 11 to the address buffer 12a. In this way, when a new address is added to the address buffer 12a, the oldest address among the addresses stored in the address buffer 12a is discarded from the address buffer 12a.

In step S19, in order to more improve the encoding efficiency (that is, improve the probability that the address output from the dictionary based encoding unit 11 matches the address stored in the address buffer 12a), when the same address as the address output from the dictionary based encoding unit 11 is stored in the address buffer 12a in advance, the address may not be added to the address buffer 12a.

On the other hand, the match length encoding unit 13 performs encoding (for example, Huffman encoding) on the match length output from the dictionary based encoding unit 11 (comparison circuit 11d) (step S20). The match length encoded in step S20 is output from the match length encoding unit 13 to the compression data generation unit 14 as match length information.

Figure 6:
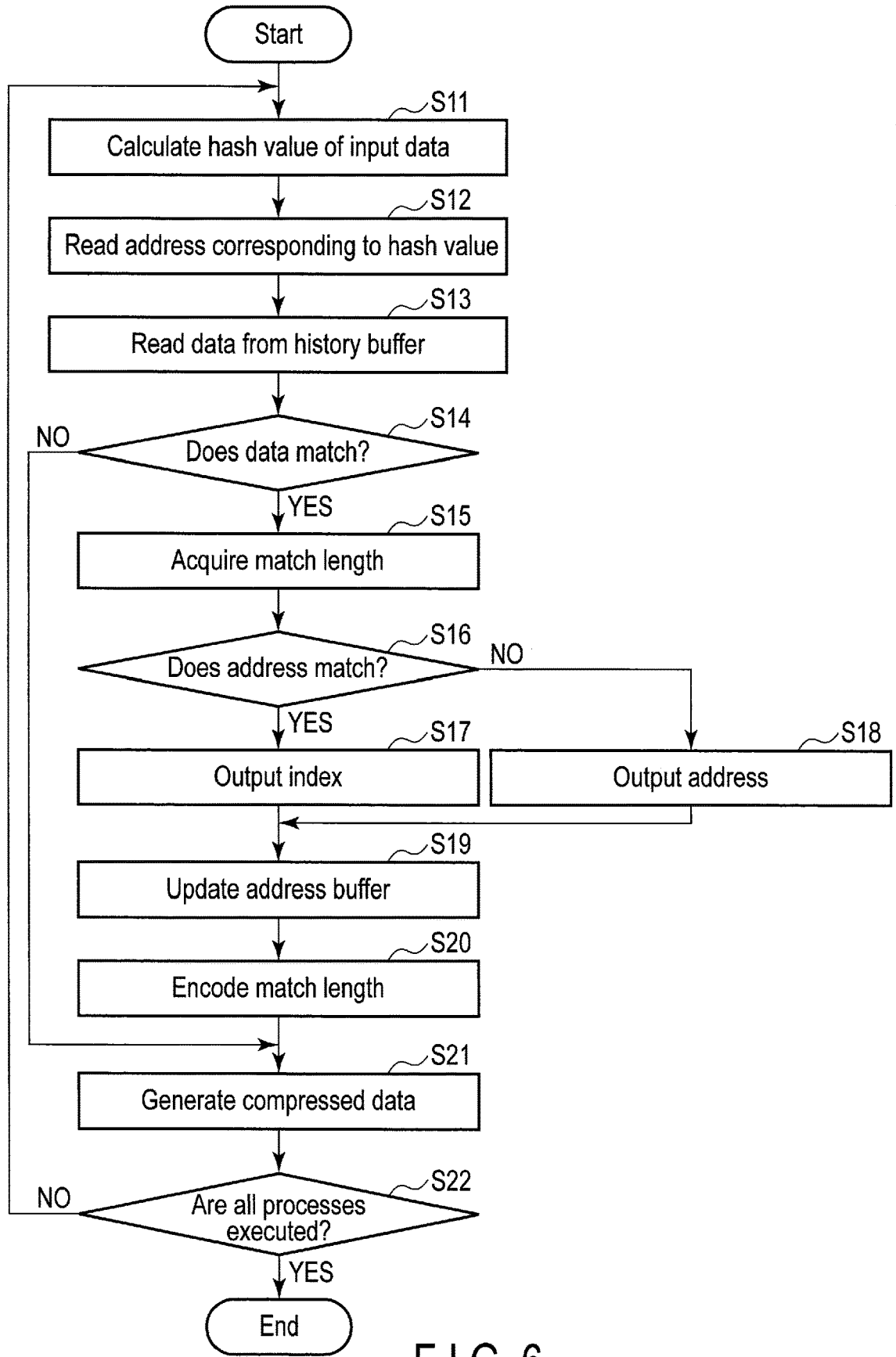
FIG. 6 is a flowchart illustrating an example of a process procedure of the compression device according to the present embodiment.

Note that in FIG. 6, for convenience, the process in step S20 is illustrated to be executed after the process in step S19 is executed, but the process of step S20 (process of the match length encoding unit 13) may be executed in parallel with the processes of steps S16 to S19 (process of the match position encoding unit 12).

The compression data generation unit 14 packs a set of the match position information output from the match position encoding unit 12 (selection unit 12c) and the match length information output from the match length encoding unit 13 (hereinafter, referred to as match information) in a compressed stream to generate the compressed data (step S21).

Next, it is determined whether or not the above-described process (compression process) has been executed on all the input data (step S22).

When it is determined that the process has not been executed on all the input data (NO in step S22), the process after step S11 is repeated for the new input data.

On the other hand, when it is determined that the process has been executed on all the input data (YES in step S22), the process illustrated in FIG. 6 ends. In this case, the compressed data generated in step S20 is output from the compression device 10 and written in, for example, the NAND flash memory 3 or the like.

When it is determined in step S14 that the input data does not at least partially match the buffer data (NO in step S14), the input data is output from the dictionary based encoding unit 11 to the compression data generation unit 14. The process in step S14 takes into consideration the occurrence possibility of hash collision (that is, the same hash value is generated from different data), and when the buffer data stored in the address associated with the hash value does not match the input data even if the same hash value as the hash value of the input data is stored in the hash table 11b, the match length cannot be acquired. Therefore, the dictionary based encoding unit 11 outputs the input data to the compression data generation unit 14. In this case, the process in step S21 is executed, and in the process in step S21, the input data output from the dictionary based encoding unit 11 is packed in the compressed stream as it is.

Although not illustrated in FIG. 6, for example, even when the hash value of the input data is not stored in the hash table 11b, the input data is output from the dictionary based encoding unit 11 and the process in step S21 is executed.

Here, when the process illustrated in FIG. 6 is completed as described above, the compressed data output from the compression device 10 corresponds to a compressed stream in which a set of the match position information output from the match position encoding unit 12 and the match length information output from the match length encoding unit 13 (match information) and the input data (hereinafter, referred to as raw data) output from the dictionary based encoding unit 11 are sequentially packed by sequentially processing the data continuously input to the compression device 10. In addition, in order to make it possible to distinguish the match information and the raw data included in the compressed data (packed in the compressed stream) in the process of the decompression device 20 described later, for example, it is assumed that a flag indicating the match information is attached to a head of the match information included in the compressed data and a flag indicating the raw data is attached to a head of the raw data.

In addition, although not illustrated in FIG. 6, the input data is added to the history buffer 11c, for example, after at least the process in step S13 is executed. Here, for convenience, the input data will be described as being added to the history buffer 11c, but the input data added to the history buffer 11c specially means a part that matches the buffer data among the input data. That is, when all the input data match the buffer data, all the input data is added to the history buffer 11c, but when only part of the input data matches the buffer data, only the part among the input data that matches the buffer data is added to the history buffer 11c. The part that does not match the buffer data among the input data is treated as subsequent input data as described above. Note that when the input data does not at least partially match the buffer data or when the hash value of the input data is not stored in the hash table 11b, all the input data is added to the history buffer 11c.

In addition, when the input data is added to the history buffer 11c as described above, the address of the buffer data stored in the history buffer 11c is updated as described above, and therefore the address stored in the hash table 11b is updated according to the update of the address. Further, when the input data is added to the history buffer 11c as described above, the hash value of the input data and the address of the input data in the history buffer 11c are added to the hash table 11b.

By updating the hash table 11b and the history buffer 11c according to the input data as described above, when new data at least partially matching the input data is input to the compression device 10 later and the process illustrated in FIG. 6 is executed, the new data can be encoded by using the address of the input data in the history buffer 11c.

Next, the decompression device 20 according to the present embodiment will be described. FIG. 7 illustrates an example of the configuration of the decompression device 20. As illustrated in FIG. 7, the decompression device 20 includes a cutout unit 21, a match position decoding unit (match position decoder) 22, a match length decoding unit (match length decoder) 23, a dictionary based decoding unit (dictionary based decoder) 24, and a decompression data generation unit (decompression data generator) 25.

For example, when the compressed data read from the NAND flash memory 3 is input to the decompression device 20, the cutout unit 21 acquires the compressed data. As described above, since the match information and the raw data are sequentially packed in the compressed data (compressed stream), the cutout unit 21 sequentially cuts out (separates) the match information and the raw data from the compressed data.

When the match information is cut out from the compressed data, the cutout unit 21 separates the match information into the match position information (index or address) and the match length information (encoded match length). The match position information separated by the cutout unit 21 is output to the match position decoding unit 22, and the match length information separated by the cutout unit 21 is output to the match length decoding unit 23.

On the other hand, when the raw data is cut out from the compressed data, the cutout unit 21 outputs the raw data to the decompression data generation unit 25.

The decompression device 20 can distinguish whether the match information or the raw data is cut out from the compressed data by the flag attached to the head of the match information and the raw data in the compression device 10 as described above.

The match position decoding unit 22 includes an address buffer 22a, a search unit 22b, and a selection unit 22c. The address converted from the index cut out as the match position information from the previously compressed data or the address cut out as the match position information from the compressed data is stored in the address buffer 22a together with the index assigned to the address.

Here, as described above, the match position information output from the cutout unit 21 is one of the index and the address, and the search unit 22b distinguishes whether the match position information is the index or the address based on the match flag attached to the match position information.

When the search unit 22b distinguishes that the match position information is the index, the address to which the index is assigned is searched from the address buffer 22a by the search unit 22b, and the searched address is output to the selection unit 22c.

On the other hand, when the search unit 22b distinguishes that the match position information is an address, the search unit 22b outputs the address to the selection unit 22c.

Further, the search unit 22b outputs the match flag attached to the match position information to the selection unit 22c.

The selection unit 22c selects the address searched (output) from the address buffer 22a or the address output from the search unit 22b based on the match flag output from the search unit 22b, and outputs the selected address to the dictionary based decoding unit 24. Note that the address output from the selection unit 22c is added to the address buffer 22a.

The match length decoding unit 23 decodes (for example, performs Huffman decoding) the match length information (encoded match length) output from the cutout unit 21. The match length decoded by the match length decoding unit 23 is output to the dictionary based decoding unit 24.

The dictionary based decoding unit 24 decodes the address output from the match position decoding unit 22 and the match length output from the match length decoding unit 23 (that is, the result of the dictionary based encoding performed by the compression device 10), and generates data (input data) not compressed by the compression device 10.

The dictionary based decoding unit 24 includes a history buffer 24a, a control unit 24b, and a data shaping unit 24c.

The data generated by decoding the address previously output from the match position decoding unit 22 and the match length output from the match length decoding unit 23 in the past and the raw data output from the cutout unit 21 (that is, data corresponding to the input data compressed by the compression device 10) are stored in the history buffer 24a.

The control unit 24b reads buffer data from the history buffer 24a based on the address output from the match position decoding unit 22 and the match length output from the match length decoding unit 23. In this case, the control unit 24b reads the buffer data that is stored in the address output from the match position decoding unit 22 and has the number of characters over at least the match length. The buffer data read by the control unit 24b is output to the data shaping unit 24c.

The data shaping unit 24c shapes the buffer data output from the control unit 24b based on the match length output from the match position decoding unit 22. In this case, the data shaping unit 24c cuts out (extracts), from the buffer data output from the control unit 24b, a part that matches the match length output from the match position decoding unit 22. The buffer data shaped by the data shaping unit 24c (hereinafter, referred to as shaped data) is output to the decompression data generation unit 25.

The decompression data generation unit 25 generates decompressed data including the shaped data output from the data shaping unit 24c and the raw data output from the cutout unit 21. The decompressed data generated by the decompression data generation unit 25 corresponds to the input data sequentially input to the compression device 10. The decompressed data generated by the decompression data generation unit 25 is output to the outside of the decompression device 20. In addition, the decompression data generation unit 25 adds the shaped data output from the data shaping unit 24c and the raw data output from the cutout unit 21 to the history buffer 24a via the control unit 24b.

In the present embodiment, it is assumed that some or all of the cutout unit 21, the match position decoding unit 22, the match length decoding unit 23, and the dictionary based decoding unit 24 included in the decompression device 20 are realized by dedicated hardware (circuit), for example. However, some or all of the respective units 21 to 24 may be realized by allowing the controller 2 (CPU 2b) provided in the storage device 1 described above or a computer (for example, a processor or a controller) provided in the decompression device 20 to execute a predetermined program (that is, software).

The outline of the operation of the decompression device 20 according to the present embodiment will be described below with reference to FIG. 8. Here, the outline of the operation of match position decoding unit 22 will be mainly described.

First, it is assumed that the cutout unit 21 outputs the match position information {match flag "1", index "1"} (that is, 3'b101). In this case, the search unit 22b included in the match position decoding unit 22 determines that the match position information is the index based on the match flag "1". Note that the search unit 22b outputs the match flag "1" to the selection unit 22c.

Here, in the example illustrated in FIG. 8, the address buffer 22a is constituted by four stages, and the address buffer 22a stores "4090", "10", "90" and "10" as an address converted from an index cut out from the compressed data in the past in the decompression device 20 or an address cut out from the compressed data.

Further, in the address buffer 22a, the index is assigned to each address stored in the address buffer 22a. In the example illustrated in FIG. 8, index "0" is assigned to the address "4090", index "1" is assigned to the address "10", index "2" is assigned to the address "90", and index "3" is assigned to the address "10".

In this case, the address to which the index "1" is assigned is searched from the address buffer 22a, and the searched address "10" is output to the selection unit 22c.

The selection unit 22c selects the address "10" output from the address buffer 22a based on the match flag "1" output from the search unit 22b, and outputs the address "10" to the dictionary based decoding unit 24. In the present embodiment, the index can be converted into the address by using the address buffer 22a in this way. Note that when the match flag output from the search unit 22b is "0", the selection unit 22c selects the address output from the search unit 22b.

In addition, the address "10" output from the selection unit 22c is added to the address buffer 22a. In this case, the oldest address "10" among the addresses stored in the address buffer 22a is discarded from the address buffer 22a. Thereby, the address buffer 22a is in the state in which "10", "4090", "10", and "90" are stored, the index "0" is newly assigned to the address "10", the index "1" is newly assigned to the address "4090", the index "2" is newly assigned to the address "10", and the index "3" is newly assigned to the address "90".

As described above, in the present embodiment, the address buffer 22a included in the decompression device 20 (match position decoding unit 22) is managed by the same management method as the address buffer 12a included in the compression device 10 (match position encoding unit 12), and similarly operates to the address buffer 12a. For example, when the address buffer 12a is managed as FIFO, the address buffer 22a is also managed as the FIFO. In addition, when the address buffer 12a is managed as LRU, the address buffer 22a is similarly managed as the LRU. That is, when the data (compressed data) compressed by the compression device 10 is decompressed by the decompression device 20, the address buffer 22a in the decompression device 20 operates to reproduce the state of the address buffer 12a when the compressed data is generated in the compression device 10.

Here, it is assumed in FIG. 8 that the match position information {match flag "1", index "1"} is output from the cutout unit 21, but when the match position information {match flag "0", address} is output from the cutout unit 21, the address is added to the address buffer 22a.

Similarly, the history buffer 24a included in the decompression device 20 (dictionary based decoding unit 24) stores the shaped data shaped by the data shaping unit 24c and the raw data as described above, and the shaped data and the raw data correspond to the input data in the compression device 10. Therefore, the history buffer 24a in the decompression device 20 operates so as to reproduce the state of the history buffer 11c when the compressed data is generated in the compression device 10.

That is, in the present embodiment, the address buffer 22a and the history buffer 24a in the decompression device 20 that sequentially processes the match information and the raw data packed in the compressed data similarly operate to the address buffer 12a and the history buffer 11c in the compression device 10 that sequentially processes the input data (that is, reproduce the state of the address buffer 12a and the history buffer 11c). As a result, the compressed data in the compression device 10 can be appropriately decompressed.

Next, an example of the process procedure of the decompression device 20 according to the present embodiment will be described with reference to the flowchart of FIG. 9. In the present embodiment, the decompression device 20 performs a process (operation) that is a reverse process to the process when the compression device 10 compresses the input data.

First, the cutout unit 21 executes the cutout process on the compressed data input to the decompression device 20 (step S31). As described above, the match information (a set of the match position information and the match length information) and the raw data are sequentially packed in the compressed data (compressed stream), and in step S31, for example, the match information or the raw data packed at the head of the compressed data is cut out.

Hereinafter, it is described in step S31 that the match information is cut out. When the match information is cut out from the compressed data in step S31, the cutout unit 21 separates the match information into the match position information (index or address) and the match length information (encoded match length). Note that whether the match information is cut out or the raw data is cut out in step S31 can be distinguished by the flag attached to the head of the match information and the raw data as described above. The cutout unit 21 outputs the match position information separated from the match information to the match position decoding unit 22, and outputs the match length information separated from the match information to the match length decoding unit 23.

Next, the search unit 22b included in the match position decoding unit 22 determines whether the match flag attached to the match position information output from the cutout unit 21 is "1" (step S32). By the process of step S32, when the match flag is "1", it can be distinguished that the match position information is an index, and when the match flag is "0", it can be determined that the match position information is the address (raw match position).

When it is determined that the match flag is "1" (that is, the match position information is an index) (YES in step S32), the address to which the index is assigned is searched from the address buffer 22a, and the address is output from the selection unit 22c to the dictionary based decoding unit 24 (step S33).

On the other hand, when it is determined that the match flag is not "1" (that is, the match position information is the address) (NO in step S32), the selection unit 22c outputs the address (address of the match position information) to the dictionary based decoding unit 24 (step S34).

When the process of step S33 or S34 is executed, the address buffer 22a is updated (step S35). In this case, the address output from the selection unit 22c in step S33 or S34 is added to the address buffer 22a.

Next, the match length decoding unit 23 decodes the match length information (encoded match length) output from the cutout unit 21 (step S36). The match length decoded in step S36 is output from the match length decoding unit 23 to the dictionary based decoding unit 24.

Figure 9:
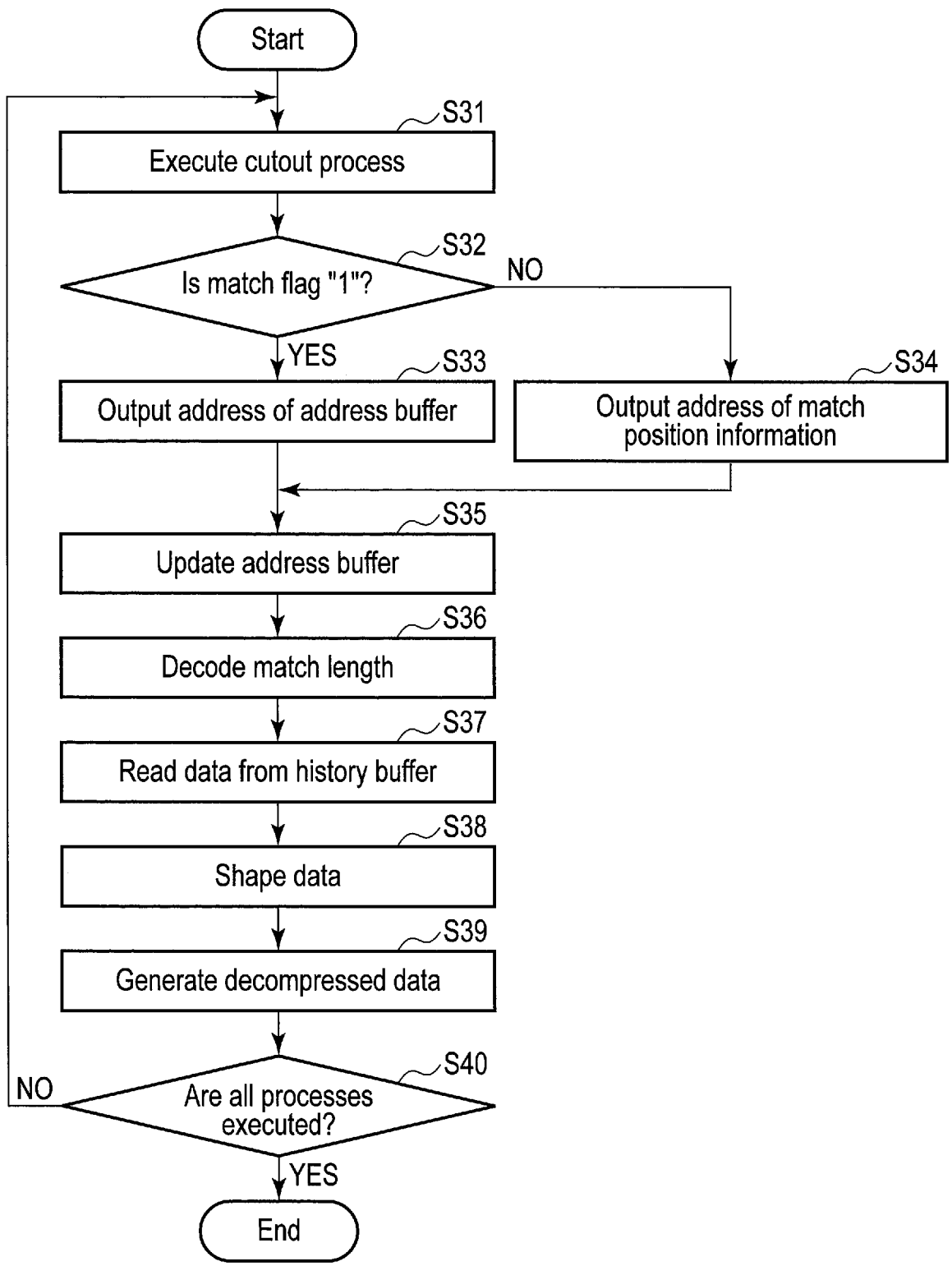
FIG. 9 is a flowchart illustrating an example of a process procedure of the decompression device according to the present embodiment.

Note that in FIG. 9, for convenience, the process of step S36 is illustrated to be executed after the process of step S35 is executed, but the process (process of the match length decoding unit 23) of step S36 may be executed in parallel with the processes of steps S32 to S34 (process of the match position decoding unit 22).

The control unit 24b included in the dictionary based decoding unit 24 reads the buffer data from the history buffer 24a based on the address output in step S33 or S34 (step S37).

The data shaping unit 24c shapes the buffer data read from the history buffer in step S37 based on the match length decoded in step S36 (step S38).

The decompression data generation unit 25 generates decompressed data including the buffer data (shaped data) shaped in step S37 (step S39).

Here, the description has been made under the assumption that the match information is cut out from the compressed data in step S31, but when the raw data is cut out from the compressed data in step S31, the process in step S39 is executed after the process in step S31 is executed. In step S39, the decompressed data including the raw data cut out from the compressed data is generated.

Next, it is determined whether or not the above-described process (decompression process) has been executed on all the match information and the raw data packed in the compressed data (step S40).

When it is determined that the process has not been executed on all the match information and the raw data (NO in step S40), the above-described process returns to step S31 and is repeated.

On the other hand, when it is determined that the process has been executed on all the match information and the raw data (YES in step S40), the process illustrated in FIG. 9 ends.

Note that when the process illustrated in FIG. 9 ends, the decompressed data is output from the decompression device 20. The decompressed data is data generated by executing the process illustrated in FIG. 9 on each of the match information and the raw data packed in the compressed data (compressed stream) as described above. The decompressed data corresponds to data obtained by sequentially combining data generated by decoding the address and the match length as the result of the dictionary based encoding and the raw data.

In addition, although not illustrated in FIG. 9, the buffer data shaped in step S38 and the raw data cut out from the compressed data by the cutout unit 21 are added to the history buffer 24a.

As described above, in the compression device 10 according to the present embodiment, the buffer data (second data) that at least partially matches the input data (first data) is searched from the history buffer 11c (first buffer). The address (first match position) of the buffer data in the history buffer 11c and the match length indicating the matched length of the input data and the buffer data are acquired. In addition, the compression device 10 according to the present embodiment includes the address buffer 12a (second buffer) in which the address (second match position) is stored together with the index assigned to the address. The compression device 10 according to the present embodiment generates the compressed data (first compressed data) including the index assigned to the address and the above-described match length when the address of the buffer data at least partially matching the input data matches the address stored in the address buffer 12a. On the other hand, when the address of the buffer data that at least partially matches the input data does not match the address stored in the address buffer 12a, the compression device 10 according to the present embodiment generates the compressed data (second compressed data) including the address and the above-described match length.

That is, according to the present embodiment, it is possible to realize efficient data compression by further compressing (encoding) the match position (address) output as the result of the dictionary based encoding using the index assigned to the address stored in the address buffer 12a.

Further, the decompression device 20 according to the present embodiment includes the address buffer 22a (second buffer) in which the address (second match position) converted from an index (second index) previously cut out from the compressed data or the address cut out from the compressed data is stored together with an index (third index) assigned to the address. Further, when the index (first index) included in the compressed data matches the index stored in the address buffer 22a, the decompression device 20 according to the present embodiment reads the buffer data (second data) from the history buffer 24a (third buffer) based on the address (second match position) to which the index is assigned. The decompression device 20 generates the decompressed data (first data) by shaping the buffer data based on the match length included in the compressed data.

That is, in the present embodiment, the index included in compressed data can be converted into the address (match position) by referring to the address buffer 22a, and the input data (decompressed data) can be generated based on the address and the match length included in the compressed data. Therefore, the data compressed by the compression device 10 according to the present embodiment can be appropriately decompressed.

Note that in the present embodiment, the data input to the compression device 10 (input data) is mainly described as text data including a character string, but the input data is not limited to the text data. The input data may be other data such as image data, voice data, C code, source data of HTML, log data of a server, and execution binary.

Furthermore, in the present embodiment, the description has been made under the assumption that the match length is encoded (for example, Huffman-encoded). However, the compression device 10 according to the present embodiment may be configured to encode the address used as the match position, and not to encode the match length. When the compression device 10 does not encode the match length, the decompression device 20 according to the present embodiment does not need to decode the match length.

Second Embodiment

Next, a second embodiment will be described. FIG. 10 illustrates an example of a configuration of a compression device according to the present embodiment. In FIG. 10, the same parts as those in FIG. 3 described above are designated by the same reference numerals, and detailed description thereof will be omitted. Here, the differences from FIG. 3 are mainly described.

A compression device 10 according to the present embodiment differs from the above-described first embodiment in that the compression device 10 further includes a Huffman encoding unit (Huffman encoder) 15.

The Huffman encoding unit 15 is provided in a subsequent stage of a match position encoding unit 12, and further performs Huffman encoding on match position information (index or address) output from the match position encoding unit 12. This Huffman encoding may be static Huffman encoding or dynamic Huffman encoding. The Huffman encoding unit 15 outputs the Huffman-encoded match position information.

Note that entropy encoding other than the Huffman encoding may be applied as an encoding method for the match position information.

Here, the index and the address are sequentially output from the match position encoding unit 12 as the match position information, and the Huffman encoding unit 15 performs the Huffman encoding by mixing both the index and the address output from the match position encoding unit 12.

However, the Huffman encoding is an encoding method that assigns a code according to an appearance frequency of each value. For example, there is often a difference between appearance frequencies of an index and an address according to whether the address output from the dictionary based encoding unit 11 is stored in the address buffer 12a. Therefore, the Huffman encoding may be individually (that is, separately) performed on the index and the address.

Figure 11:
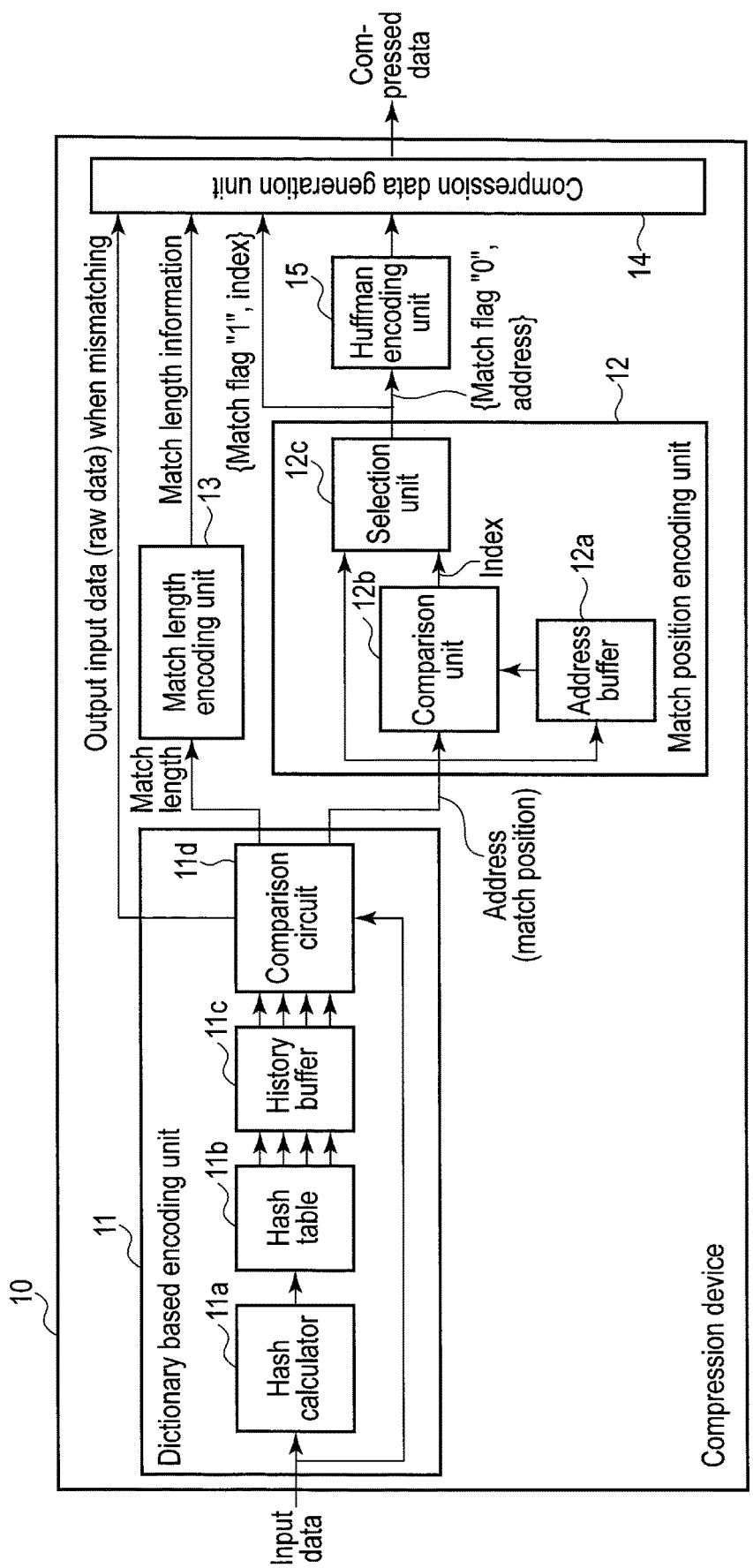
FIG. 11 is a diagram illustrating an example of an operation of a Huffman encoding unit included in the compression device according to the present embodiment.

Furthermore, as described above, the address (for example, 12 bits) generally has a larger amount of data than the index (for example, 2 bits). Therefore, as illustrated in FIG. 11, the Huffman encoding unit 15 may not perform the Huffman encoding when the index (that is, {match flag "1", index}) is output from the match position encoding unit 12, and may perform the Huffman encoding when the address (that is, {match flag "0", address}) is output from the match position encoding unit 12. Although not illustrated, the Huffman encoding unit 15 may perform the encoding process when the index is output from the match position encoding unit 12, and may not perform the encoding process when the address is output from the match position encoding unit 12.

Note that in the present embodiment, a part or all of the Huffman encoding unit 15 illustrated in FIG. 10 may be realized by hardware or realized by software.

Next, an example of the process procedure of the compression device 10 according to the present embodiment will be described with reference to the flowchart of FIG. 12.

First, processes of steps S51 to S60 corresponding to processes of steps S11 to S20 illustrated in FIG. 6 as described above are executed.

Next, the Huffman encoding unit 15 performs Huffman encoding on the output index in step S57 or the output address in step S58 (step S61). The Huffman encoding for the index or the address in step S61 is as described above, and therefore detailed description thereof will be omitted here.

Figure 12:
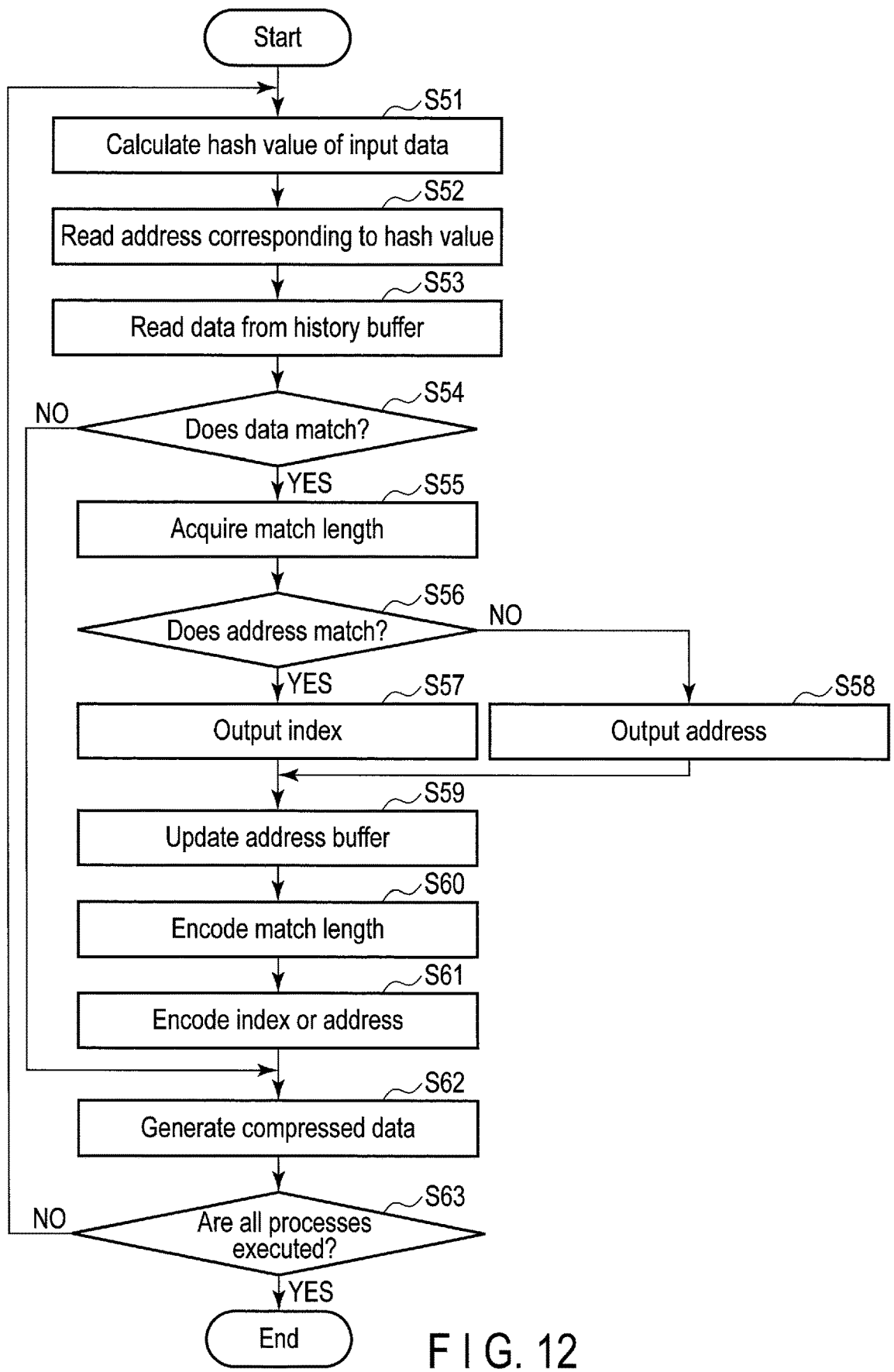
FIG. 12 is a flowchart illustrating an example of a process procedure of the compression device according to the present embodiment.

Note that FIG. 12 illustrates that a process of step S61 is executed when a process of step S57 is executed and when a process of step S58 is executed. However, the process of step S61 may be executed only when the process of step S57 is executed (that is, when the index is output from the match position encoding unit 12), or may be executed only when the process of step S58 is executed (that is, when the address is output from match position encoding unit 12).

In addition, in FIG. 12, for convenience, the process of step S61 is illustrated to be executed after the process of step S60 is executed, but the process of step S61 may be executed at different timing after the process of step S57 or step S58 (for example, timing before step S59 or S60) is executed.

When the process of step S61 is executed, processes of steps S62 and S63 corresponding to the processes of steps S21 and S22 illustrated in FIG. 6 described above are executed. Note that in the process of step S62, the compressed data including, as a match information, the match position information (encoded index or address) output from the Huffman encoding unit 15 and the match length information (encoded match length) output from the match length encoding unit 13 is generated.

FIG. 13 illustrates an example of a configuration of a decompression device according to the present embodiment. In FIG. 13, the same parts as those in FIG. 7 described above are designated by the same reference numerals, and detailed description thereof will be omitted. Here, the differences from FIG. 7 are mainly described.

A decompression device 20 according to the present embodiment differs from the above-described first embodiment in that the decompression device 20 further includes a Huffman decoding unit (Huffman decoder) 26.

Here, the cutout unit 21 included in the decompression device 20 outputs the match position information (index or address) separated from the match information cut out from the compressed data as described in the above-described first embodiment, and the match position information is Huffman-encoded by the Huffman encoding unit 15 included in the compression device 10.

Therefore, the Huffman decoding unit 26 decodes the match position information (Huffman-encoded index or address) output from the cutout unit 21. The match position information decoded by the Huffman decoding unit 26 is output to a match position decoding unit 22.

Note that when only the address is Huffman-encoded in the compression device 10 as described above, the Huffman decoding unit 26 may perform a decoding process only when the address is output as the match position information from the cutout unit 21. Similarly, when only the index is encoded in the compression device 10, the Huffman decoding unit 26 may perform the decoding process only when the index is output as the match position information from the cutout unit 21.

It can be distinguished whether the match position information is the index or the address by a match flag attached to the match position information.

Note that in the present embodiment, a part or all of the Huffman decoding unit 26 illustrated in FIG. 13 may be realized by hardware or realized by software.

Figure 14:
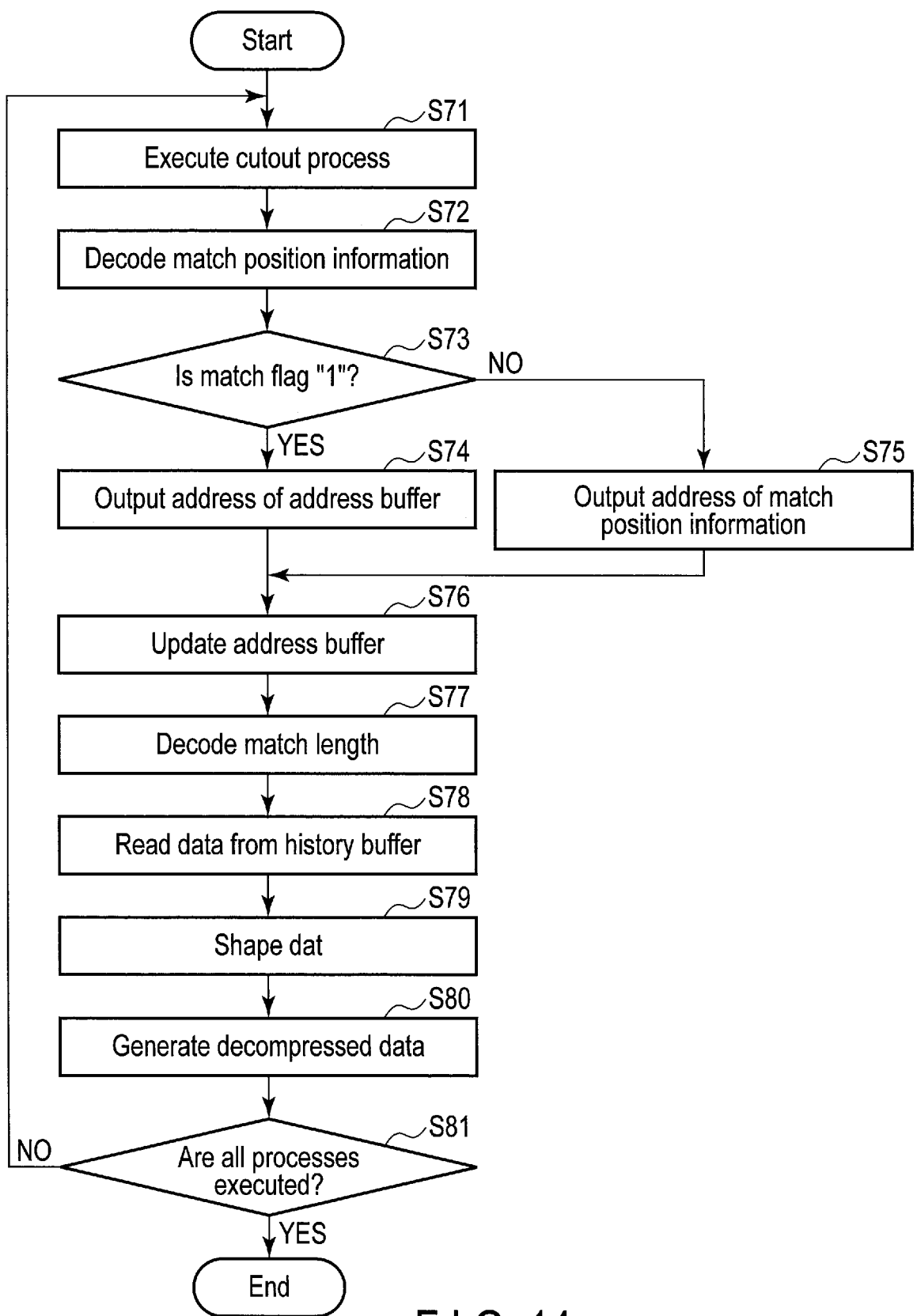
FIG. 14 is a flowchart illustrating an example of a process procedure of the decompression device according to the present embodiment.

Next, an example of the process procedure of the decompression device 20 according to the present embodiment will be described with reference to the flowchart of FIG. 14.

First, a process of step S71 corresponding to the process of steps S31 illustrated in FIG. 9 as described above are executed.

When the match information is cut out in step S71, the cutout unit 21 separates the match information into the match position information and the match length information. In this case, the cutout unit 21 outputs the match position information separated from the match information to the Huffman decoding unit 26. Note that the match length information separated from the match information is output to the match length decoding unit 23.

Here, the match position information output from the cutout unit 21 in the present embodiment is the encoded index or an address. Therefore, the Huffman decoding unit 26 decodes the match position information (encoded index or address) output from the cutout unit 21 (step S72). The match position information decoded in step S72 is output to the match position decoding unit 22.

Note that when the match position information output from the cutout unit 21 is not encoded in the compression device 10, the process of step S72 is omitted.

When the process of step S72 is executed, processes of steps S73 to S81 corresponding to the processes of steps S32 to S40 illustrated in FIG. 9 described above are executed.

The compression device 10 according to the present embodiment as described above further includes the Huffman encoding unit 15 that encodes the index or address output from the match position encoding unit 12, and generates the compressed data including the encoded index or the address. In the present embodiment, with such a configuration, more efficient data compression can be realized as compared with the above-described first embodiment. Note that in the present embodiment, the Huffman encoding unit 15 may be configured to encode both the index and the address, or encode at least one of the index and the address.

Further, the decompression device 20 according to the present embodiment is configured to further include a Huffman decoding unit 26 that decodes the index or the address encoded in the compression device 10, so the data compressed by the compression device 10 according to the present embodiment can be appropriately decompressed.

Third Embodiment

Next, a third embodiment will be described. FIG. 15 illustrates an example of a configuration of a compression device according to the present embodiment. In FIG. 15, the same parts as those in FIG. 3 described above are designated by the same reference numerals, and detailed description thereof will be omitted. Here, the differences from FIG. 3 are mainly described.

A compression device 10 according to the present embodiment differs from the above-described first embodiment in that the compression device 10 performs a parallel process for improving throughput.

In the present embodiment, the compression device 10 executes a process on a plurality of data input in the same cycle (clock cycle). For example, a case is assumed where 8 bytes (8 bytes/cycle) can be input in one cycle and a minimum match length is 4 bytes. In this case, two 4-byte data are input to the compression device 10 in one cycle. Hereinafter, a case will be described where the compression device 10 according to the present embodiment processes two input data in parallel.

In this case, a dictionary based encoding unit 11 includes two hash calculators 11a as illustrated in FIG. 15, and each of the two hash calculators 11a calculates hash values of different input data of the two input data. Thereby, the dictionary based encoding unit 11 outputs two addresses (match positions) corresponding to each input data to a match position encoding unit 12, and outputs two match lengths corresponding to each of the two input data to a match length encoding unit 13. Note that an operation of the dictionary based encoding unit 11 after the hash values are calculated by the two hash calculators 11a is the same as that of the first embodiment described above, and therefore detailed description thereof will be omitted here.

In addition, the match position encoding unit 12 includes two comparison units 12b and two selection units 12c corresponding to each of the comparison units 12b. As a result, the match position encoding unit 12 can process two addresses output from the dictionary based encoding unit 11 in parallel and output match position information (index or address) corresponding to each of the addresses. Note that operations of each of the comparison units 12b and the selection units 12c are the same as those of the first embodiment described above, and therefore detailed description thereof will be omitted here.

Note that in the present embodiment, it is assumed that the number of address buffers 12a included in the match position encoding unit 12 is one. The match position encoding unit 12 can include the same number of address buffers 12a as the number of comparison units 12b, but can be configured to allows two comparison units 12b to share one address buffer 12a to reduce a circuit scale of the compression device 10 (match position encoding unit 12).

In addition, when the match position encoding unit 12 includes one address buffer 12a as described above, for example, only one of the two comparison units 12b may use the address buffer 12a and the other comparison unit 12b may not use the address buffer 12a. In this case, the selection unit 12c corresponding to the comparison unit 12b using the address buffer 12a outputs the index or the address as the match position information, and the selection unit 12c corresponding to the comparison unit 12b not using the address buffer 12a outputs the address as the match position information.

Furthermore, in the present embodiment, the compression device 10 includes two match length encoding units 13. Thereby, the two match lengths output from the dictionary based encoding unit 11 can be processed in parallel, and each of the match lengths can be encoded and output. Note that operations of each of the match length encoding units 13 are the same as those of the first embodiment described above, and therefore detailed description thereof will be omitted here.

Here, the case where two data are input in one cycle has been described, but the number of input data may be N (N is an integer of 2 or more). In this case, the hash calculator 11a, the comparison unit 12b, the selection unit 12c, and the match length encoding unit 13 described above may be prepared according to the number of data input to the compression device 10 (that is, the number of data to be processed in parallel).

Hereinafter, the outline of the operation of the match position encoding unit 12 included in the compression device 10 will be described with reference to FIG. 16. Note that the comparison unit 12b illustrated in an upper portion of the two comparison units 12b illustrated in FIG. 16 is called the first comparison unit 12b, and the comparison unit 12b illustrated in a lower portion thereof is called the second comparison unit 12b. Similarly, a selection unit 12c illustrated in the upper portion of the two selection units 12c illustrated in FIG. 16 (that is, selection unit 12c corresponding to the first comparison unit 12b) is called a first selection unit 12c. Furthermore, a selection unit 12c illustrated in the lower portion of the two selection units 12c illustrated in FIG. 16 (that is, selection unit corresponding to the second comparison unit 12b) is called a second selection unit 12c.

Here, as illustrated in FIG. 16, the address buffer 12a is constituted by four stages, and the address buffer 12a stores addresses "4090", "10", "90", and "10". Furthermore, in the address buffer 12a, index "0" is assigned to the address "4090", index "1" is assigned to the address "10", index "2" is assigned to the address "90", and index "3" is assigned to the address "10".

Here, a case is assumed where the dictionary based encoding unit 11 outputs the address "10" to the first comparison unit 12b and the dictionary based encoding unit 11 outputs the address "320" to the second comparison unit 12b.

First, since the address "10" output from the dictionary based encoding unit 11 to the first comparison unit 12b is stored in the address buffer 12a, the first comparison unit 12b acquires the index "1" assigned to the address "10". The first comparison unit 12b outputs the index "1" with a 1-bit match flag "1" indicating that the address "10" was stored in the address buffer 12a to the first selection unit 12c. In this case, the first selection unit 12c selects the index "1" output from the first comparison unit 12b, and outputs 3-bit information {match flag "1", index "1"} with the 1-bit match flag attached to the index "1".

On the other hand, since the address "320" output from the dictionary based encoding unit 11 to the second comparison unit 12b is not stored in the address buffer 12a, the second comparison unit 12b cannot acquire the index. In this case, the second selection unit 12c outputs 13-bit information {match flag "0", address "320"} with a 1-bit match flag attached to the address "320" (12 bits) output from the dictionary based encoding unit 11. The 1-bit match flag in the 13-bit information indicates that the address "320" is not stored in the address buffer 12a.

Note that the addresses "10" and "320" output from the dictionary based encoding unit 11 are added to the address buffer 12a.

FIG. 17 illustrates an example of a configuration of a decompression device according to the present embodiment. In FIG. 17, the same parts as those in FIG. 7 described above are designated by the same reference numerals, and detailed description thereof will be omitted. Here, the differences from FIG. 7 are mainly described.

A decompression device 20 according to the present embodiment is different from the above-described first embodiment in that a plurality of match information (a set of the match position information and the match length information) cut out from compressed data are processed in parallel.

In the present embodiment, the cutout unit 21 included in the decompression device 20 outputs, for example, two match information cut out from compressed data in the same cycle (clock cycle). In this case, the cutout unit 21 outputs the match position information separated from each of the two pieces of match information to the match position decoding unit 22 and the match length information separated from each of the match information to the match length decoding unit 23.

Here, as illustrated in FIG. 17, the match position decoding unit 22 includes a plurality of search units 22b and a plurality of selection units 22c corresponding to each of the plurality of search units 22b. As a result, the match position decoding unit 22 can process two pieces of match position information output from the cutout unit 21 in parallel and output the address corresponding to each match position information. Note that operations of each of the search units 22b and each of the selection units 22c are the same as those of the first embodiment described above, and therefore detailed description thereof will be omitted here.

Note that the number of address buffers 22a included in the match position decoding unit 22 is one as in the address buffer 12a of the match position encoding unit 12 included in the compression device 10 described above. In the present embodiment, the address output from each of the selection units 22c is added to the address buffer 22a, and the address buffer 22a of the match position decoding unit 22 needs to reproduce the state of the address buffer 12a of the match position encoding unit 12 included in the compression device 10 according to the present embodiment. Therefore, the match position decoding unit 22 needs to manage the addresses stored in the address buffer 12a so that the same address as the match position encoding unit 12 included in the compression device 10 is taken in and discarded.

Furthermore, in the present embodiment, the compression device 10 includes two match length decoding units 23. Thereby, the two pieces of match length information (encoded match length) output from cutout unit 21 can be processed in parallel, and each of the encoded match lengths can be decoded and output. Note that operations of each of the match length decoding units 23 are the same as those of the first embodiment described above, and therefore detailed description thereof will be omitted here.

In the present embodiment, for example, two set of the address and the match length are input to the dictionary based decoding unit 24, and the dictionary based decoding unit 24 operates to shape the buffer data for each set. Since the operation itself of the dictionary based decoding unit 24 is the same as that of the above-described first embodiment, detailed description thereof is omitted here.

Here, the case where the two pieces of match information are output from the cutout unit 21 in one cycle has been described, but the number of pieces of match information may be N. In this case, the search unit 22b, the selection unit 22c, and the match length decoding unit 23 described above may be prepared according to the number of match information output from the cutout unit 21 (that is, the number of data to be processed in parallel).

Further, since the decompression device 20 operates according to the compression device 10 described above, the number of match information output in one cycle in the decompression device 20 (cutout unit 21) needs to match the number of input data input in one cycle in the compression device 10.

Hereinafter, the outline of the operation of the match position decoding unit 22 included in the decompression device 20 will be described with reference to FIG. 18. Note that the search unit 22b illustrated in an upper portion of the two search units 22b illustrated in FIG. 18 is called a first search unit 22b, and the search unit 22b illustrated in the lower portion thereof is called a second search unit 22b. Similarly, a selection unit 22c illustrated in an upper portion of the two selection units 22c illustrated in FIG. 18 (that is, selection unit 22c corresponding to the first search unit 22b) is called a first selection unit 22c. Furthermore, a selection unit 22c illustrated in a lower portion of the two selection units 22c illustrated in FIG. 18 (that is, selection unit 22c corresponding to the second search unit 22b) is called a second selection unit 22c.

First, a case is assumed where the index "1" with the match flag "1" (that is, {match flag "1", index "1"}) and the address "320" with the match flag "0" (that is, {match flag "0", address "320"}) as the two pieces of match position information from the cutout unit 21 are output.

In this case, the first search unit 22b distinguishes that the match position information is the index based on the match flag "1". In addition, the first search unit 22b outputs the match flag "1" to the first selection unit 22c.

Here, as an example illustrated in FIG. 18, the address buffer 22a is constituted by four stages, and the address buffer 22a stores addresses "4090", "10", "90", and "10". Furthermore, in the address buffer 22a, index "0" is assigned to the address "4090", index "1" is assigned to the address "10", index "2" is assigned to the address "90", and index "3" is assigned to the address "10".

In this case, since the match position information output from the cutout unit 21 to the first search unit 22b is the index "1", the address to which the index "1" is assigned is searched from the address buffer 22a, and the searched address "10" is output to the first selection unit 22c.

The first selection unit 22c selects the address "10" output from the address buffer 22a based on the match flag "1" output from the first search unit 22b, and outputs the address "10" to the dictionary based decoding unit 24. Note that the address "10" output from the first selection unit 22c is added to the address buffer 22a.

On the other hand, the second search unit 22b distinguishes that the match position information is the address based on the match flag "0". In addition, the second search unit 22b outputs the match flag "0" to the second selection unit 22c.

Here, the match position information output from the cutout unit 21 to the second search unit 22b is the address "320", and the address "320" is not stored in the address buffer 22a. Therefore, the second search unit 22b outputs the address "320" to the second selection unit 22c.

The second selection unit 22c selects the address "320" output from the second search unit 22b based on the match flag "0" output from the second search unit 22b, and outputs the address "320" to the dictionary based decoding unit 24. Note that the address "320" output from the second selection unit 22c is added to the address buffer 22a.

As described above, in the compression device 10 according to the present embodiment, the dictionary based encoding unit 11 is configured to output (acquire) the address and the match length corresponding to each of the N data (input data) input in the same cycle. The match position encoding unit 12 includes N comparison units 12b that compare each of the addresses with the addresses stored in the address buffer 12a. In the present embodiment, with such a configuration, it is possible to process N input data in parallel in the same cycle, and as a result, it is possible to improve throughput when compressing data in the compression device 10.

Furthermore, in the match position encoding unit 12 included in the compression device 10 according to the present embodiment, the N comparison units 12b is configured to share one address buffer 12a, and as a result, the circuit scale of the match position encoding unit 12 can be reduced.

In addition, in the decompression device 20 according to the present embodiment, the match position decoding unit 22 includes N search units 22b that search, from the address buffer 22a, the N match position information (index) cut out from the compressed data. Thereby, it is possible to improve the throughput when decompressing the data compressed by the compression device 10 according to the present embodiment.

Furthermore, in the match position decoding unit 22 included in the decompression device 20 according to the present embodiment, the N search units 22b is configured to share one address buffer 22a. Thereby, the circuit scale of the match position decoding unit 22 can be reduced.

Fourth Embodiment

Figure 19:
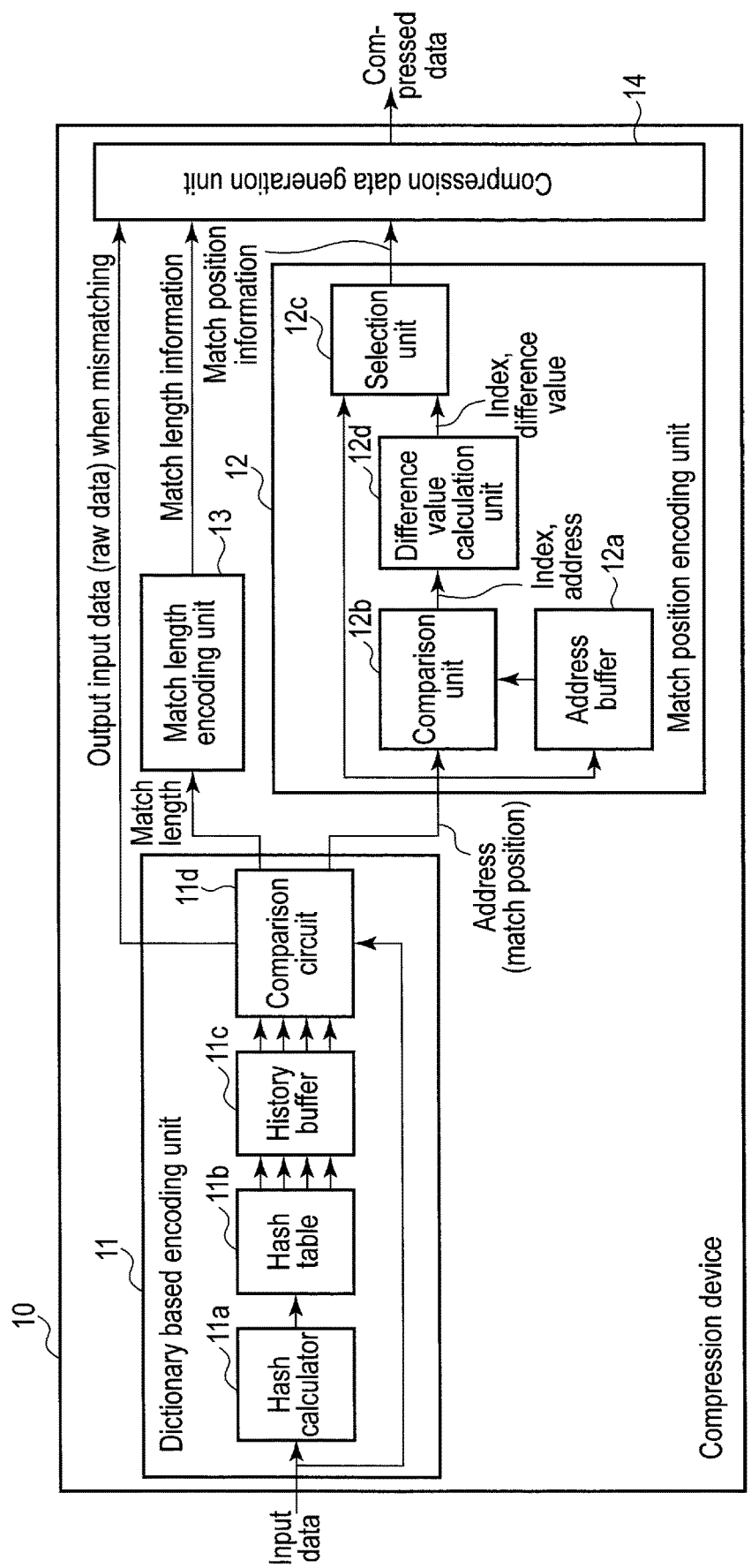
FIG. 19 is a diagram illustrating an example of a configuration of a compression device according to a fourth embodiment.

Next, a fourth embodiment will be described. FIG. 19 illustrates an example of a configuration of a compression device according to the present embodiment. In FIG. 19, the same parts as those in FIG. 3 described above are designated by the same reference numerals, and detailed description thereof will be omitted. Here, the differences from FIG. 3 are mainly described.

A compression device 10 according to the present embodiment differs from the above-described first embodiment in that a match position encoding unit 12 further includes a difference value calculation unit (difference value calculator) 12d.

Here, the comparison unit 12b included in the match position encoding unit 12 compares the address output from the dictionary based encoding unit 11 with the address stored in the address buffer 12a. In the present embodiment, a case is assumed where the same address as the address output from the dictionary based encoding unit 11 is not stored in the address buffer 12a.

In this case, the comparison unit 12b searches for the address having the closest value to the address output from the dictionary based encoding unit 11 of the addresses stored in the address buffer 12a. The comparison unit 12b outputs the index assigned to the address searched from the address buffer 12a, the address output from the dictionary based encoding unit 11, and the address searched from the address buffer 12a to the difference value calculation unit 12d.

The difference value calculation unit 12d calculates the difference value between the two addresses output from the comparison unit 12b (the address output from the dictionary based encoding unit 11 and the address searched from the address buffer 12a). The difference value calculated by the difference value calculation unit 12d is output to the selection unit 12c together with the index output from the comparison unit 12b.

Next, the selection unit 12c selects and outputs one of the index output from the comparison unit 12b and the address output from the dictionary based encoding unit 11.

Specifically, the selection unit 12c compares the data amount of the address output from the dictionary based encoding unit 11 with the data amount of the index and the difference value output from the comparison unit 12b. When the data amount of the index and the difference value is smaller than that of the address, the selection unit 12c selects the index and the difference value. In this case, the selection unit 12c outputs the index and the difference value.

On the other hand, the selection unit 12c selects an address when the data amount of the address output from the dictionary based encoding unit 11 is smaller than that of the index and the difference value output from the comparison unit 12b. In this case, the selection unit 12c outputs the address.

Hereinafter, the outline of the operation of the match position encoding unit 12 included in the compression device 10 will be described with reference to FIG. 20.

Figure 20:
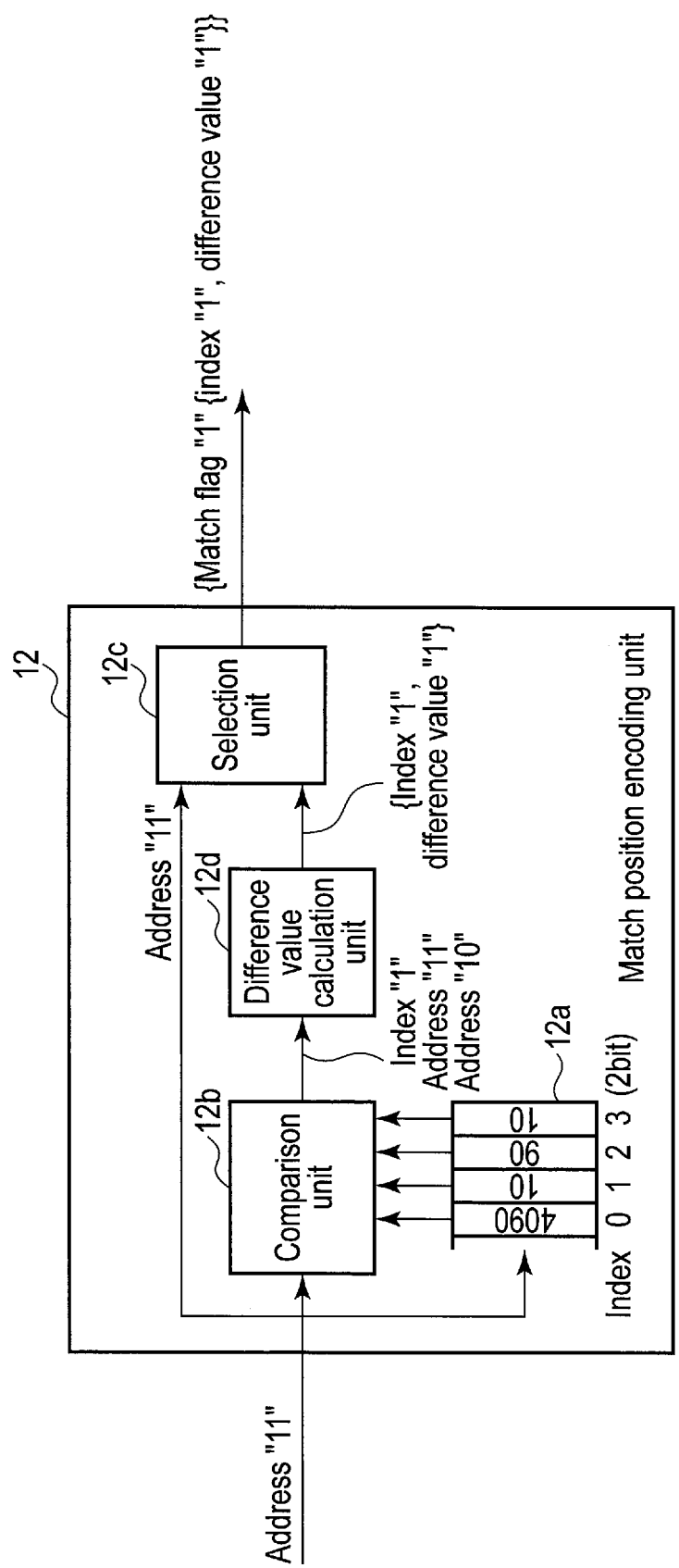
FIG. 20 is a diagram for explaining an outline of an operation of a match position encoding unit included in the compression device according to the present embodiment.

Here, as illustrated in FIG. 20, the address buffer 12a is constituted by four stages, and the address buffer 12a stores addresses "4090", "10", "90", and "10". Furthermore, in the address buffer 12a, index "0" is assigned to the address "4090", index "1" is assigned to the address "10", index "2" is assigned to the address "90", and index "3" is assigned to the address "10".

Here, it is assumed that the address "11" is output from the dictionary based encoding unit 11 to the first comparison unit 12b. In this case, since the address "11" is not stored in the address buffer 12a, the comparison unit 12b searches for the address "10" having the closest value to the address "11". As a result, the comparison unit 12b acquires the index "1" assigned to the address "10". The comparison unit 12b outputs the acquired index "1", the address "11" output from the dictionary based encoding unit 11, and the address "10" searched from the address buffer 12a (that is, the address to which the index "1" is assigned in the address buffer 12a).

The difference value calculation unit 12d calculates the difference value "1" between the address "11" output from the dictionary based encoding unit 11 and the address "10" searched from the address buffer 12a, and outputs the index "1" output from the comparison unit 12b and the calculated difference value "1" (that is, {index "1", difference value "1"}).

Next, the selection unit 12c selects and outputs one of the address "11" output from the dictionary based encoding unit 11 and {index "1" and difference value "1"} output from the difference value calculation unit 12d.

Although detailed description is omitted, when {index "1" and difference value "1"} are selected by the selection unit 12c, the selection unit 12c outputs the index and the difference value with the match flag "1" (that is, {match flag "1", {index "1", difference value "1"}}).

Note that in the first embodiment described above, the index with the match flag is included in the compressed data (packed in the compressed stream) as the match position information, but in the present embodiment, the index with the match flag and the difference value are included in the compressed data as the match position information.

In addition, in the present embodiment, the difference value is stored in a predetermined bit width. Specifically, for example, when the difference value is stored in 9 bits, the difference value can be a value from −256 to 256. When the difference value does not fall within −256 to 256, the difference value cannot be used and the selection unit 12c may select the address (the address output from the dictionary based encoding unit 11).

Figure 21:
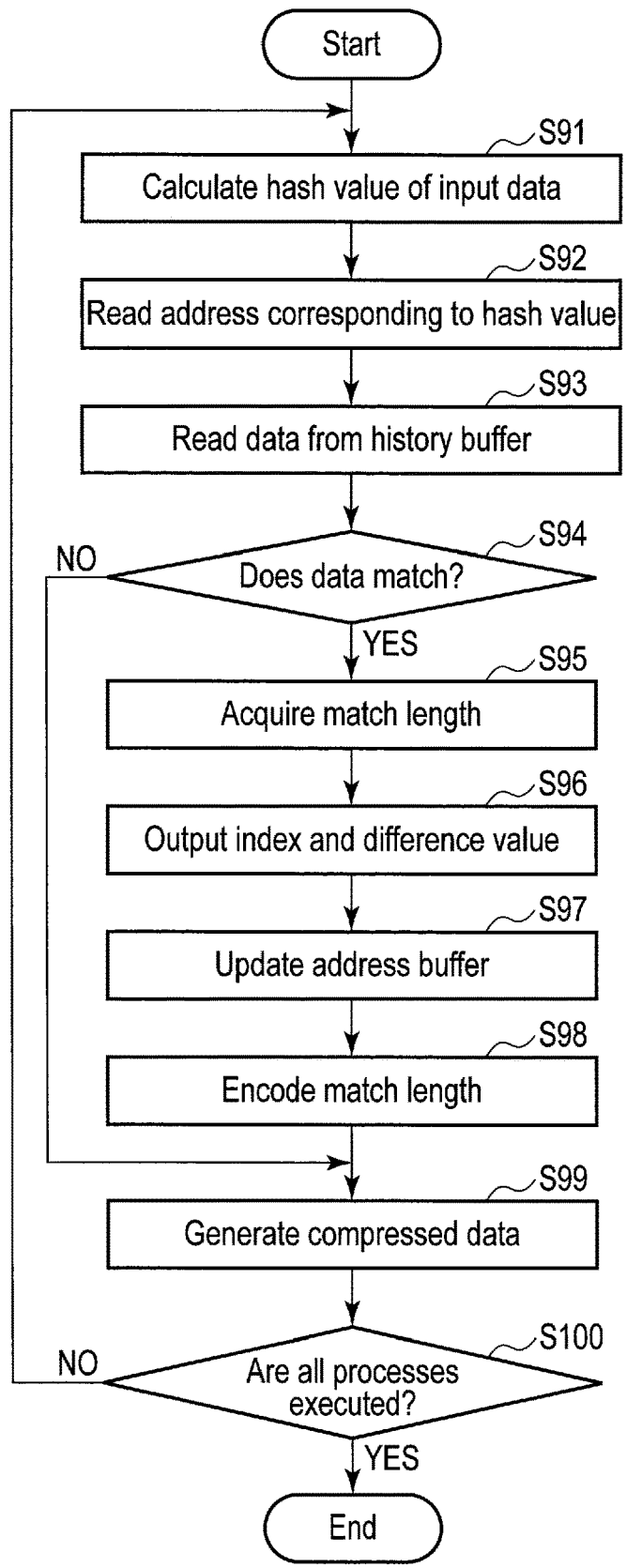
FIG. 21 is a flowchart illustrating an example of a process procedure of the compression device according to the present embodiment.

Next, an example of the process procedure of the compression device 10 according to the present embodiment will be described with reference to the flowchart of FIG. 21.

First, processes of steps S91 to S95 corresponding to the processes of steps S11 to S15 illustrated in FIG. 6 as described above are executed.

Next, the selection unit 12c outputs the index and the difference value (step S96). Next, the index output from the selection unit 12c in step S96 is the index assigned to the address closest to the address output from the dictionary based encoding unit 11 among the addresses stored in the address buffer 12a. In addition, the difference value output from the selection unit 12c in step S96 is the difference value between the address output from the dictionary based encoding unit 11 and the address closest to the address output from the dictionary based encoding unit 11 among the addresses stored in the address buffer 12a.

Note that when the address output from the dictionary based encoding unit 11 matches the address stored in the address buffer 12a, the selection unit 12c outputs the index assigned to the address and the difference value "0".

When the process of step S96 is executed, the processes of steps S97 to S100 corresponding to the processes of steps S19 to S22 are executed.

Note that when the difference value described above cannot be stored in a predetermined bit width, the process of step S18 illustrated in FIG. 6 may be executed.

FIG. 22 illustrates an example of a configuration of a decompression device according to the present embodiment. In FIG. 22, the same parts as those in FIG. 7 described above are designated by the same reference numerals, and detailed description thereof will be omitted. Here, the differences from FIG. 7 are mainly described.

The decompression device 20 according to the present embodiment differs from the above-described first embodiment in that the match position decoding unit 22 further includes a difference value addition unit (difference value adder) 22d.

Here, the cutout unit 21 included in the decompression device 20 outputs the match position information separated from the match information cut out from the compressed data to the match position decoding unit 22 as described in the first embodiment as described above. In the present embodiment, the match position information includes the index and the difference value as described above.

In this case, the address assigned with the index included in the match position information output from the cutout unit 21 to the search unit 22b is searched from the address buffer 22a, and the searched address is output to the difference value addition unit 22d. Further, the search unit 22b outputs the difference value included in the match position information output from the cutout unit 21 to the difference value addition unit 22d.

The difference value addition unit 22d adds the difference value output from the search unit 22b to the address searched from the address buffer 22a. The value after the difference value is added by the difference value addition unit 22d in this way corresponds to the address (match position) output from the dictionary based encoding unit 11 as the result of the dictionary based encoding in the compression device 10, and is output to the selection unit 22c.

Hereinafter, the outline of the operation of the match position decoding unit 22 included in the decompression device 20 according to the present embodiment will be described with reference to FIG. 23.

First, a case is assumed where the index "1" and the difference value "1" with the match flag "1" (that is, {match flag "1", {index "1", difference value "1"}}) are output as the match position information from the cutout unit 21.

In this case, the search unit 22b included in the match position decoding unit 22 distinguishes that the match position information is the index (and difference value) based on the match flag "1". In this case, the search unit 22b outputs the difference value to the difference value addition unit 22d and also outputs the match flag "1" to the selection unit 22c.

Figure 23:
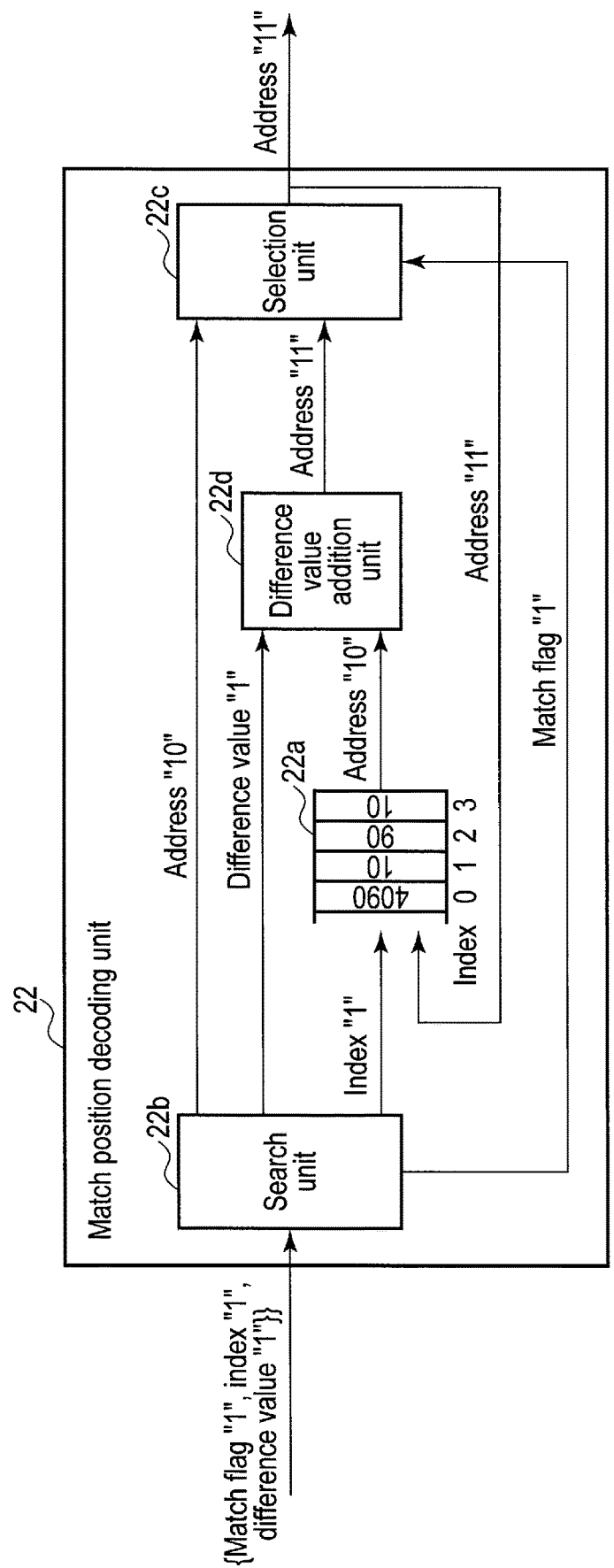
FIG. 23 is a diagram for explaining an outline of an operation of a match position decoding unit included in the decompression device according to the present embodiment.

Here, as an example illustrated in FIG. 23, the address buffer 22a is constituted by four stages, and the address buffer 22a stores addresses "4090", "10", "90", and "10". Furthermore, in the address buffer 22a, index "0" is assigned to the address "4090", index "1" is assigned to the address "10", index "2" is assigned to the address "90", and index "3" is assigned to the address "10".

In this case, since the match position information output from the cutout unit 21 as described above is the index "1", the address to which the index "1" is assigned is searched from the address buffer 22*a*, and the searched address "10" is output to the difference value addition unit 22*d*.

The difference value addition unit 22*d* acquires the address "11" by adding the difference value "1" output from the search unit 22*b* to the address "10" output from the address buffer 22*a*. The address "11" obtained by the difference value addition unit 22*d* is output to the selection unit 22*c*.

The selection unit 22*c* selects the address "11" output from the difference value addition unit 22*d* based on the match flag "1" output from the search unit 22*b*, and outputs the address "11" to the dictionary based decoding unit 24. In addition, the address "11" output from the selection unit 22*c* is added to the address buffer 22*a*.

Figure 24:
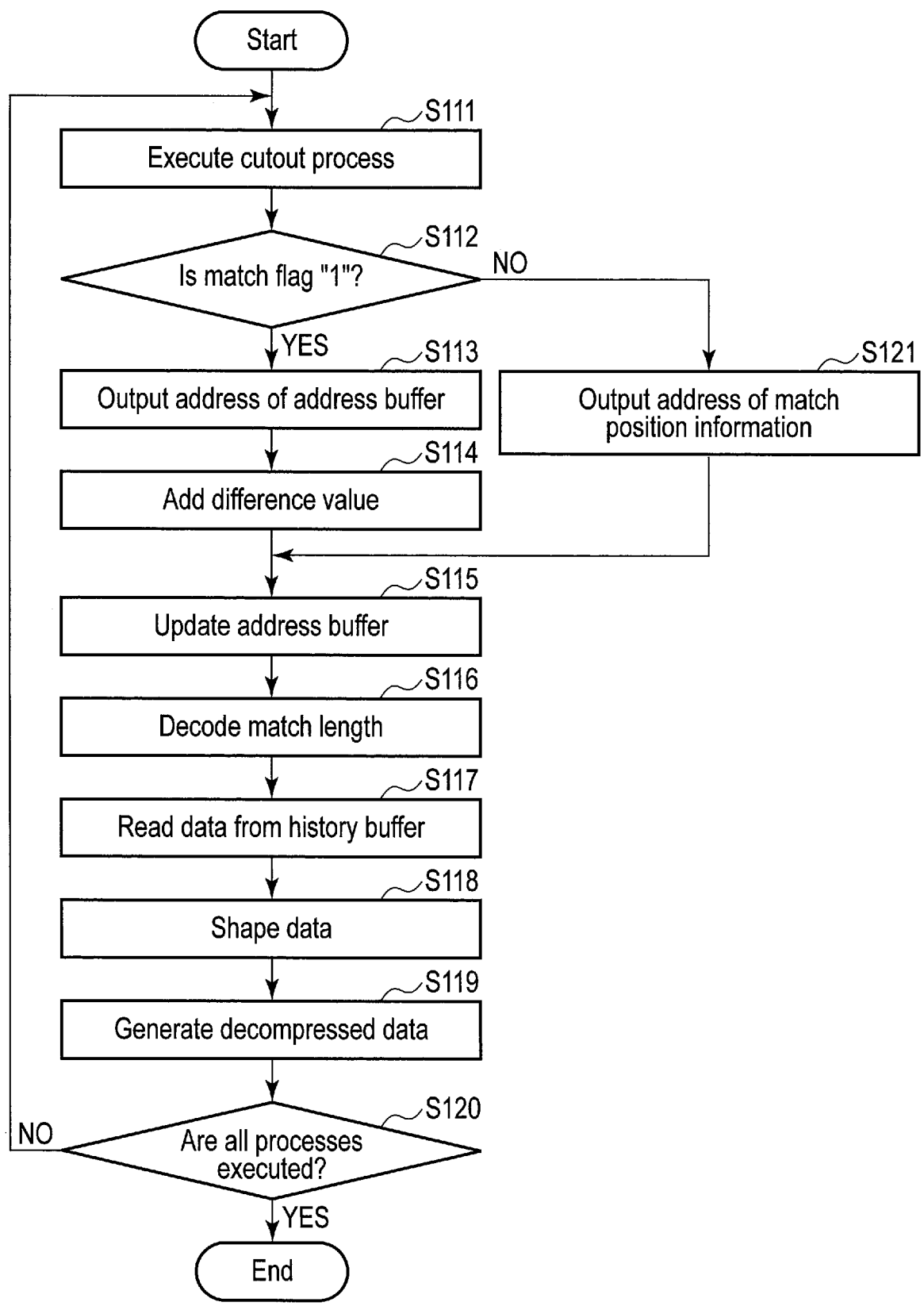
FIG. 24 is a flowchart illustrating an example of a process procedure of the decompression device according to the present embodiment.

Next, an example of the process procedure of the decompression device 20 according to the present embodiment will be described with reference to the flowchart of FIG. 24.

First, processes of step S111 and S112 corresponding to the processes of steps S31 and S32 illustrated in FIG. 9 described above are executed.

When it is determined in step S112 that the match flag is "1" (that is, the match position information is an index) (YES in step S112), the address to which the index is assigned is searched from the address buffer 22*a*, and the searched address is output to the difference value addition unit 22*d* (step S113).

When the process of step S113 is executed, the difference value addition unit 22*d* adds the difference value output from the cutout unit 21 as the match position information to the address output in step S113 (step S114). As a result, the difference value addition unit 22*d* acquires a value obtained by adding the difference value to the address output in step S113 as an address (value). The address acquired by the difference value addition unit 22*d* in this way is output to the dictionary based decoding unit 24 via the selection unit 22*c*.

When the process of step S114 is executed, processes of steps S115 to S120 corresponding to the processes of steps S34 to S39 illustrated in FIG. 9 are executed.

Further, when it is determined in step S112 that the match flag is not "1" (that is, the match flag is "0") (NO in step S112), the process in step S121 corresponding to the process in step S34 illustrated in FIG. 9 is executed. After the process of step S121 is executed, the processes after step S115 are executed.

Note that when the difference value output from the cutout unit 21 as the match position information is 0, the address searched from the address buffer 22*a* may be output to the dictionary based decoding unit 24 via the selection unit 22*c*.

As described above, the compression device 10 according to the present embodiment is configured to generate the compressed data including the index assigned to the address searched from the address buffer 12*a* and the difference value between the address output from the dictionary based encoding unit 11 and the address searched from the address buffer 12*a*. Thereby, the compression device 10 can improve a compression rate of the input data even when the address output from the dictionary based encoding unit 11 is not stored in the address buffer 12*a*.

Furthermore, the decompression device 20 according to the present embodiment is configured to acquire an address by adding the difference value included in the compressed data to the address to which the index included in the compressed data is assigned in the address buffer 22*a* (that is, convert the index and the difference value into the address). Thereby, the decompression device 20 can appropriately decompress the data compressed by the compression device 10 according to the present embodiment.

Fifth Embodiment

Next, a fifth embodiment will be described. In the above-described first to fourth embodiments, the configuration in which the address (match position) output from the dictionary based encoding unit is further encoded by using the address buffer has been described. However, the present embodiment differs from the first to fourth embodiments in that the address output from the dictionary based encoding unit is encoded without using the address buffer.

Here, FIG. 25 illustrates an example of the operation of the dictionary based encoding unit. The outline of the operation of the dictionary based encoding unit is as described in FIG. 4 above, so a detailed explanation is omitted here. As illustrated in FIG. 25, when input data (encoding target character string) is "abcdefga", a hash value "H (abcd)" is calculated from the input data "abcdefga", and an address "Dist (abcd)" stored in the hash table in association with the hash value "H (abcd)" is acquired.

Next, assuming that when "abcdefgfbcd" is acquired as buffer data from a history buffer based on "Dist (abcd)", input data "abcdefga" is compared with the buffer data "abcdefgfbcd". Thereby, address (match position) "Dist (abcd)" and match length "7" are output as a result of the dictionary based encoding.

Furthermore, the portion "abcdefg" where the input data match the buffer data is newly registered in the history buffer.

Note that in the history buffer, the address of the buffer data stored in the history buffer is updated by adding new data as described above. Therefore, when "abcdefg" is newly added to the history buffer as illustrated in FIG. 25, for example, the "Dist (abcd)" stored in the hash table in association with the hash value "H (abcd)" is shifted by 7 bytes (7 characters) of the added "abcdefg" and updated to "Dist (abcd)+7".

Next, a case where the input data next to the input data "abcdefga" described in FIG. 25 is "abcdxyzw" will be descried with reference to FIG. 26.

Even in the case, the hash value "H (abcd)" is calculated from the input data "abcdxyzw", and the address stored in the hash table in association with the hash value "H (abcd)" is acquired. The address acquired here is the address "Dist (abcd)+7" updated by newly registering the above-described "abcdefg" in the history buffer.

In this case, "abcdefgfbcd" is acquired as buffer data from the history buffer based on the address "Dist (abcd)+7", and the address (match position) "Dist (abcd)+7" and match length "4" are output as the result of the dictionary based encoding.

Here, in order to further improve the encoding efficiency in the compression device 10, it is considered to perform the Huffman encoding on each of the address and the match length output as a result of the above-described dictionary based encoding. However, since the address stored in the hash table in association with the hash value changes each time data is input (that is, the input data is processed), the same address (match position) is not output even when the hash value calculated from the input data is the same as described in FIGS. 25 and 26. Thereby, variations occur in the address output as the result of the dictionary based encoding. Since the Huffman encoding is an encoding method that assigns a code according to an appearance frequency of a value (here, an address and a match length), the above-described variation of the address reduces the encoding efficiency in the Huffman encoding.

Therefore, the compression device according to the present embodiment has a configuration for efficiently performing the Huffman encoding on the result of the above-described dictionary based encoding (match position).

FIG. 27 is a diagram illustrating an example of the configuration of the compression device according to the present embodiment. In FIG. 27, the same parts as those in FIG. 3 described above are designated by the same reference numerals, and detailed description thereof will be omitted. Here, the differences from FIG. 3 are mainly described.

As illustrated in FIG. 27, the compression device 10 includes a Huffman encoding unit (Huffman encoder) 16 in addition to the dictionary based encoding unit 11 described in the above-described first embodiment and the like.

Here, in the above-described first embodiment and the like, the dictionary based encoding unit 11 (comparison circuit 11d included therein) is described as outputting the address (and match length), but in the present embodiment, the dictionary based encoding unit 11 outputs the hash value of the input data calculated by the hash calculator 11a instead of the address.

Note that when the hash value calculated by the hash calculator 11a is not stored in the hash table 11b, the dictionary based encoding unit 11 (comparison circuit 11d included therein) outputs the input data.

The Huffman encoding unit 16 performs the Huffman encoding on the hash value, the match length, and the input data, respectively, that are output from the dictionary based encoding unit 11. Note that the Huffman encoding in the present embodiment may also be the static Huffman encoding or may also be the dynamic Huffman encoding.

The set of the hash value and the match length which are Huffman-encoded by the Huffman encoding unit 16 is output to the compression data generation unit 14 as the match information. Similarly, the input data (hereinafter, referred to as encoding data) Huffman-encoded by the Huffman encoding unit 16 is output to the compression data generation unit 14. The match information and the encoding data output from the Huffman encoding unit 16 are packed in the compressed stream in the compression data generation unit 14 and output as the compressed data.

Note that in the present embodiment, a part or all of the Huffman encoding unit 16 illustrated in FIG. 27 may be realized by hardware or realized by software.

Here, FIGS. 28 and 29 are diagrams for comparing the operation of the dictionary based encoding unit 11 included in the compression device 10 according to the present embodiment with the operation of the dictionary based encoding unit described in FIGS. 25 and 26 described above.

Although detailed description is omitted, when the input data is "abcdefga", in the present embodiment, the hash value "H (abcd)" is output instead of the address "Dist (abcd)" as illustrated in FIG. 28.

On the other hand, when next input data of the "abcdefga" is "abcdxyzw", in the present embodiment, the hash value "H (abcd)" is output instead of the address "Dist (abcd)+7" as illustrated in FIG. 29.

According to the examples illustrated in FIGS. 28 and 29 described above, the same hash value can be output regardless of the change in the address (address stored in the hash table 11b) of the history buffer 11c described above, and therefore, the higher compression efficiency can be achieved by the Huffman encoding of the subsequent stage.

Although it is described that only the address of one history buffer 11c is stored in the hash table 11b in association with one hash value (hash address), the address stored in the history buffer 11c in association with one hash value does not have to be one. In this case, the hash table 11b may be managed as a table having depths for each hash value. Specifically, it is assumed that the depth of the hash table 11b is 1, for example, in the state where the address "Dist (abcd)" is registered in association with the hash value "H (abcd)". In this case, when a hash collision occurs (that is, the same hash value "H (xyzw)" as the hash value "H (abcd)" is calculated from different input data), the address "Dist (xyzw)" associated with the hash value "H (abcd) (=H (xyzw))" is stored in the hash table 11b. As a result, the situation that the address "Dist (abcd)" is expelled from the hash table 11b may occur. On the other hand, by setting the depth of the hash table 11b to 2, both the addresses "Dist (abcd)" and "Dist (xyzw)" associated with the same hash value "H (abcd) (=H (xyzw))" can be stored in the hash table 11b.

When the hash table 11b is managed to have a depth as described above, the hash value and depth information (Depth) will be output from the dictionary based encoding unit 11. In this case, the hash value and the depth information may be Huffman-encoded together and may be Huffman-encoded separately.

Although details of updating the hash table are omitted, an algorithm of updating the hash table may be a complicated one that is performed in consideration of an appearance frequency of the hash value and the like.

In addition, the present embodiment describes as performing the Huffman encoding on the hash value, the match length, and the input data output from the dictionary based encoding unit 11, but as the encoding method for the hash value, the match length, and the input data, other entropy encoding such as arithmetic encoding may be used.

Next, an example of the process procedure of the compression device 10 according to the present embodiment will be described with reference to the flowchart of FIG. 30.

First, processes of steps S131 to S135 corresponding to the processes of steps S11 to S15 illustrated in FIG. 6 as described above are executed.

Next, the Huffman encoding unit 16 performs the Huffman-encoding on the hash value of the input data calculated in step S131 and the match length acquired in step S135 (step S136). The hash value and the match length Huffman-encoded in step S136 are output from the Huffman encoding unit 16 to the compression data generation unit 14.

On the other hand, when it is determined in step S134 that the input data does not at least partially match the buffer data (NO in step S134), the Huffman encoding unit 16 performs Huffman encoding on the input data (step S137). The input data Huffman-encoded in step S137 is output from the Huffman encoding unit 16 to the compression data generation unit 14.

Although not illustrated in FIG. 30, the process of step S137 is executed even when the hash value of the input data is not stored in the hash table 11b.

The compression data generation unit 14 generates the compressed data by packing a set of the hash value and the match length Huffman-encoded in step S136 (match information) or the input data Huffman-encoded in step S137 (encoding data) in the compressed stream (step S138).

When the process of step S138 is executed, a process of step S139 corresponding to the process of step S22 illustrated in FIG. 6 as described above are executed.

When the process illustrated in FIG. 30 as described above is completed, the compressed data is output from compression device 10. The compressed data corresponds to the compressed stream in which the match information (a set of the encoded hash value and match length) and the encoding data (encoded input data) corresponding to each data continuously input to the compression device 10 are sequentially packed.

FIG. 31 illustrates an example of a configuration of a decompression device 20 according to the present embodiment. In FIG. 31, the same parts as those in FIG. 7 described above are designated by the same reference numerals, and detailed description thereof will be omitted. Here, the differences from FIG. 7 are mainly described.

As illustrated in FIG. 31, the decompression device 20 includes a Huffman decoding unit (Huffman decoder) 27, a hash table 28, and a hash calculator 29 in addition to the cutout unit 21, the dictionary based decoding unit 24, and the decompression data generation unit 25 described in the first embodiment described above.

In the present embodiment, the cutout unit 21 sequentially cuts out the match information and the encoding data from the compressed data, and outputs the match information and the encoding data to the Huffman decoding unit 27.

When the match information (hash value and match length Huffman-encoded) is output from the cutout unit 21, the Huffman decoding unit 27 decodes the hash value and the match length. The hash value and the match length decoded by the Huffman decoding unit 27 are output to the hash table 28.

On the other hand, when the encoding data is output from the cutout unit 21, the Huffman decoding unit 27 decodes the encoding data. The data decoded by the Huffman decoding unit 27 (hereinafter, referred to as raw data) is output to the decompression data generation unit 25.

The hash value calculated from at least a part of the buffer data stored in the history buffer 24*a* included in the dictionary based decoding unit 24 and the address of the buffer data in the history buffer 24*a* are stored in the hash table 28 in association with each other.

In this case, the hash value decoded by the Huffman decoding unit 27 is converted into the address stored in the hash table 28 in association with the hash value, and the address is output from the hash table 28 to the dictionary based decoding unit 24 together with the match length.

The dictionary based decoding unit 24 is as described in the above-described first embodiment, and therefore detailed description thereof is omitted here.

The decompression data generation unit 25 generates decompressed data including the shaped data output from the data shaping unit 24*c* and the raw data output from the Huffman decoding unit 27.

Here, the decompression data generation unit 25 adds the shaped data output from the data shaping unit 24*c* and the raw data output from the Huffman decoding unit 27 (hereinafter, referred to as decoded data) to the history buffer 24*a* via the control unit 24*b*, and the decoded data is also output to the hash calculator 29.

When the decompression data generation unit 25 outputs the decoded data to the hash calculator 29, the hash calculator 29 calculates the hash value of the decoded data from at least a part of the decoded data. The hash value of the decoded data calculated by the hash calculator 29 is registered in the hash table 28 in association with the address of the decoded data in the history buffer 24*a*.

Thereby, the state of the hash table 11*b* when the compressed data is generated by the compression device 10 can be reproduced in the hash table 28 included in the decompression device 20.

Note that in the present embodiment, a part or all of the Huffman decoding unit 27 and the hash calculator 29 illustrated in FIG. 31 may be realized by hardware or realized by software.

Next, an example of the process procedure of the decompression device 20 according to the present embodiment will be described with reference to the flowchart of FIG. 32.

First, the cutout unit 21 executes the cutout process on the compressed data input to the decompression device 20 (step S141). As described above, the match information (a set of the hash value and the match length Huffman-encoded) and the encoding data are sequentially packed in the compressed data (compressed stream), and in step S141, for example, the match information or the encoding data packed at the head of the compressed data are cut out.

Next, the Huffman decoding unit 27 decodes the match information or the encoding data cut out in step S141 (step S142).

Here, when the match information is cut out in step S141, the Huffman decoding unit 27 can acquire the hash value and the match length by executing the process of step S142. On the other hand, when the encoding data is cut out in step S141, the Huffman decoding unit 27 can acquire the raw data by executing the process of step S142.

In this case, it is determined whether the Huffman decoding unit 27 acquires the hash value and the match length (step S143). In step S143, it is possible to determine whether or not to acquire the hash value and the match length by referring to the flag attached to the match information or the encoding data cut out in step S141, for example.

When it is determined that the hash value and the match length are acquired (YES in step S143), the hash value and the match length are output from the Huffman decoding unit 27 to the hash table 28. In this case, the hash value output from the Huffman decoding unit 27 is converted into the address stored in the hash table 28 in association with the hash value (step S144). In this way, the address converted from the hash value using the hash table 28 and the match length output from the Huffman decoding unit 27 are output from the hash table 28 to the dictionary based decoding unit 24.

Hereinafter, processes of steps S145 to S147 corresponding to the processes of steps S37 to S39 illustrated in FIG. 9 as described above are executed.

Here, when the process of step S147 is executed, the buffer data shaped in step S146 (shaped data) is stored in the history buffer 24*a*, so the history buffer 24*a* is updated (step S148).

In this case, the hash calculator 29 calculates the above-described hash value of the shaped data (step S149).

The hash value of the shaped data calculated in step S149 and the address of the shaped data in the history buffer 24*a* are registered in the hash table 28. As a result, the hash table 28 is updated (step S150).

When the process of step S150 is executed, a process of step S151 corresponding to the process of step S40 illustrated in FIG. 9 as described above is executed.

When it is determined in step S143 that the hash value and the match length are not acquired (that is, raw data is acquired), the raw data is output from the Huffman decoding unit 27 to the decompression data generation unit 25, and processes after step S147 are executed.

In this case, the raw data is stored in the history buffer 24*a* in step S148. In addition, the hash value of the raw data is calculated in step S149, and the hash value of the raw data and the address of the raw data in the history buffer 24*a* are registered in the hash table 28 in step S150.

As described above, the compression device 10 according to the present embodiment calculates the hash value (first hash value) of the input data from at least a part of the input data (first data). The compression device 10 searches for the buffer data that at least partially matches the input data from the history buffer 11c based on the address stored in the hash table 11b in association with a hash value (second hash value) that matches the hash value of the input data (second data). The compression device 10 acquires the match length indicating the matched length of the input data and the buffer data. Further, the compression device 10 performs encoding (for example, Huffman encoding) on the hash value of the input data and the acquired match length, and generates the compressed data including the encoded hash value and match length.

In the compression device 10 according to the present embodiment, with the configuration described above, since the hash value that does not depend on the change in address in the history buffer 11c is used as the match position in the dictionary based encoding, the higher compression efficiency can be achieved in the encoding for the match position.

Further, the decompression device 20 according to the present embodiment decodes the encoded hash value (first hash value) and match length included in the compressed data. The decompression device 20 reads the buffer data (second data) from the history buffer 24a based on the address stored in the hash table 28 in association with the hash value (second hash value) that matches the decoded hash value. The decompression device 20 generates the decompressed data (first data) by shaping the buffer data based on the decoded match length.

According to the decompression device 20 according to the present embodiment, it is possible to appropriately decompress the compressed data (encoded hash value and match length included therein) generated in the compression device 10 according to the present embodiment.

Sixth Embodiment

Next, a sixth embodiment will be described. FIG. 33 illustrates an example of a configuration of a compression device according to the present embodiment. In FIG. 33, the same parts as those in FIG. 27 described above are designated by the same reference numerals, and detailed description thereof will be omitted. Here, parts different from FIG. 27 are mainly described.

Although a dictionary based encoding unit 11 is described as outputting the hash value and the match length in the fifth embodiment described above, the present embodiment differs from the fifth embodiment in that an address stored in a hash table 11b in association with a hash value is output from the dictionary based encoding unit 11 in addition to the hash value and the match length.

When the hash value of the input data is not stored in the hash table 11b or when the input data does not at least partially match the buffer data read from a history buffer 11c, similar to the above-described fifth embodiment, the input data is output from the dictionary based encoding unit 11.

Here, in the present embodiment, a compression device 10 further includes a symbol buffer 17 in which the hash value, the address, the match length, and the input data previously output from the dictionary based encoding unit 11 are stored.

When the hash value, the address, and the match length are output from the dictionary based encoding unit 11, a Huffman encoding unit 16 refers to the past hash value, the address, the match length, and the input data stored in the symbol buffer 17 and selects one of the hash value and the address output from the dictionary based encoding unit 11. Specifically, the Huffman encoding unit 16 counts the frequency of the hash value, the address, the match length, and the input data stored in the symbol buffer 17, and calculates an average code length (past average code length) of the hash value and the address output from the dictionary based encoding unit 11 based on the frequency. Thereby, the Huffman encoding unit 16 can select one of the hash value and the address having the shorter average code length.

When the hash value is selected by the Huffman encoding unit 16, the Huffman encoding unit 16 performs the Huffman encoding on the hash value and the match length output from the dictionary based encoding unit 11, and outputs a set of the Huffman-encoded hash value and match length to a compression data generation unit 14 as match information.

On the other hand, when the address is selected by the Huffman encoding unit 16, the Huffman encoding unit 16 performs the Huffman encoding on the address and the match length output from the dictionary based encoding unit 11, and outputs a set of the Huffman-encoded address and match length to the compression data generation unit 14 as the match information.

Here, when the decompression device 20 decompresses the compressed data, it is necessary to distinguish whether the hash value is encoded or the address is encoded in the match information included in the compressed data. Therefore, a 1-bit identification code (flag) indicating that the hash value is encoded or the address is encoded is added to a head of the match information included in the compressed data.

Next, an example of a process procedure of a compression device 10 according to the present embodiment will be described with reference to the flowchart of FIG. 34.

First, processes of steps S161 to S165 corresponding to the processes of steps S131 to S135 illustrated in FIG. 30 as described above are executed.

Here, when the process of step S165 is executed, the dictionary based encoding unit 11 outputs the hash value calculated in step S161, the address read from the hash table 11b in step S162, and the match length acquired in step S165 to the Huffman encoding unit 16.

Next, the Huffman encoding unit 16 selects the hash value or the address output from the dictionary based encoding unit 11 as a target of Huffman encoding. Since this selection processing is as described above, detailed description thereof will be omitted here. In this case, one of the hash value and the address is selected from the viewpoint of whether or not the compression efficiency can be further improved by referring to the symbol buffer 17 described above, for example.

Next, it is determined whether or not the hash value is selected by the Huffman encoding unit 16 (step S166).

When it is determined that the hash value is selected (YES in step S166), the Huffman encoding unit 16 performs the Huffman encoding on the hash value calculated in step S161 and the match length acquired in step S165 (step S167). In this case, the Huffman encoding unit 16 outputs, to the compression data generation unit 14, information indicating that the hash value is selected (hereinafter, selection information) together with the encoded hash value and match length.

On the other hand, when it is determined that the hash value is not selected (that is, the address is selected) (NO in step S166), the Huffman encoding unit 16 performs the Huffman encoding on the address read from the hash table 11b in step S162 and the match length acquired in step S165

(step S168). In this case, the Huffman encoding unit 16 outputs, to the compression data generation unit 14, selection information indicating that the address is selected together with the encoded address and match length.

When the process of step S167 or S168 is executed, the compression data generation unit 14 generates the compressed data by packing, as the match information, a set of the hash value and the match length Huffman encoded in step S167 or a set of the address and the match length Huffman encoded in step S168 in the compressed stream (step S169). The match information included in the compressed data is provided with an identification code (that is, a flag indicating that the hash value or the address is encoded in the match information) corresponding to the selection information output from the Huffman encoding unit 16 described above.

When the process of step S169 is executed, a process of step S170 corresponding to the process of step S139 illustrated in FIG. 30 as described above is executed.

When it is determined in step S164 that the input data does not at least partially match the buffer data (NO in step S164), the process of step S171 corresponding to the process of step S137 illustrated in FIG. 30 described above is executed. After the process of step S171 is executed, the process of step S169 is executed.

Figure 35:
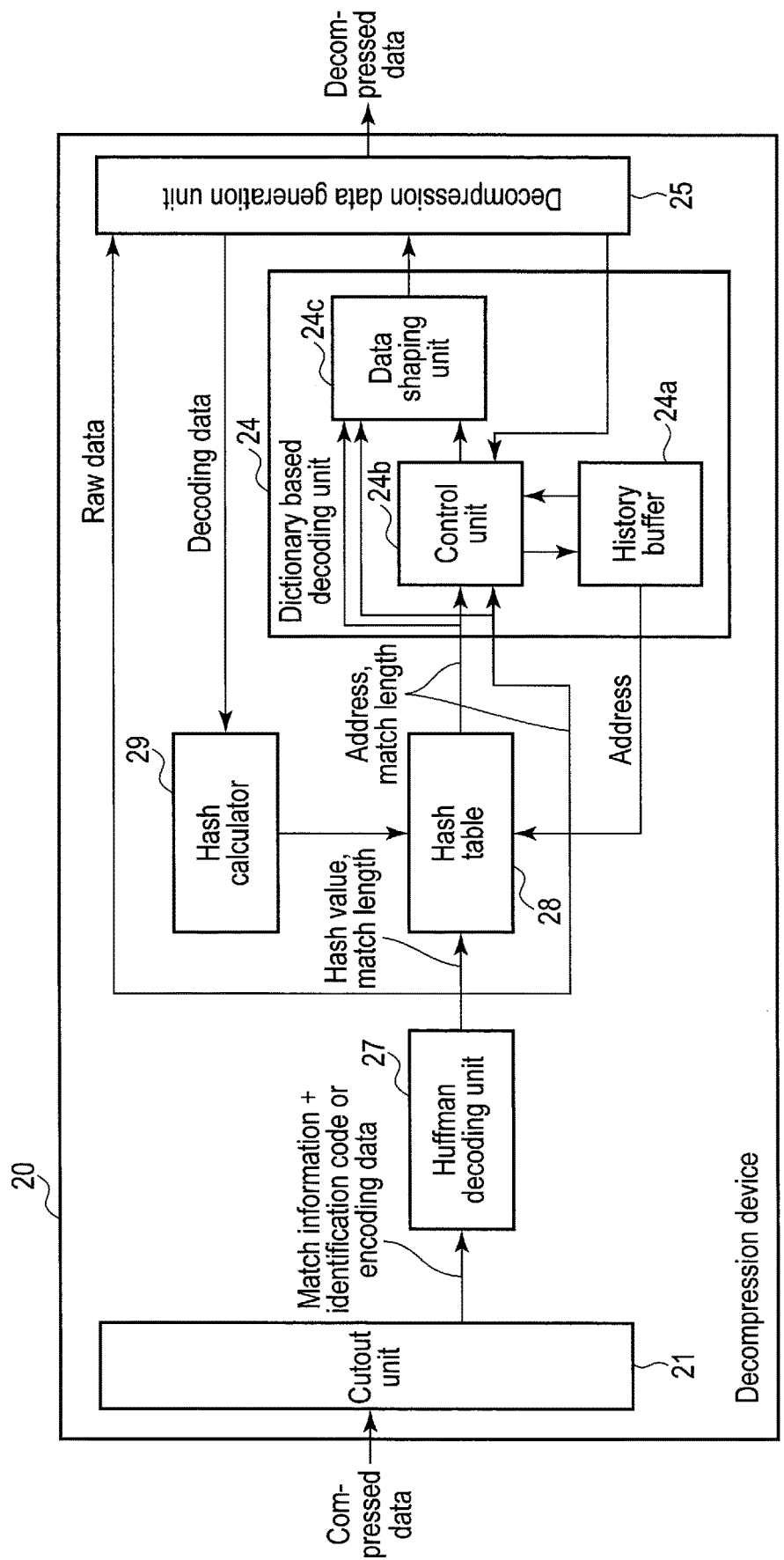
FIG. 35 is a diagram illustrating an example of a configuration of a decompression device according to the present embodiment.

FIG. 35 illustrates an example of a configuration of a decompression device according to the present embodiment. In FIG. 35, the same parts as those in FIG. 31 described above are designated by the same reference numerals, and detailed description thereof will be omitted. Here, parts different from FIG. 31 are mainly described.

A cutout unit 21 sequentially cuts out the match information and the encoding data from the compressed data, in which the match information is attached with the identification code as described above.

Thereby, when the match information is cut out from cutout unit 21, the Huffman decoding unit 27 can identify whether the hash value or the address is encoded in the match information based on the identification code attached to the match information.

Specifically, when the identification code attached to the match information cut out from the cutout unit 21 indicates that the hash value is encoded, the Huffman decoding unit 27 decodes the match information to obtain the hash value and the match length. In this case, the Huffman decoding unit 27 outputs the acquired hash value and match length to the hash table 28.

On the other hand, when the identification code attached to the match information cut out from the cutout unit 21 indicates that the address is encoded, the Huffman decoding unit 27 decodes the match information to obtain the address and the match length. In this case, since it is not necessary to convert the hash value into the address, the Huffman decoding unit 27 outputs the acquired address and match length to the dictionary based decoding unit 24 (control unit 24*b* included therein).

When the encoding data is decoded by the Huffman decoding unit 27, the decoded data (raw data) is output from the Huffman decoding unit 27 to the decompression data generation unit 25 as in the fifth embodiment described above.

Next, an example of the process procedure of the decompression device 20 according to the present embodiment will be described with reference to the flowchart of FIG. 36.

Figure 32:
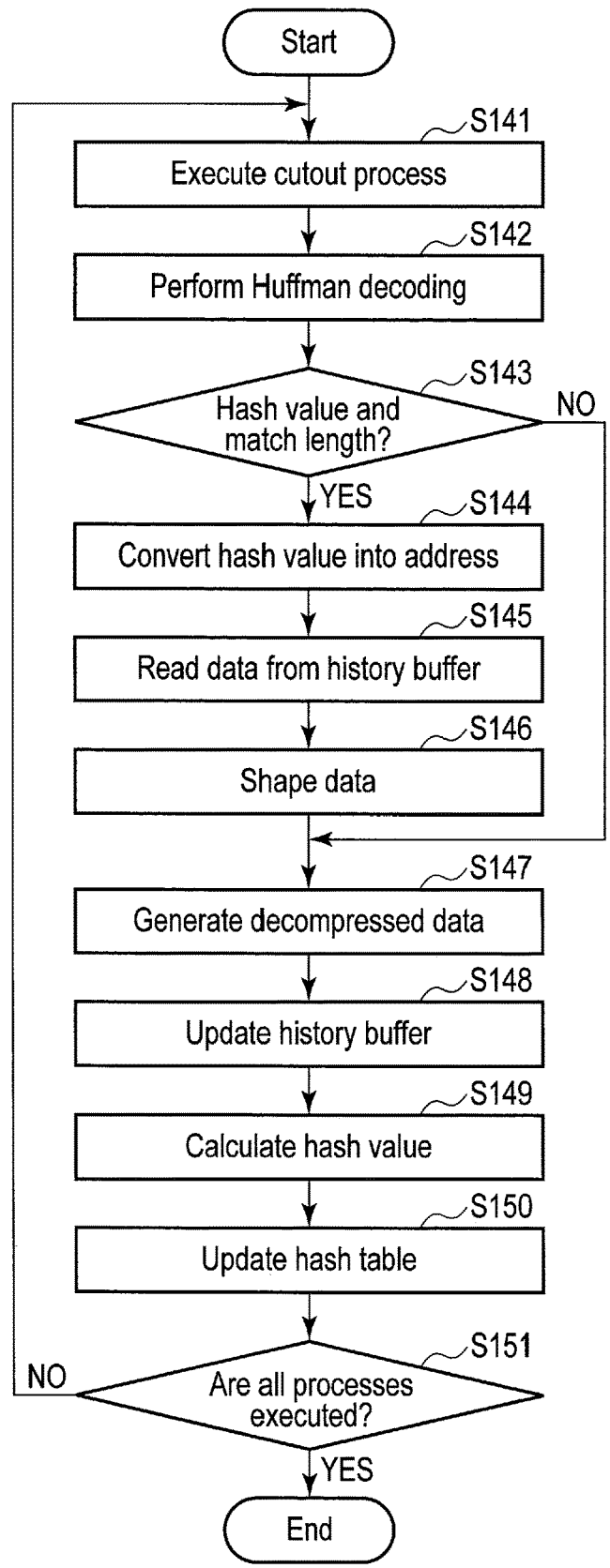
FIG. 32 is a flowchart illustrating an example of a process procedure of the decompression device according to the present embodiment.

First, processes of step S181 and S182 corresponding to the processes of steps S141 and S142 illustrated in FIG. 32 described above are executed.

Next, the Huffman decoding unit 27 determines whether the hash value and the match length are acquired by executing the process of step S182 based on the identification code attached to the match information cut out in step S181, for example (step S183).

When it is determined that the hash value and the match length are acquired (YES in step S183), the hash value and the match length are output from the Huffman decoding unit 27 to the hash table 28, and processes of steps S184 to S191 corresponding to the processes of steps S144 to S151 illustrated in FIG. 32 described above are executed.

On the other hand, when it is determined that the hash value and the match length are not acquired (NO in step S183), it is determined whether the address and the match length are acquired by executing the process of step S183 based on the identification code attached to the match information cut out in step S181 (step S192).

When it is determined that the address and the match length are acquired (YES in step S191), the address and the match length are output to the dictionary based decoding unit 24, and the processes after step S185 are executed.

Here, when the encoding data is cut out in step S181, the above-described identification code is not attached to the encoding data, and the Huffman decoding unit 27 executes the process of step S182, and as a result, can distinguish whether the raw data (decoded data) is acquired. In this case, it is determined in step S192 that the address and the match length are not acquired (NO in step S192), the raw data is output from the Huffman decoding unit 27 to the decompression data generation unit 25, and then the processes after step S187 are executed.

As described above, the compression device 10 according to the present embodiment is configured to select one of the hash value of the input data and the address stored in the hash table 11*b* in association with the hash value based on, for example, the past average code length and encode the selected one. Thereby, the compression 10 can further improve the compression efficiency as compared to the above-described fifth embodiment.

In addition, in the compression device 10 according to the present embodiment, since the identification code indicating that the hash value is selected or the address is selected is added to the compressed data (match information), the decompression device 20 according to the present embodiment can appropriately decompress the compressed data generated by the compression device 10 based on the identification code.

Although the present embodiment has been described as selecting the hash value or the address having a shorter average code length, for example, the compression device 10 may be configured to distinguish the attribute of the file by reading the number Kbytes of input data, and select the hash value or the address according to the attribute. Furthermore, for example, the match information output from the Huffman encoding unit 16 may be evaluated during a specific period, and the hash value or the address may be selected based on the evaluation result.

In addition, the present embodiment has been described as attaching the 1-bit identification code to the head of the match information, but the identification code may be collectively attached to the header of the compressed stream, or may be attached to the head of the compressed block including a plurality of match information. Specifically, for example, the 1-bit identification code is attached to every 1 Kbyte, and when the identification code is 1, it indicates that the hash value is encoded in 1 Kbyte data, and when the identification code is 0, it indicates that the address is encoded in 1 Kbyte data. With such a configuration, the overhead can be reduced. Furthermore, the identification code itself may be further compressed (encoded).

Seventh Embodiment

Next, a seventh embodiment will be described. FIG. 37 illustrates an example of a configuration of a compression device according to the present embodiment. In FIG. 37, the same parts as those in FIG. 27 described above are designated by the same reference numerals, and detailed description thereof will be omitted. Here, parts different from FIG. 27 are mainly described.

The above-described fifth embodiment has described that the dictionary based encoding unit 11 outputs the hash value and the match length, but the present embodiment outputs the hash value, the address, and the match length from the dictionary based encoding unit 11 as in the sixth embodiment.

In this case, the Huffman encoding unit 16 selects one of the hash value and the address output from the dictionary based encoding unit 11 as in the sixth embodiment described above. However, the present embodiment differs from the sixth embodiment in that the hash value and the address are selected based on instruction information (encoding target instruction information) input from the outside (for example, host and the like) of the compression device 10.

In the present embodiment, the instruction information input to the compression device 10 is information for instructing the compression device 10 (Huffman encoding unit 16) to select a hash value or an address, and it may be automatically determined on the host side or may be previously established whether to select the hash value or select the address.

Figure 38:
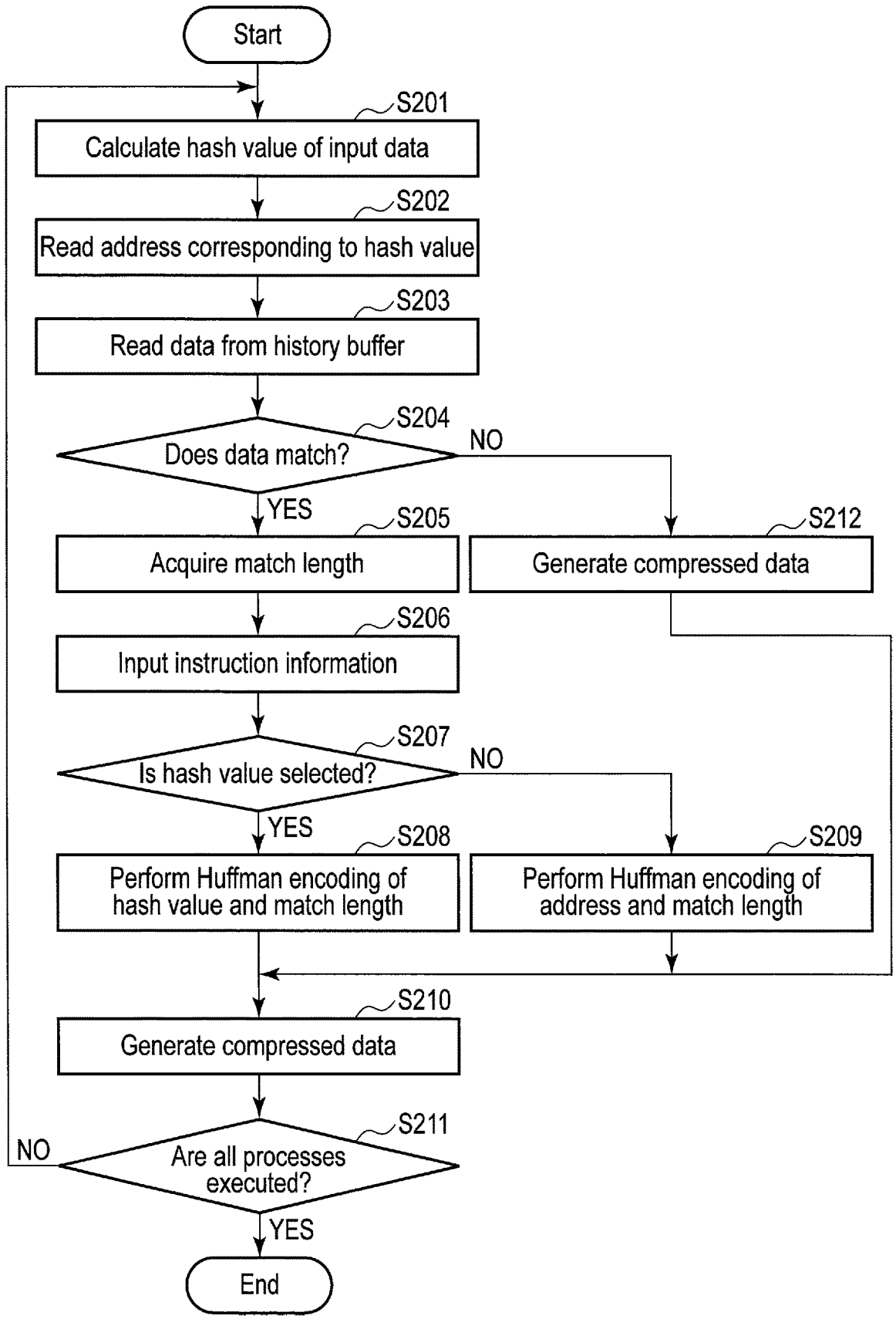
FIG. 38 is a flowchart illustrating an example of a process procedure of the compression device according to the present embodiment.

Next, an example of a process procedure of a compression device 10 according to the present embodiment will be described with reference to the flowchart of FIG. 38.

First, processes of steps S201 to S205 corresponding to the processes of steps S161 to S165 illustrated in FIG. 34 as described above are executed.

Next, the Huffman encoding unit 16 inputs the instruction information from outside the compression device 10 (step S206).

It is determined whether or not to select the hash value (step S207) based on the instruction information input in step S206 (that is, an instruction from the outside). When the instruction information input in step S206 is an instruction to select a hash value, it is determined in step S207 that the hash value is selected. On the other hand, when the instruction information input in step S206 is an instruction to select the address, it is determined in step S207 that the hash value is not selected (that is, the address is selected).

When it is determined that the hash value is selected (YES in step S207), processes of steps S208, S210 and S211 corresponding to the processes of steps S167, S169 and S170 illustrated in FIG. 34 described above are executed.

On the other hand, when it is determined that the hash value is not selected (NO in step S207), the process of step S209 corresponding to the process of step S168 illustrated in FIG. 34 as described above is executed. After the process of step S209 is executed, the process of step S210 is executed.

When it is determined in step S204 that the input data does not at least partially match the buffer data (NO in step S204), the process of step S212 corresponding to the process of step S171 illustrated in FIG. 34 as described above is executed. After the process of step S212 is executed, the process of step S210 is executed.

Here, in the sixth embodiment described above, the description was given under the assumption that the identification code is attached to the head of the match information included in the compressed data (packed in the compressed stream). However, in the present embodiment, there is no need to attach the identification code to the head of the match information.

FIG. 39 illustrates an example of a configuration of a decompression device according to the present embodiment. In FIG. 39, the same parts as those in FIG. 31 described above are designated by the same reference numerals, and detailed description thereof will be omitted. Here, parts different from FIG. 31 are mainly described.

A cutout unit 21 sequentially cuts out the match information and the encoding data from the compressed data, and in the match information, the hash value or the address is Huffman-encoded.

When the cutout unit 21 cuts out the match information, the match information is decoded by a Huffman decoding unit 27 and it is necessary to identify whether the hash value is encoded or the address is encoded in the match information.

In this case, in the present embodiment, it is identified based on the instruction information (decoding target instruction information) input from the outside (for example, host and the like) of the decompression device 20 whether the hash value is encoded or the address is encoded in the above match information. That is, in the above-described sixth embodiment, the identification code attached to the match information is used to identify whether the hash value is encoded or the address is encoded in the match information. However, the present embodiment differs from the sixth embodiment in that the instruction information input from the outside of the decompression device 20 is used for identification.

In the present embodiment, the instruction information input to the decompression device 20 is information for instructing the decompression device 20 (Huffman decoding unit 27) that the hash value is encoded or the address is encoded in the match information, and needs to correspond to the instruction information input to the compression device 10 as described above. The instruction information input to the compression device 10 and the decompression device 20 may be managed by the host, for example.

Figure 40:
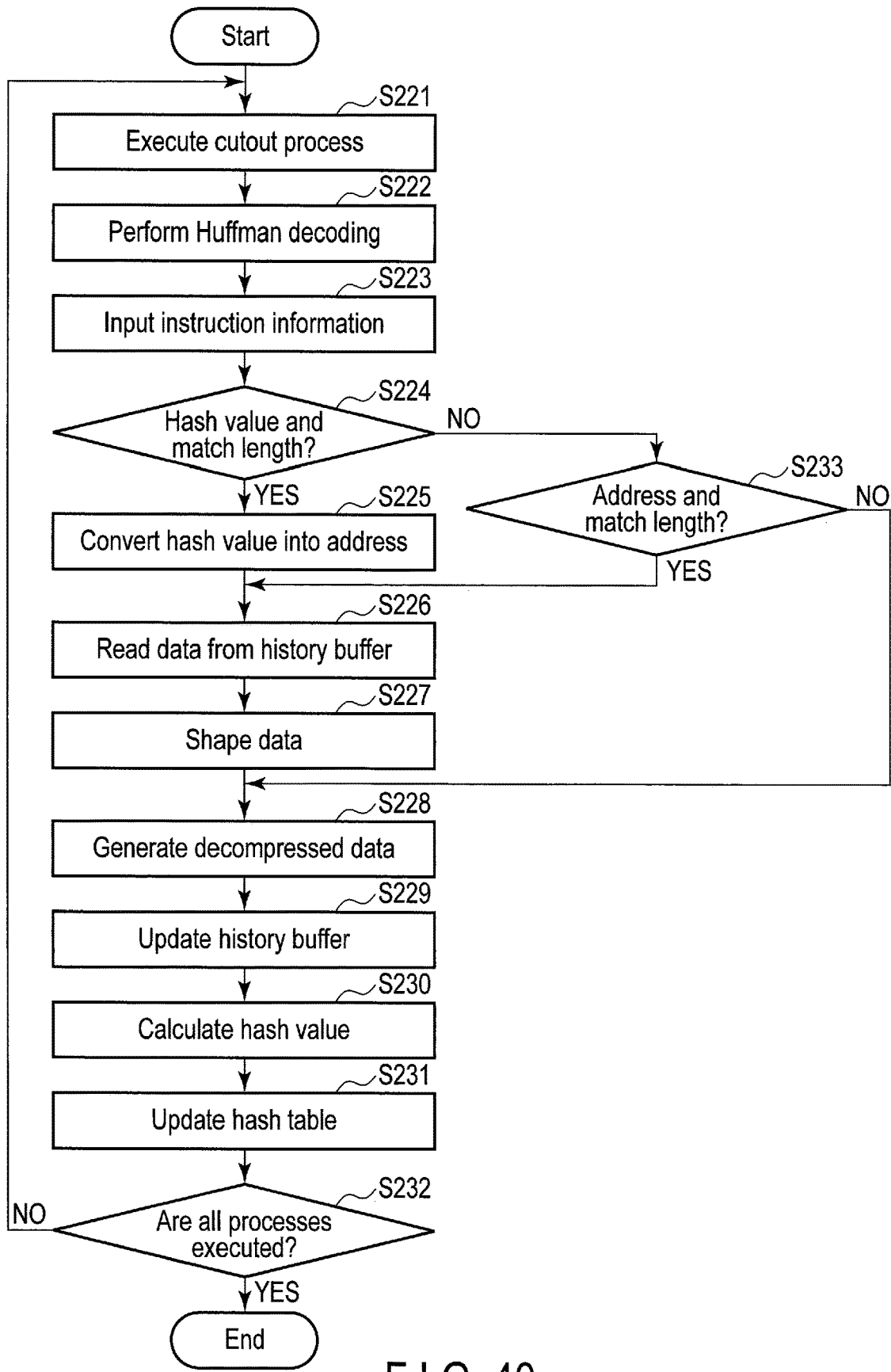
FIG. 40 is a flowchart illustrating an example of a process procedure of the decompression device according to the present embodiment.

Next, an example of the process procedure of the decompression device 20 according to the present embodiment will be described with reference to the flowchart of FIG. 40.

Figure 36:
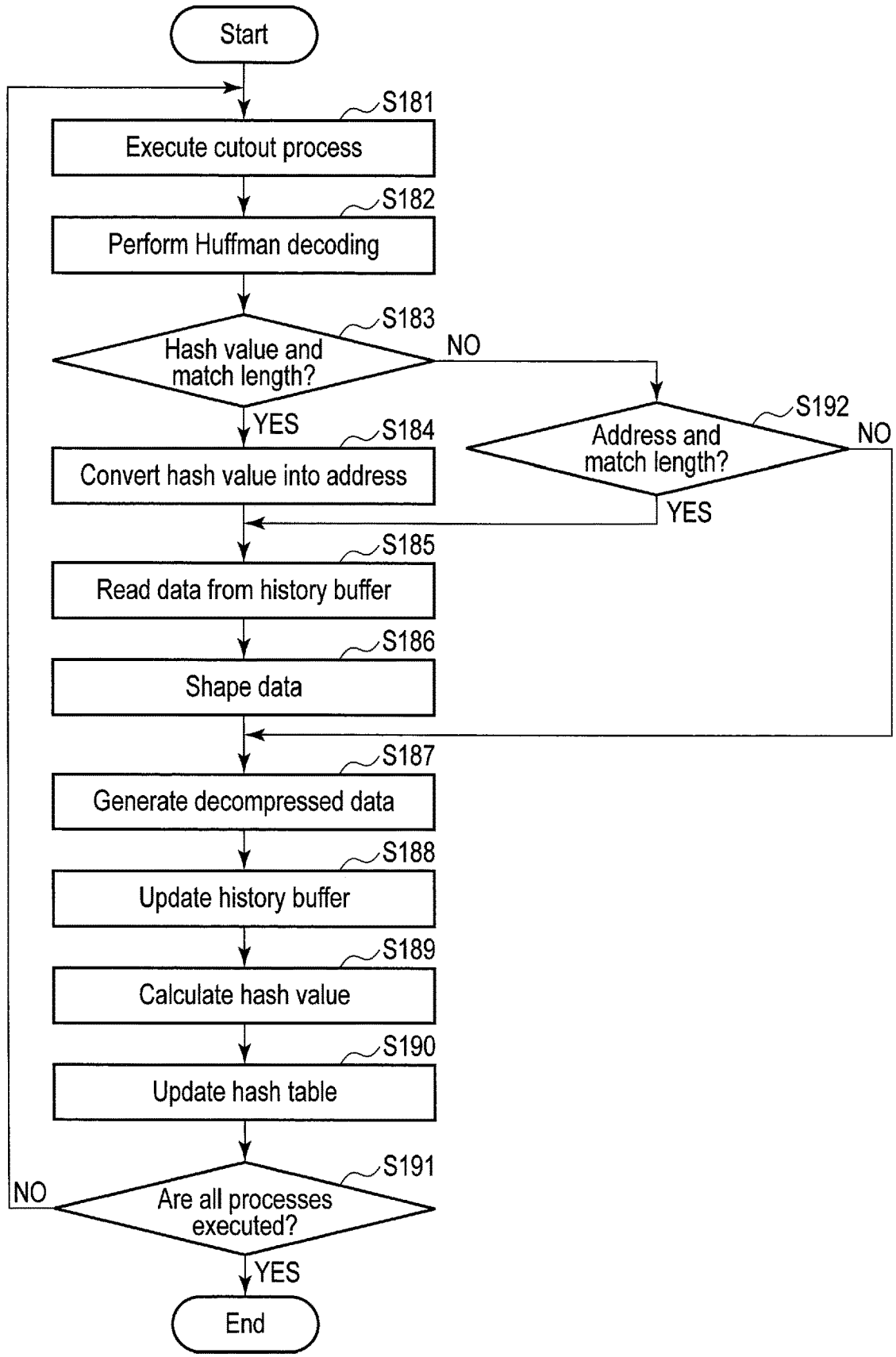
FIG. 36 is a flowchart illustrating an example of a process procedure of the decompression device according to the present embodiment.

First, processes of step S221 and S222 corresponding to the processes of steps S181 and S182 illustrated in FIG. 36 as described above are executed.

Next, the Huffman decoding unit 27 inputs the instruction information from the outside of the decompression device 20 (step S223).

It is determined based on the instruction information input in step S223 (that is, an instruction from the outside) whether or not the hash value and the match length are acquired by executing the process of step S222 (step S224). When the instruction information input in step S223 indicates that the hash value is encoded, it is determined in step S224 that the hash value and the match length are acquired. On the other hand, when the instruction information input in step S223 indicates that the address is encoded, it is determined in step S207 that the hash value and the match length are not acquired.

When it is determined that the hash value and the match length are acquired (YES in step S207), processes of steps S225 to S232 corresponding to the process of steps S184 to S191 illustrated in FIG. 36 as described above are executed.

On the other hand, when it is determined that the hash value and the match length are not acquired (NO in step S207), it is determined based on the instruction information input in step S223 whether the address and the match length are acquired by executing the process of step S222 (step S233). When the instruction information input in step S223 indicates that the address is encoded, it is determined in step S223 that the address and the match length are acquired.

When it is determined that the address and the match length are acquired (YES in step S233), the process of step S226 is executed.

On the other hand, for example, when the instruction information input in step S223 does not indicate that the hash value or the address is encoded, or when the instruction information is not input, it is determined in step S223 that the address and the match length are not acquired (that is, the raw data is acquired by executing the process of step S222).

When it is determined that the address and the match length are not acquired in this way (NO in step S233), the raw data is output to the decompression data generation unit 25, and the process of step S228 is executed.

As described above, the compression device 10 according to the present embodiment is configured to select one of the hash value of the input data and the address stored in the hash table 11b in association with the hash value based on the instruction from the outside (for example, host) of the compression device 10 and encode the selected one. Thereby, the compression device 10 can realize the intended encoding (compression) on the host side.

Further, the decompression device 20 according to the present embodiment can appropriately decompress the compressed data generated in the compression device 10 according to the present embodiment by executing the process based on the instruction from the outside (for example, host) of the decompression device 20.

In this embodiment, the decompression device 20 (Huffman decoding unit 27) has been described as inputting the instruction information, but when the compression device 10 attaches the identification code to the match information based on the instruction information, the decompression device 20 may operate as in the sixth embodiment as described above without inputting the instruction information.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A compression device used to compress input first data, comprising:
   a dictionary based encoder that searches for previously input second data at least partially matching the first data from a first buffer in which the second data is stored, and acquires a first match position indicating a position of the second data in the first buffer and a match length indicating a matched length of the first data and the second data;
   a second buffer in which a second match position previously acquired by the dictionary based encoder is stored together with an index assigned to the second match position;
   a comparator that compares the first match position with the second match position stored in the second buffer; and
   a compression data generator that generates first compressed data including the index assigned to the second match position stored in the second buffer and the match length when the first match position matches the second match position, and generates second compressed data including the first match position and the match length when the first match position does not match the second match position.

2. The compression device according to claim 1, further comprising:
   an encoder that encodes the index assigned to the second match position stored in the second buffer when the first match position matches the second match position,
   wherein the compression data generator generates the first compressed data including the encoded index and the match length.

3. The compression device according to claim 2, wherein
   the encoder encodes the first match position acquired by the dictionary based encoder when the first match position does not match the second match position, and
   the compression data generator generates the second compressed data including the encoded first match position and the match length.

4. The compression device according to claim 1, further comprising:
   an encoder that encodes the first match position acquired by the dictionary based encoder when the first match position does not match the second match position,
   wherein the compression data generator generates the second compressed data including the encoded first match position and the match length.

5. The compression device according to claim 1, wherein
   the dictionary based encoder acquires the first match position corresponding to each of N (N is an integer of 2 or more) first data and the match length that are input in the same cycle,
   the comparator includes N comparators that compare the first match position corresponding to each of the N first data with a second match position stored in the second buffer, and
   the N comparators share one second buffer.

6. The compression device according to claim 1, wherein
   the compression data generator generates third compressed data that includes an index assigned to the second match position stored in the second buffer, a difference value between the first match position and the second match position, and the match length, instead of the second compressed data when the first match position does not match the second match position.

7. A decompression device used to decompress compressed data that includes a first index assigned to a first match position indicating a position in a first buffer of second data at least partially matching first data input to a compression device having a first buffer in which second data previously input to the compression device is stored and a first match length indicating a matched length of the first data and the second data, the decompression device comprising:

a second buffer in which a second match position converted into a second index previously cut out from the compressed data in the decompression device is stored together with a third index assigned to the second match position;

a third buffer in which the second data generated based on a second match position converted into the second index previously cut out from the compressed data in the decompression device and a second match length cut out from the compressed data is stored;

a search unit that searches for a third index matching the first index from the second buffer; and a first decoder that converts the third index into the second match position to which the third index is assigned, reads the second data from the third buffer based on the second match position, and generates the first data by shaping the second data based on the first match length, when the third index matching the first index is searched.

8. The decompression device according to claim 7, further comprising:

a second decoder, wherein the first index included in the compressed data is encoded, and the second decoder decodes the encoded first index included in the compressed data.

9. The decompression device according to claim 8, wherein when the encoded first match position is included in the compressed data, the second decoder decodes the encoded first match position, and the first decoder reads the second data from the third buffer based on the decoded first match position, and generates the first data by shaping the second data based on the first match length.

10. The decompression device according to claim 7, further comprising:

a second decoder that decodes the encoded first match position when the encoded first match position is included in the compressed data, wherein the first decoder reads the second data from the third buffer based on the decoded first match position, and generates the first data by shaping the second data based on the first match length.

11. The decompression device according to claim 7, wherein the search unit includes N search units that search for a third index matching each of N (N is an integer of 2 or more) first indexes included in the compressed data from the second buffer, and the N search units share one second buffer.

12. The decompression device according to claim 7, further comprising:

an adder that acquires the first match position by adding a difference value between the first match position and the third match position to the second match position to which the second index matching the third index is assigned when compressed data including a fourth index assigned to a third match position different from the first match position indicating the position in the first buffer of the second data at least partially matching the first data, the difference value and the first match length is decompressed, wherein the first decoder reads the second data from the third buffer based on the first match position, and generates the first data by shaping the second data based on the first match length.

13. A compression device used to compress input first data, comprising:

a buffer in which previously input second data is stored;

a table in which a second hash value calculated from at least a part of the second data and a match position indicating a position of the second data in the buffer are stored in association with each other;

a calculator that calculates a first hash value from at least a part of the first data;

a dictionary based encoder that searches for second data at least partially matching the first data from the buffer based on the match position stored in the table in association with the second hash value matching the first hash value, and acquires a match length indicating a matched length of the first data and the second data;

an entropy encoder that performs entropy encoding on the first hash value and the match length; and a compression data generator that generates compressed data including the entropy-encoded hash value and match length.

14. The compression device according to claim 13, wherein the entropy encoder selects one of the first hash value and the match position indicating the position of the second data at least partially matching the first data stored in the table and entropy-encodes the selected one, and the compressed data is attached with an identification code indicating that the first hash value is encoded or the match position is encoded.

15. The compression device according to claim 14, wherein the entropy encoder selects one of the first hash value and the match position based on a past average code length of the first hash value and a past average code length of the match position.

16. The compression device according to claim 14, wherein the entropy encoder selects one of the first hash value and the match position based on an instruction from an outside of the compression device.

17. A decompression device used to decompress compressed data that includes a first hash value calculated from first data input in a compression device and a first match length indicating a matched length of second data at least partially matching the first data searched from a first buffer in which the second data previously input in the compression device is stored and the first data, the first hash value and the first match length being entropy-encoded, the decompression device comprising:

a second buffer that the second data generated based on a second hash value and a second match length previously cut out from the compressed data in the decompression device is stored;

a table in which the second hash value calculated from at least a part of the second data and the match position indicating a position of the second data in the second buffer are stored in association with each other;

an entropy decoder that decodes the first hash value and first match length included in the compressed data; and a dictionary based decoder that reads the second data from the second buffer based on the match position stored in the table in association with the second hash value matching the decoded first hash value and generates the first data by shaping the second data based on the decoded match length.

18. The decompression device according to claim 17, wherein
when compressed data that includes a third match position indicating the position of the second data in the first buffer at least partially matching third data input in the compression device and a third match length indicating a matched length of the third data and the second data is decompressed, the third match position and the third match length being entropy-encoded, the entropy decoder decodes the third match position and the third match length,
the dictionary based decoder reads the second data from the second buffer based on the decoded third match position, and generates the third data by shaping the second data based on the third match length, and
the entropy-encoded first hash value and first match length included in the compressed data and the entropy-encoded third match position and third match length included in the compressed data are distinguished based on an identification code attached to the compressed data.

19. The decompression device according to claim 17, wherein
when compressed data that includes a third match position indicating the position of the second data in the first buffer at least partially matching third data input in the compression device and a third match length indicating a matched length of the third data and the second data is decompressed, the third match position and the third match length being entropy-encoded, the entropy decoder decodes the third match position and the third match length,
the dictionary based decoder reads the second data from the second buffer based on the decoded third match position, and generates the third data by shaping the second data based on the third match length, and
the entropy-encoded first hash value and first match length included in the compressed data and the entropy-encoded third match position and third match length included in the compressed data are distinguished based on an instruction from an outside of the decompression device.

20. A method for compressing input first data, comprising:
searching for previously input second data at least partially matching the first data from a first buffer in which the second data is stored, and acquiring a first match position indicating a position of the second data in the first buffer and a match length indicating a matched length of the first data and the second data;
comparing the first match position with a second match position stored in a second buffer by referring to the second buffer in which the previously acquired second match position is stored together with an index assigned to the second match position; and
generating first compressed data including the index assigned to the second match position stored in the second buffer and the match length when the first match position matches the second match position, and generating second compressed data including the first match position and the match length when the first match position does not match the second match position.

21. The method according to claim 20, further comprising:
encoding the index assigned to the second match position stored in the second buffer when the first match position matches the second match position,
wherein the generating includes generating the first compressed data including the encoded index and the match length.

22. The method according to claim 21, wherein
the encoding includes encoding the acquired first match position when the first match position does not match the second match position, and
the generating includes generating the second compressed data including the encoded first position and the match length.

23. The method according to claim 20, further comprising:
encoding the acquired first match position when the first match position does not match the second match position,
wherein the generating includes generating the second compressed data including the encoded first match position and the match length.

24. The method according to claim 20, wherein
the generating includes generating third compressed data that includes an index assigned to the second match position stored in the second buffer, a difference value between the first match position and the second match position, and the match length, instead of the second compressed data when the first match position does not match the second match position.

25. A method for decompressing compressed data that includes a first index assigned to a first match position indicating a position in a first buffer of second data at least partially matching first data input to a compression device having a first buffer in which the second data previously input to the compression device is stored and a first match length indicating a matched length of the first data and the second data, the method comprising:
comparing the first index with a third index stored in the second buffer by referring to a second buffer in which a second match position converted into a second index previously cut out from the compressed data is stored together with the third index assigned to the second match position; and
converting the third index into the second match position to which the third index is assigned, reading the second data based on the second match position from a third buffer in which the second data generated based on the second match position converted from the second index previously cut out from the compressed data and a second match length cut out from the compressed data is stored, and generating the first data by shaping the second data based on the first match length, when the first index matches the third index.

26. The method according to claim 25, further comprising:
decoding an encoded first index included in the compressed data.

27. The method according to claim 26, further comprising:
decoding the encoded first match position when the encoded first match position is included in the compressed data,
wherein the generating includes reading the second data from the third buffer based on the decoded first match position, and generating the first data by shaping the second data based on the first match length.

28. The method according to claim 25, further comprising:
  decoding the encoded first match position when the encoded first match position is included in the compressed data,
  wherein the generating includes reading the second data from the third buffer based on the decoded first match position, and generating the first data by shaping the second data based on the first match length.

29. The method according to claim 25, further comprising:
  acquiring the first match position by adding a difference value between the first match position and the third match position to the second match position to which the second index matching the third index is assigned when compressed data including a fourth index assigned to a third match position different from the first match position indicating the position in the first buffer of the second data at least partially matching the first data, the difference value and the first match length is decompressed,
  wherein the generating includes reading the second data from the third buffer based on the first match position, and generating the first data by shaping the second data based on the first match length.

30. A method for compressing input first data, comprising:
  calculating a first hash value from at least a part of the first data;
  acquiring a match position stored in a table in association with a second hash value matching the first hash value by referring to the table in which the second hash value calculated from at least a part of previously input second data and a match position indicating a position of the second data in a buffer in which the second data is stored are stored in association with each other;
  searching for the second data at least partially matching the first data from the buffer based on the acquired match position;
  acquiring a match length indicating a matched length of the first data and the searched second data;
  entropy encoding the first hash value and the match length; and
  generating compressed data including the entropy-encoded hash value and match length.

31. The method according to claim 30, wherein
  the encoding includes selecting one of the first hash value and the match position indicating the position of the second data at least partially matching the first data stored in the table and entropy-encoding, and
  the compressed data is attached with an identification code indicating that the first hash value is encoded or the match position is encoded.

32. The method according to claim 31, wherein
  the encoding includes selecting one of the first hash value and the match position based on a past average code length of the first hash value and a past average code length of the match position.

33. The method according to claim 31, wherein
  the encoding includes selecting one of the first hash value and the match position based on an instruction from an outside.

34. A method for decompressing compressed data that includes a first hash value calculated from first data input in a compression device and a first match length indicating a matched length of second data at least partially matching the first data searched from a first buffer in which the second data previously input in the compression device is stored and the first data, the first hash value and the first match length being entropy-encoded, the method comprising:
  decoding the first hash value and first match length included in the compressed data;
  acquiring a match position stored in a table in association with a second hash value matching the decoded first hash value by referring to the table in which the second hash value previously cut out from the compressed data and a match position indicating the position of the second data in a second buffer in which the second hash value calculated from at least a part of the second data based on the second match length and the second data are stored are stored in association with each other; and
  reading the second data from the second buffer based on the acquired match position and generating the first data by shaping the second data based on the decoded match length.

35. The method according to claim 34, further comprising:
  decoding a third match position and a third match length when the compressed data that includes the third match position indicating the position of the second data in the first buffer at least partially matching third data input in the compression device and the third match length indicating a matched length of the third data and the second data is decompressed, the third match position and the third match length being entropy-encoded,
  wherein the generating includes reading the second data from the second buffer based on the decoded third match position, and generating the third data by shaping the second data based on the third match length, and
  the entropy-encoded first hash value and first match length included in the compressed data and the entropy-encoded third match position and third match length included in the compressed data are distinguished based on an identification code attached to the compressed data.

36. The method according to claim 34, further comprising:
  decoding a third match position and a third match length when the compressed data that includes the third match position indicating the position of the second data in the first buffer at least partially matching third data input in the compression device and the third match length indicating a matched length of the third data and the second data is decompressed, the third match position and the third match length being entropy-encoded,
  wherein the generating includes reading the second data from the second buffer based on the decoded third match position, and generating the third data by shaping the second data based on the third match length, and
  the entropy-encoded first hash value and first match length included in the compressed data and the entropy-encoded third match position and third match length included in the compressed data are distinguished based on an instruction from an outside.

* * * * *